United States Patent
Sugimura et al.

(10) Patent No.: US 7,339,124 B2
(45) Date of Patent: *Mar. 4, 2008

(54) INPUT KEY AND INPUT APPARATUS

(75) Inventors: Toshiaki Sugimura, Yokohama (JP);
Masaaki Fukumoto, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 230 days.

This patent is subject to a terminal disclaimer.

(21) Appl. No.: 10/934,370

(22) Filed: Sep. 7, 2004

(65) Prior Publication Data

US 2005/0061638 A1    Mar. 24, 2005

(30) Foreign Application Priority Data

Sep. 22, 2003   (JP) .............................. 2003-330514
Jun. 17, 2004   (JP) .............................. 2004-179534

(51) Int. Cl.
*H01H 9/00*   (2006.01)

(52) U.S. Cl. .......................... 200/5 A; 200/4; 341/122; 345/156

(58) Field of Classification Search ................ 200/5 A, 200/5 R, 6 A, 4, 18, 341, 329; 345/156–160; 338/47; 341/122
See application file for complete search history.

(56) References Cited

U.S. PATENT DOCUMENTS

| | | | |
|---|---|---|---|
| 4,514,600 A * | 4/1985 | Lentz ........................ 200/5 R |
| 5,468,924 A * | 11/1995 | Naitou et al. ............... 200/6 A |
| 5,528,235 A * | 6/1996 | Lin et al. .................... 341/22 |
| 5,691,517 A * | 11/1997 | Yamamoto et al. ......... 200/6 A |
| 5,744,765 A * | 4/1998 | Yamamoto ................. 200/6 A |
| 5,952,628 A * | 9/1999 | Sato et al. .................... 200/4 |
| 5,952,631 A * | 9/1999 | Miyaki ...................... 200/6 A |
| 6,067,005 A * | 5/2000 | DeVolpi ..................... 338/47 |
| 6,201,468 B1 * | 3/2001 | DeVolpi ..................... 338/47 |
| 6,266,046 B1 * | 7/2001 | Arita ........................ 345/156 |
| 6,399,904 B1 * | 6/2002 | Mimata ..................... 200/6 A |
| 6,613,990 B2 * | 9/2003 | Kawasaki .................. 200/6 A |
| 6,670,562 B2 | 12/2003 | Kaneko |
| 2004/0119687 A1 * | 6/2004 | Suzuki et al. .............. 345/156 |

FOREIGN PATENT DOCUMENTS

| CN | 1397969 A | 2/2003 |
|---|---|---|
| JP | 09222948 | * 8/1997 |
| JP | 9-319498 | 12/1997 |
| JP | 11-15592 | 1/1999 |

(Continued)

OTHER PUBLICATIONS

U.S. Appl. No. 10/934,370, filed Sep. 7, 2004, Sugimura et al.
U.S. Appl. No. 11/000,227, filed Dec. 1, 2004, Sugimura et al.

(Continued)

*Primary Examiner*—K. Richard Lee
(74) *Attorney, Agent, or Firm*—Oblon, Spivak, McClelland, Maier & Neustadt, P.C.

(57) ABSTRACT

An input key to which a plurality of information elements to be inputted are assigned, comprises: a key top to be pushed; and detecting means for detecting a push on the key top and for, when detecting the push on the key top, detecting a relative displacement of the key top from a predetermined reference position.

14 Claims, 62 Drawing Sheets

FOREIGN PATENT DOCUMENTS

| | | | |
|---|---|---|---|
| JP | 11-237945 | | 8/1999 |
| JP | 11237945 | * | 8/1999 |
| JP | 2000-105671 | | 4/2000 |

OTHER PUBLICATIONS

U.S. Appl. No. 10/883,713, filed Jul. 6, 2004, Sugimura et al.
U.S. Appl. No. 10/983,748, filed Nov. 9, 2004, Sugimura et al.

* cited by examiner

Fig.13

DIRECTION DETERMINATION TABLE  T1

| | | | | | | |
|---|---|---|---|---|---|---|
| y6 | NULL | UP ⑤ | | | | NULL |
| y5 | | NULL | | | NULL | |
| y4 | | LEFT ④ | | CENTER ① | RIGHT ② | |
| y3 | | | | | | |
| y2 | | NULL | | | NULL | |
| y1 | NULL | DOWN ③ | | | | NULL |
| | x1 | x2 | x3 | x4 | x5 | x6 |

Fig.14

TALLY TABLE — T2

| NAME OF INPUT KEY | 10a |
|---|---|
| MOVING DIRECTION | NUMBER OF DETECTION |
| CENTER | 0 |
| UP | 0 |
| RIGHT | 0 |
| DOWN | 0 |
| LEFT | 0 |

Fig.15

"あ LINE GROUP" SYMBOL CONVERSION TABLE — T3

| INPUT KEY | MOVING DIRECTION | SYMBOL |
|---|---|---|
| 10a | CENTER | お |
| | UP | あ |
| | RIGHT | い |
| | DOWN | う |
| | LEFT | え |

Fig.17

TALLY TABLE T2

| NAME OF INPUT KEY | 10a |
|---|---|
| MOVING DIRECTION | NUMBER OF DETECTION |
| CENTER | 70 |
| UP | 0 |
| RIGHT | 80 |
| DOWN | 0 |
| LEFT | 0 |

Fig.18

DIRECTION DETERMINATION TABLE

| | x1 | x2 | x3 | x4 | x5 | x6 |
|---|---|---|---|---|---|---|
| y1 | DOWN:2 LEFT:2 | DOWN:2 LEFT:1 | DOWN:2 | DOWN:2 | DOWN:2 RIGHT:1 | DOWN:2 RIGHT:2 |
| y2 | DOWN:1 LEFT:2 | DOWN:1 LEFT:1 | DOWN:1 | DOWN:1 | DOWN:1 RIGHT:1 | DOWN:1 RIGHT:2 |
| y3 | LEFT:2 | LEFT:1 | CENTER:2 | CENTER:2 | RIGHT:1 | RIGHT:2 |
| y4 | LEFT:2 | LEFT:1 | CENTER:2 | CENTER:2 | RIGHT:1 | RIGHT:2 |
| y5 | UP:1 LEFT:2 | UP:1 LEFT:1 | UP:1 | UP:1 | UP:1 RIGHT:1 | UP:1 RIGHT:2 |
| y6 | UP:2 LEFT:2 | UP:2 LEFT:1 | UP:2 | UP:2 | UP:2 RIGHT:1 | UP:2 RIGHT:2 |

T4

"MOVING DIRECTION":"DIRECTION INTENSITY"

Fig.19

TALLY TABLE T5

| NAME OF INPUT KEY | 10a |
|---|---|
| MOVING DIRECTION | DIRECTION INTENSITY |
| CENTER | 0 |
| UP | 0 |
| RIGHT | 0 |
| DOWN | 0 |
| LEFT | 0 |

Fig.20

TALLY TABLE T5

| NAME OF INPUT KEY | 10a |
|---|---|
| MOVING DIRECTION | DIRECTION INTENSITY |
| CENTER | 60 |
| UP | 0 |
| RIGHT | 90 |
| DOWN | 0 |
| LEFT | 0 |

Fig.21

SYMBOL CONVERSION TABLE
FOR INPUT KEY 10j     T6

| MOVING DIRECTION | SYMBOL |
|---|---|
| CENTER | わ |
| UP | TRANSITION TO SETTING MODE |
| RIGHT | わ |
| DOWN | わ |
| LEFT | わ |

Fig.27

TALLY TABLE    T7

| INPUT KEY | DIRECTION | SYMBOL | INPUT COUNT |
|---|---|---|---|
| 10a | CENTER | お | 100 |
| | UP | あ | 70 |
| | RIGHT | い | 130 |
| | DOWN | う | 150 |
| | LEFT | え | 130 |
| ⋮ | | | |
| 10l | CENTER | ん | 250 |
| | UP | ん | 70 |
| | RIGHT | ん | 30 |
| | DOWN | ん | 80 |
| | LEFT | ん | 40 |

Fig.28

SYMBOL CONVERSION TABLE FOR INPUT KEY 10a
(CORRECTION BY FIRST CONDITION)

T3

| MOVING DIRECTION | SYMBOL |
|---|---|
| CENTER | お |
| UP | う |
| RIGHT | い |
| DOWN | あ |
| LEFT | え |

EXCHANGE (between UP う and DOWN あ)

*Fig.29*

TALLY TABLE
(AFTER CORRECTION BY FIRST CONDITION) T7

| KEY | DIRECTION | SYMBOL | PUSH COUNT |
|---|---|---|---|
| 10a | CENTER | お | 100 |
| | UP | う | 150 ← |
| | RIGHT | い | 130 |
| | DOWN | あ | 70 ← |
| | LEFT | え | 130 |
| 10l | CENTER | ん | 250 |
| | UP | ん | 70 |
| | RIGHT | ん | 30 |
| | DOWN | ん | 80 |
| | LEFT | ん | 40 |

EXCHANGE (between UP 150 and DOWN 70)

Fig.30

CONVERSION TABLE FOR INPUT KEY 10a
(CORRECTION BY SECOND CONDITION) T3

| MOVING DIRECTION | SYMBOL |
|---|---|
| CENTER | お |
| UP | う |
| RIGHT | い |
| DOWN | ん |
| LEFT | え |

EXCHANGE

CONVERSION TABLE FOR INPUT KEY 10l
(CORRECTION BY SECOND CONDITION)

| MOVING DIRECTION | SYMBOL |
|---|---|
| CENTER | あ |
| UP | ん |
| RIGHT | ん |
| DOWN | ん |
| LEFT | ん |

*Fig.31*

TALLY TABLE
(AFTER CORRECTION BY SECOND CONDITION) T7

| INPUT KEY | DIRECTION | SYMBOL | PUSH COUNT |
|---|---|---|---|
| 10a | CENTER | お | 100 |
|  | UP | う | 150 |
|  | RIGHT | い | 130 |
|  | DOWN | ん | 250 ← |
|  | LEFT | え | 130 |
| ~ | ~ | ~ | ~ |
| 10l | CENTER | あ | 70 ← |
|  | UP | ん | 70 |
|  | RIGHT | ん | 30 |
|  | DOWN | ん | 80 |
|  | LEFT | ん | 40 |

EXCHANGE

Fig.32

CONVERSION TABLE FOR INPUT KEY 10k  T8

| MOVING DIRECTION | SYMBOL |
|---|---|
| CENTER | を |
| UP | # |
| RIGHT | & |
| DOWN | @ |
| LEFT | |

*Fig.34*

MARK TALLY TABLE  T9

| MARK | INPUT KEY | INPUT METHOD | INPUT COUNT |
|---|---|---|---|
| # | 10k | UP | 120 |
| & | 10k | RIGHT | 12 |
| @ | 10k | DOWN | 130 |
| £ | 10k | 5 | 130 |
| Å | 10k | 6 | 8 |
|  |  |  |  |

Fig.35

MARK TALLY TABLE
(AFTER EXCHANGE OF INPUT METHODS)  T9

| MARK | INPUT KEY | INPUT METHOD | INPUT COUNT |
|---|---|---|---|
| # | 10k | UP | 120 |
| & | 10k | 5 | 12 |
| @ | 10k | DOWN | 130 |
| £ | 10k | RIGHT | 130 |
| Å | 10k | 6 | 8 |
|   |   |   |   |

*Fig.36*

CONVERSION TABLE FOR INPUT KEY 10k

| MOVING DIRECTION | SYMBOL |
|---|---|
| CENTER | を |
| UP | # |
| RIGHT | £ ← NEW ASSIGNMENT |
| DOWN | @ |
| LEFT | |

| NUMBER | MOVING DIRECTION |
|---|---|
| 1 | CENTER |
| 2 | CENTER |
| 3 | CENTER |
| 98 | RIGHT |
| 99 | RIGHT |
| 100 | RIGHT |

B

| POINTER |
|---|
| 1 |

(2)

| NUMBER | MOVING DIRECTION |
|---|---|
| 1 | RIGHT |
| 2 | CENTER |
| 3 | CENTER |
| 98 | RIGHT |
| 99 | RIGHT |
| 100 | RIGHT |

B

| POINTER |
|---|
| 2 |

Fig.51

| KEY No. | K1 | K2 | K3 | K4 | K5 | K6 | K7 | K8 | K9 | K10 | K11 | K12 |
|---|---|---|---|---|---|---|---|---|---|---|---|---|
| CENTER | あ | か | さ | た | な | は | ま | や | ら | を | ん | DOWNSHIFT |
| UP | い | き | し | ち | に | ひ | み | ゐ | り | わ | 、(JAPANESE COMMA) | CONVERSION TO VOICED CONSONANT |
| DOWN | う | く | す | つ | ぬ | ふ | む | ゆ | る | ー(LONG SOUND) | 。(JAPANESE PERIOD) | CONVERSION TO P-SOUND |
| LEFT | え | け | せ | て | ね | へ | め | ゑ | れ | ? | ,(COMMA) | CONVERSION TO SMALL KATAKANA |
| RIGHT | お | こ | そ | と | の | ほ | も | よ | ろ | ! | ・(CENTERED DOT) | CONVERSION TO LARGE KATAKANA |

Fig.52

| KEY No. | K1 | K2 | K3 | K4 | K5 | K6 | K7 | K8 | K9 | K10 | K11 | K12 |
|---|---|---|---|---|---|---|---|---|---|---|---|---|
| CENTER | A | F | K | P | U | Z | , | . | ? | : | ; | ǀ |
| UP | B | G | L | Q | V | CR | ' | + | @ | [ | < | = |
| DOWN | C | H | M | R | W | TAB | " | * | $ | ] | > | ~ |
| LEFT | D | I | N | S | X | [ | . | \ | * | ( | Back Space | - |
| RIGHT | E | J | O | T | Y | ] | # | % | & | ) | ESC | _ |

| KEY No. | K1 | K2 | K3 | K4 | K5 |
|---|---|---|---|---|---|
| CENTER | b | h | n | i | z |
| UP | c | j | p | t | zh |
| DOWN | ch | k | q | w | |
| LEFT | f | l | r | x | |
| RIGHT | g | m | s | y | |

(b)

| KEY No. | K1 | K2 | K3 | K4 | K5 | K6 | K7 |
|---|---|---|---|---|---|---|---|
| CENTER | a | e | i | in | ong | ia | uo |
| UP | ai | ei | iang | uai | iu | uan | o |
| DOWN | an | en | uang | ing | ou | ui | u |
| LEFT | ang | eng | iao | ng | u | ue | ue |
| RIGHT | ao | er | ie | iong | ua | un | |

Fig. 55

| KEY No. | K1 | K2 | K3 | K4 | K5 | K6 | K7 | K8 |
|---------|----|----|----|----|----|----|----|----|
| CENTER  | ㄱ | ㅜ | ㄴ | ㅁ | ㅓ | ㅐ | ㅑ | ㅒ |
| UP      | ㄸ | ㄹ | ㅁ | ㅂ | ㅗ | ㅕ | ㅠ | ㅡ |
| DOWN    | ㅃ | ㅅ | ㅆ | ㅇ | ㅛ | ㅠ | ㅒ | ㅛ |
| LEFT    | ㅈ | ㅉ | ㅊ | ㅠ | ㅜ | ㅏ | ㅜ | ㅖ |
| RIGHT   | ㅌ | ㅍ | ㅎ | ㅏ | ㅣ | ㅠ | ㅡ | ㅓ |

163

INPUT KEY AND INPUT APPARATUS

BACKGROUND OF THE INVENTION

1. Field of the Invention

The present invention relates to an input key and an input apparatus for inputting input information and, more particularly, to an input key to which a plurality of input information elements are assigned, and an input apparatus provided with the input key.

2. Related Background Art

In compact, portable electronic devices (portable terminals) such as cell phones and PDAs (Personal Digital Assistants), a plurality of text information elements are generally assigned to an identical input key so as to permit a user to input the text information elements such as symbols, marks, and numbers, by a small number of input keys. Let us explain an assignment example in which the hiragana writing symbols being one of the Japanese symbol forms are assigned to input keys.

The Japanese hiragana writing symbols can be sorted into a plurality of subgroups, each subgroup consisting of five symbols. These subgroups include the "あ line" group consisting of five symbols (あ, い, う, え, お) respectively corresponding to five basic vowels, the "か line" group consisting of five symbols (か, き, く, け, こ) respectively corresponding to the five vowels coupled with a specific consonant "K", the "さ line" group consisting of five symbols (さ, し, す, せ, そ) respectively corresponding to the five vowels coupled with a specific consonant "S", the "た line" group consisting of five symbols (た, ち, つ, て, と) respectively corresponding to the five vowels coupled with a specific consonant "T", and so on.

For example, the five symbols of "あ" to "お" in the "あ line group" are assigned to a predetermined input key and likewise a plurality of symbols such as the "か line group", "さ line group", "た line group", "な line group", ... are assigned to other input keys for the respective line groups. Then an input symbol is selected in the order of "あ", "い", "う", "え", and "お" in accordance with the number of push operations of the input key for the "あ line group" and likewise an input symbol is selected in the order of "か", "き", "く", "け", and "こ" in accordance with the number of push operations of the input key for the "か line group".

Incidentally, in the method of selecting an input symbol in accordance with the number of push operations of the input key in this manner, the user has to consecutively push the input key five times, for example, for inputting such symbols as "お", "こ", "そ", "と", "の", ... in the "お column" group, so that the input operation thereof requires labor and time and is extremely complex.

There are thus conventional technologies proposed to simplify the operation of the input key to which a plurality of text information elements are assigned. For example, a proposed technology is to support a key top of an input key in a rockable state to the four corners and to allow the user to selectively input four symbols, numbers, marks, or the like by signals of switches to be turned on according to rocking of the key top to the four corners (e.g., cf. Japanese Patent Application Laid-Open No. Heisei 11-237945). By this technology, one symbol is selected, for example, by simply pushing one of the four corners of the key top of the input key assigned four symbols, which simplifies the operation of the input key, as compared with the conventional technologies.

SUMMARY OF THE INVENTION

However, the technology described in the Japanese Patent Application Laid-Open No. Heisei 11-237945 is one applied to the input keys of the keyboard for personal computers, and it is structurally impossible to directly apply the technology to the input keys of the portable electronic devices much smaller than such input keys. It is also substantially difficult to assign five or more symbols to one input key; for example, it is infeasible to assign one input key five symbols of "あ" to "お" in the "あ line group".

An object of the present invention is therefore to provide an input key and an input apparatus permitting the user to selectively input five or more information elements by a simple input operation.

In order to achieve the above object, an input key according to the present invention is an input key to which a plurality of information elements to be inputted are assigned, the input key comprising: a key top to be pushed; and detecting means for detecting a push on the key top and for, when detecting the push on the key top, detecting a relative displacement of the key top from a predetermined reference position. The "information elements to be inputted" include the information generally assigned to the input keys of the so-called full keyboard, such as the information of symbols, numbers, marks, etc., the information of the line feed code and control codes, and so on.

In this input key, the detecting means is able to detect a push on the key top and, when detecting the push, the detecting means detects a relative displacement of the key top from the predetermined reference position, thereby obtaining the inputted information corresponding to the displacement. Namely, by only the simple operation of pushing the key top, it is feasible to implement the detection of the push on the key top and the detection of the relative displacement of the key top from the predetermined reference position, and the user is thus allowed to selectively input even five or more information elements by the simple input operation.

Preferably, the detecting means comprises a first contact to be pushed with the key top, and a second contact having a plurality of conducting pieces with which the first contact pushed comes into electric contact, the key top is arranged so as to be compositely movable in a push direction thereof and in radial directions intersecting with the push direction, and, in accordance with a plurality of moving directions with a push operation on the key top, the first contact is arranged to contact two or more conducting pieces placed at different positions of the second contact.

In the input key according to the present invention, when the key top is moved in the push direction or is compositely moved in the push direction and in a radial direction, the first contact comes to contact two or more conducting pieces placed at different positions of the second contact in accordance with the moving directions, so that one of text information elements can be selectively inputted based on conduction signals from two or more conducting pieces in contact. The moving directions of the key top can be set to five or more directions, and it is thus feasible to selectively input even five or more text information elements.

Preferably, the detecting means comprises a first contact to be pushed with the key top, and a second contact having a plurality of sensor coils to generate their respective induced voltages with proximity of the first contact pushed, the key top is arranged so as to be compositely movable in a push direction thereof and in radial directions intersecting with the push direction, and, in accordance with a plurality of moving directions with a push operation on the key top, the first contact comes close to the sensor coils placed at different positions of the second contact, whereby the sensor coils generate their respective induced voltages of different magnitudes.

In the input key according to the present invention, when the key top is moved in the push direction or is compositely moved in the push direction and in a radial direction, the first contact comes close to the sensor coils placed at different positions of the second contact in accordance with the moving directions and the sensor coils generate their respective induced voltages of different magnitudes. Therefore, it becomes feasible for the user to selectively input a plurality of text information elements, based on the magnitudes of the induced voltages generated by the sensor coils. The moving directions of the key top can be set to five or more directions and it is thus feasible to selectively input even five or more text information elements.

In the input key according to the present invention, more preferably, the key top is comprised of a flexible material elastically deformable in the moving directions thereof and the first contact is supported on the key top.

More preferably, the input key according to the present invention comprises a support member supporting the first contact, and an elastic body supporting the support member, and a portion of the support member forms the key top.

In order to achieve the above object, an input apparatus according to the present invention is an input apparatus for inputting input information by a push operation of an input key, in which a plurality of input information elements are assigned to the same input key, wherein the input key comprises: a key top to be pushed; and detecting means for detecting a push on the key top and for, when detecting the push on the key top, detecting a relative displacement of the key top from a predetermined reference position.

In this input apparatus, the detecting means of the input key is able to detect a push on the key top and, when detecting the push, the detecting means detects a relative displacement of the key top from the predetermined reference position, thereby obtaining the inputted information corresponding to the displacement. Namely, by only the simple operation of pushing the key top, it is feasible to implement the detection of the push on the key top and the detection of the relative displacement of the key top from the predetermined reference position, and the user is thus allowed to selectively input even five or more information elements by the simple input operation.

Preferably, the detecting means comprises a first contact to be pushed with the key top of the input key, and a second contact having a plurality of conducting pieces with which the first contact pushed comes into electric contact, the input apparatus further comprises information selecting means for selecting one of the input information elements assigned to the input key, based on conduction signals from two or more conducting pieces of the second contact in contact with the first contact, the key top is arranged so as to be compositely movable in a push direction thereof and in radial directions intersecting with the push direction, and, in accordance with a plurality of moving directions with a push operation on the key top, the first contact comes to contact two or more conducting pieces placed at different positions of the second contact, whereby one information element selected by the information selecting means is inputted.

In the input apparatus according to the present invention, when the key top of the input key is moved in the push direction or is compositely moved in the push direction and in a radial direction, the first contact comes to contact two or more conducting pieces placed at different positions of the second contact in accordance with the moving directions. Then the information selecting means selects one of the text information elements assigned to the input key, on the basis of conduction signals from two or more conducting pieces in contact, whereby one text information element selected is inputted. Since the moving directions of the key top can be set to five or more directions, it becomes feasible to selectively input even five or more text information elements.

Preferably, the detecting means comprises a first contact to be pushed with the key top of the input key, and a second contact having a plurality of sensor coils to generate their respective induced voltages with proximity of the first contact pushed, the input apparatus further comprising information selecting means for selecting one of the input information elements assigned to the input key, based on magnitudes of the induced voltages generated by the sensor coils of the second contact with the proximity of the first contact, the key top is arranged so as to be compositely movable in a push direction thereof and in radial directions intersecting with the push direction, and, in accordance with a plurality of moving directions with a push operation on the key top, the first contact comes close to the sensor coils placed at different positions of the second contact, whereby one information element selected by the information selecting means is inputted.

In the input apparatus according to the present invention, when the key top of the input key is moved in the push direction or is compositely moved in the push direction and in a radial direction, the first contact comes close to the sensor coils placed at different positions of the second contact in accordance with the moving directions, whereupon the sensor coils generate their respective induced voltages of different magnitudes. Then the information selecting means selects one of the text information elements assigned to the input key, on the basis of the magnitudes of the induced voltages generated by the sensor coils, whereby one text information element selected is inputted. Since the moving directions of the key top can be set to five or more directions, it becomes feasible to selectively input even five or more text information elements.

More preferably, the input apparatus according to the present invention is configured to further comprise a conversion table to be referred to by the information selecting means, the conversion table storing the plurality of input information elements assigned to the input key, corresponding to the moving directions of the key top; and conversion table rewriting means that can arbitrarily rewrite the contents of the conversion table.

More preferably, the input apparatus according to the present invention is configured to further comprise a conversion table to be referred to by the information selecting means, the conversion table storing the plurality of input information elements assigned to the input key, corresponding to the moving directions of the key top; input count tallying means for tallying input counts of respective information elements inputted by the input key; and conversion table rewriting means for rewriting the contents of the conversion table in accordance with a tally result by the input count tallying means; and the conversion table rewriting means is configured to rewrite the conversion table so that an information element with an input count greater than that of an information element assigned to a specific moving direction of a specific input key easy to be operated, is assigned to the specific moving direction of the specific input key.

Furthermore, the input apparatus according to the present invention is more preferably configured to further comprise a conversion table to be referred to by the information selecting means, the conversion table storing the plurality of input information elements assigned to the input key, corresponding to the moving directions of the key top; input count tallying means for tallying input counts of respective information elements inputted by the input key; and conversion table registering means for registering the information elements in the conversion table in accordance with a tally result by the input count tallying means, and the conversion table registering means is configured to re-register the information elements so that an unregistered information element with an input count greater than that of a registered information element registered in the conversion table is registered in place of the registered information.

Incidentally, the input apparatus according to the present invention is preferably configured to further comprise controlling means for, during a push operation on the input key, outputting assignment information of the plurality of input information elements to the input key at a time of the operation, to an external display device and for making the display device highlight an information element as an input candidate corresponding to the push operation at the time out of the plurality of input information elements.

This achieves the following three effects. Namely, (1) in a case where the assignment of the plurality of input information elements to the input key is changed according to frequencies of use or the like, the user can check the up-to-date assignment information on the external display device during a push operation on the input key. (2) For example, in a case where the input mode is switched from an input mode of Japanese hiragana writing symbols to an alphabet input mode, it is feasible to feed back to the user the assignment information of input information about the input mode after the switch, which cannot be readily displayed by only the display on the key top. Furthermore, (3) the user can also check the information as an input candidate corresponding to a push operation at the time of the operation (information selected at the time). The feedback function of up-to-date assignment information as described above can dramatically improve easiness and certainty of user operation.

The input key and input apparatus according to the present invention permit the user to selectively input five or more information elements by the simple input operation of moving the key top of the input key in the push direction or compositely moving the key top in the radial directions in addition to the push direction.

BRIEF DESCRIPTION OF THE DRAWINGS

FIG. 13 is a conceptual diagram of a direction determination table to which a converting circuit in the first embodiment shown in FIG. 9 refers.

FIG. 14 is a conceptual diagram of a tally table tallied by the converting circuit in the first embodiment shown in FIG. 9.

FIG. 15 is a conceptual diagram of a symbol conversion table to which the converting circuit in the first embodiment shown in FIG. 9 refers.

FIG. 17 is a conceptual diagram of a tally table in the first embodiment corresponding to FIG. 14.

FIG. 18 is a conceptual diagram of a direction determination table to which the converting circuit in the second embodiment shown in FIG. 9 refers.

FIG. 19 is a conceptual diagram of a tally table tallied by the converting circuit in the second embodiment shown in FIG. 9.

FIG. 20 is a conceptual diagram of a tally table in the second embodiment corresponding to FIG. 19.

FIG. 21 is a conceptual diagram of a symbol conversion table to which the converting circuit in the third embodiment shown in FIG. 9 refers.

FIG. 27 is a conceptual diagram of a tally table tallied by the converting circuit in the fourth embodiment shown in FIG. 9.

FIG. 28 is a conceptual diagram of a symbol conversion table which the converting circuit in the fourth embodiment shown in FIG. 9 rewrites.

FIG. 29 is a conceptual diagram of a tally table which the converting circuit in the fourth embodiment shown in FIG. 9 rewrites.

FIG. 30 is a conceptual diagram of a symbol conversion table which the converting circuit in the fourth embodiment shown in FIG. 9 rewrites.

FIG. 31 is a conceptual diagram of a tally table which the converting circuit in the fourth embodiment shown in FIG. 9 rewrites.

FIG. 32 is a conceptual diagram of a symbol conversion table to which the converting circuit in the fifth embodiment shown in FIG. 9 refers.

FIG. 34 is a conceptual diagram of a mark tally table tallied by the converting circuit in the fifth embodiment shown in FIG. 9.

FIG. 35 is a conceptual diagram of a mark tally table which the converting circuit in the fifth embodiment shown in FIG. 9 rewrites.

FIG. 36 is a conceptual diagram of a symbol conversion table which the converting circuit in the fifth embodiment shown in FIG. 9 rewrites.

FIG. 37 is a conceptual diagram of a buffer configured in the converting circuit in the sixth embodiment shown in FIG. 9.

FIG. 51 is a table showing an example of assignment of the Japanese hiragana writing symbols and marks to each key.

FIG. 52 is a table showing an example of assignment of the English alphabet and marks to each key.

FIG. 54 is a table showing an example of assignment of Chinese 声母(consonants) to each key and assignment of Chinese 韻母 (vowels) to each key.

FIG. 55 is a table showing an example of assignment of Korean symbols to each key.

DESCRIPTION OF THE PREFERRED EMBODIMENTS

Embodiments of the input key and input apparatus according to the present invention will be described below with reference to the drawings. Among the drawings to be referred to, FIG. 1 is a front view showing the appearance of a cell phone incorporating the input keys and input apparatus according to the first embodiment, and FIG. 2 is an enlarged front view of the keyboard input apparatus shown in FIG. 1.

First Embodiment

Figure 1:
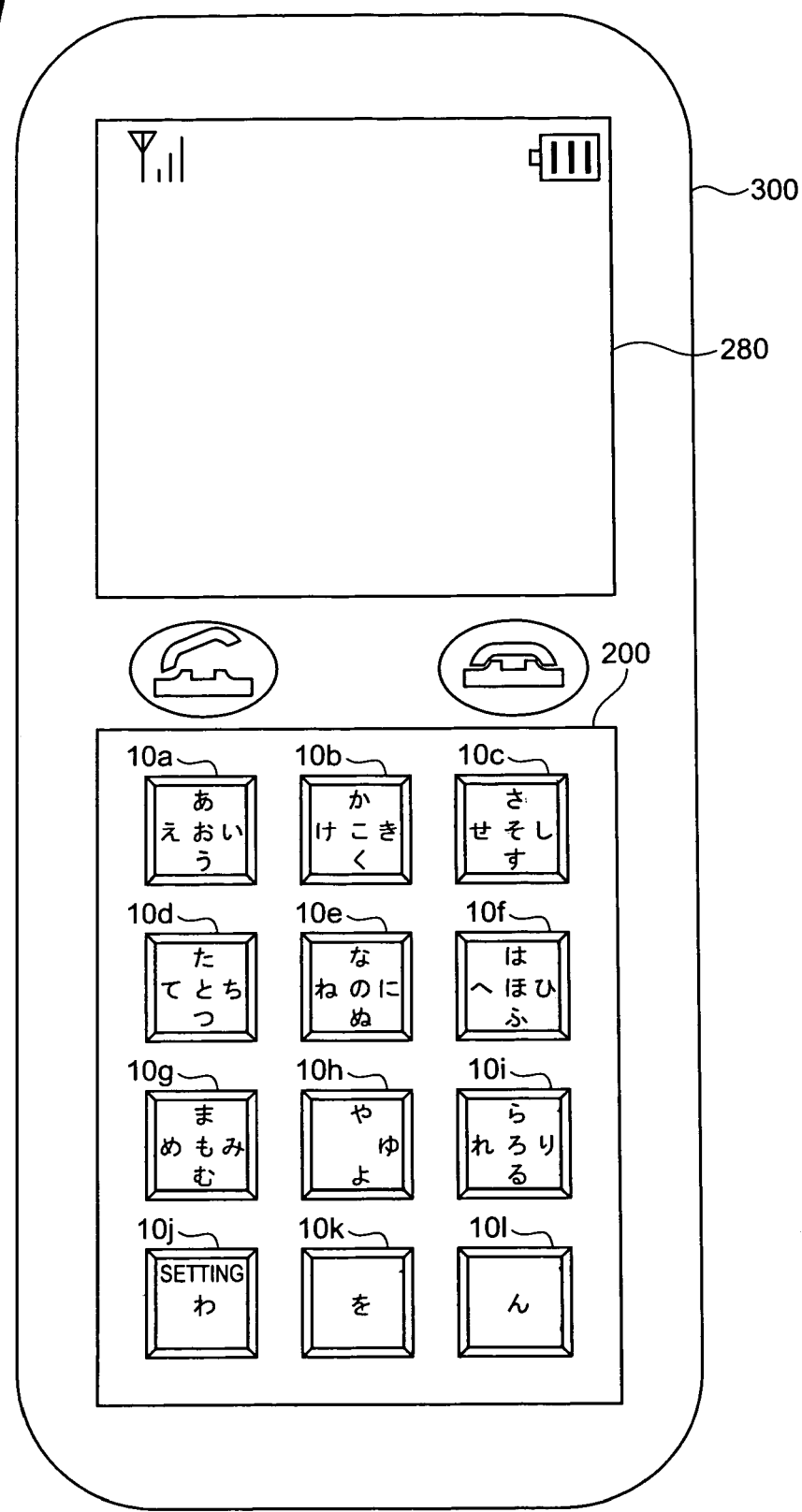
FIG. 1 is a front view showing the appearance of a cell phone incorporating the input keys and input apparatus according to the first embodiment of the present invention.

The input keys and input apparatus according to the first embodiment are incorporated, for example, as a keyboard input apparatus 200 in a cell phone 300 shown in FIG. 1. This keyboard input apparatus 200 is placed below a liquid crystal display 280 which is a display screen of the cell phone 300. In this keyboard input apparatus 200, for example, twelve input keys 10a to 10l for input of "1-9, *, 0, #" as dial buttons are arrayed in a matrix of four horizontal lines and three vertical columns.

Figure 2:
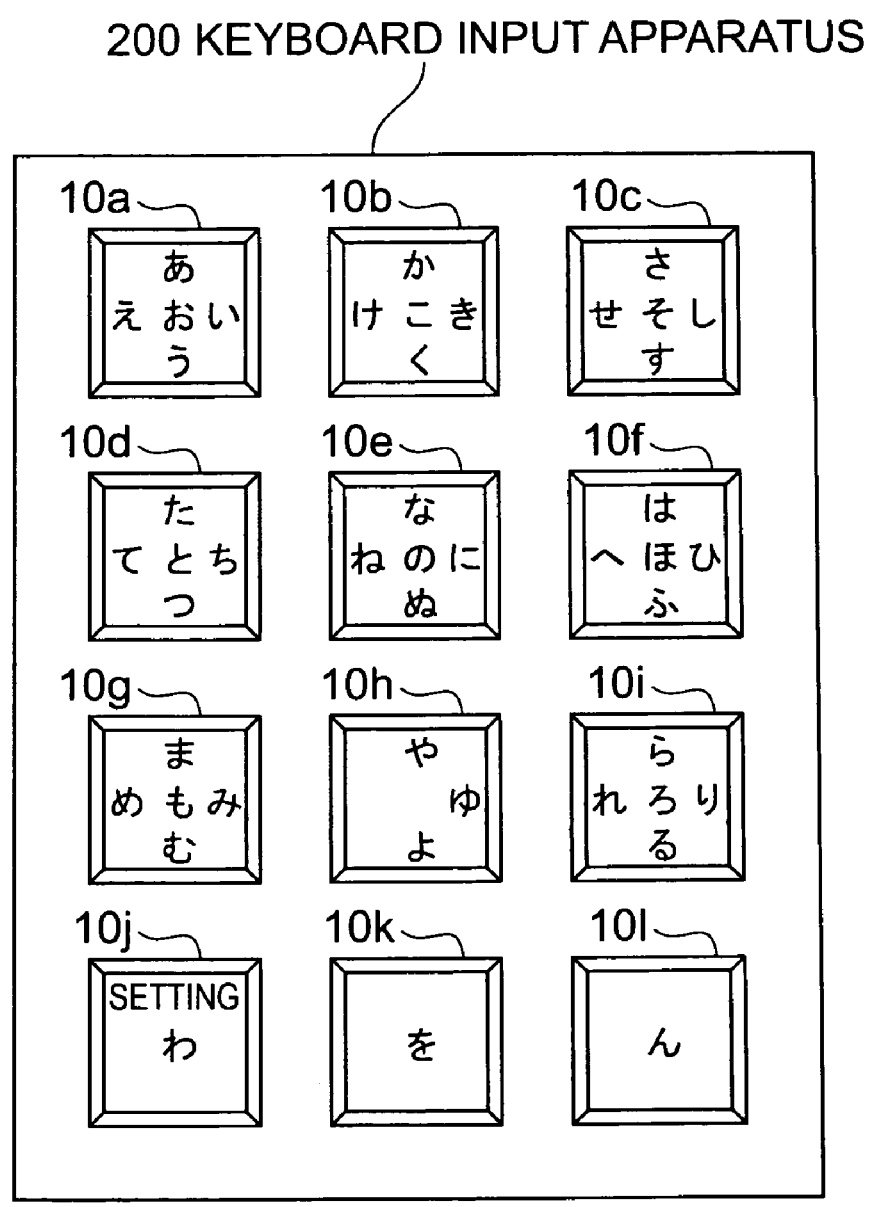
FIG. 2 is an enlarged front view of the keyboard input apparatus in the first embodiment shown in FIG. 1.

As shown in FIG. 2, the input keys 10a-10l are assigned, for example, the hiragana writing symbols of "あ" to "ん" as text information elements to be selectively inputted. Specifically, the input key 10a on the first line and on the left column is assigned the five symbols of "あ, い, う, え, お" in the "あ line group", the input key 10b on the first line and on the middle column the five symbols of "か, き, く, け, こ" in the "き line group", and the input key 10c on the first line and on the right column the five symbols of "さ, し, す, せ, そ" in the "さ line group".

Similarly, the input key 10d on the second line and on the left column is assigned the five symbols in the "た line group", the input key 10e on the second line and on the middle column the five symbols in the "な line group", the input key 10f on the second line and on the right column the five symbols in the "い line group", the input key 10g on the third line and on the left column the five symbols in the "ま line group", and the input key 10*i* on the third line and on the right column the five symbols in the "ら line group". The input key 10*h* on the third line and on the middle column is assigned the three symbols in the "や line group", the input key 10*j* on the fourth line and on the left column one symbol of "わ", the input key 10*k* on the fourth line and on the middle column one symbol of "を", and the input key 10*l* on the fourth line and on the right column one symbol of "ん".

The key top of each input key 10*a*-10*l* is approximately square on the plan view, and a surface thereof indicates the symbols assigned as described above, in cross-shape arrangement. For example, on the surface of the key top of the input key 10*a*, the symbol of "お" is indicated in the central region, the symbol of "あ" in the upper region, the symbol of "い" in the right region, the symbol of "う" in the lower region, and the symbol of "え" in the left region. Likewise, surfaces of the respective key tops of the input keys 10*b*-10*g*, and 10*i* are also provided with indications of assigned symbols in cross-shape arrangement.

On the surface of the key top of the input key 10*h*, the symbol of "や" is indicated in the upper region above the central region, the symbol of "ゆ" in the right region to the central region, and the symbol of "よ" in the lower region below the central region. On the surfaces of the key tops of the input keys 10*j*-10*l*, one symbol of "わ", "を", or "ん" is indicated in the central region.

Since the input keys 10*a*-10*l* constituting the keyboard input apparatus 200 have similar structure, the structure will be described using one input key 10*a* as an example, without detailed description of the other input keys 10*b*-10*l*.

Figure 3:
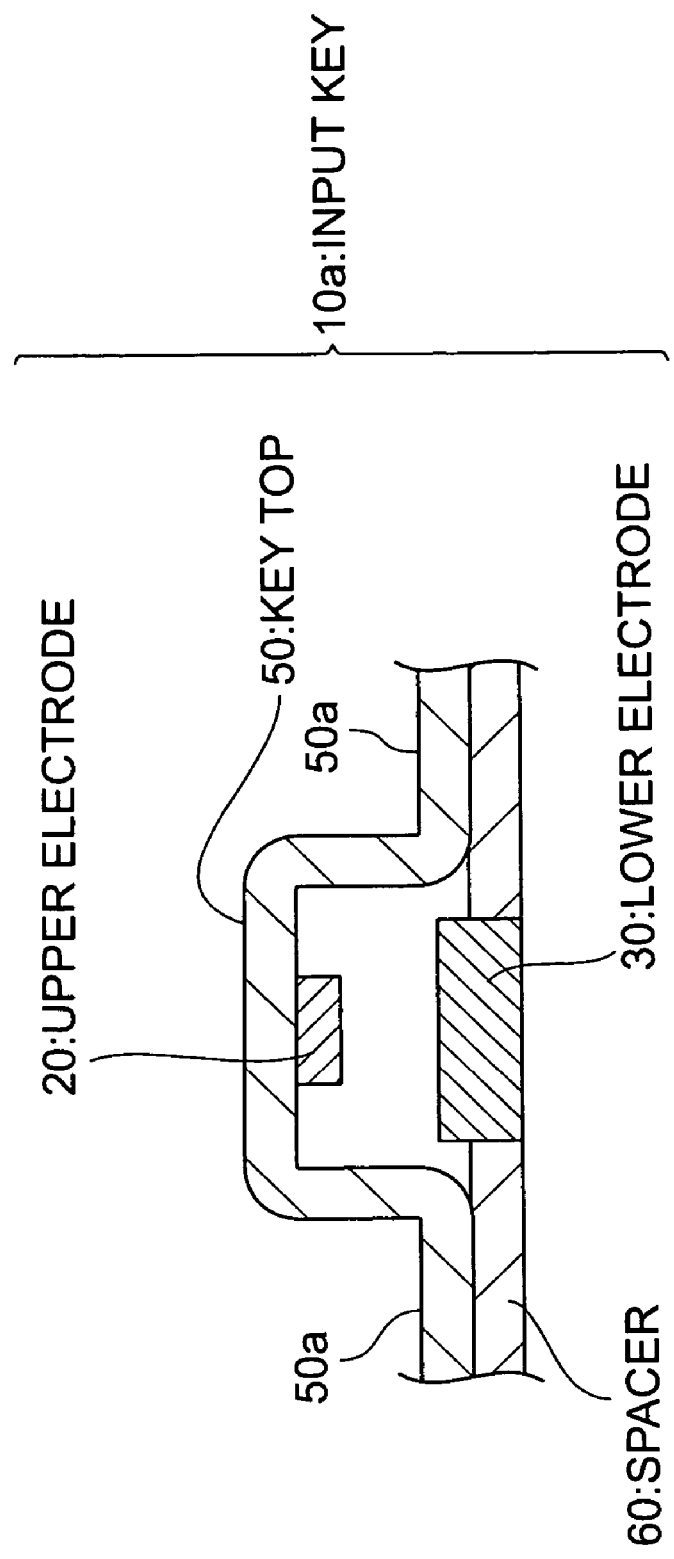
FIG. 3 is a sectional view of an input key in the first embodiment shown in FIGS. 1 and 2.

As shown in the sectional view of FIG. 3, the input key 10*a* is provided with a key top 50 formed in a hatlike sectional shape, a spacer 60 to which a flange 50*a* of the key top 50 is joined, an upper electrode 20 as a first contact fixed to a central region in a back surface of the top part of the key top 50, and a lower electrode 30 as a second contact fixed to the spacer 60 so as to be opposed to the upper electrode 20.

Figure 4:
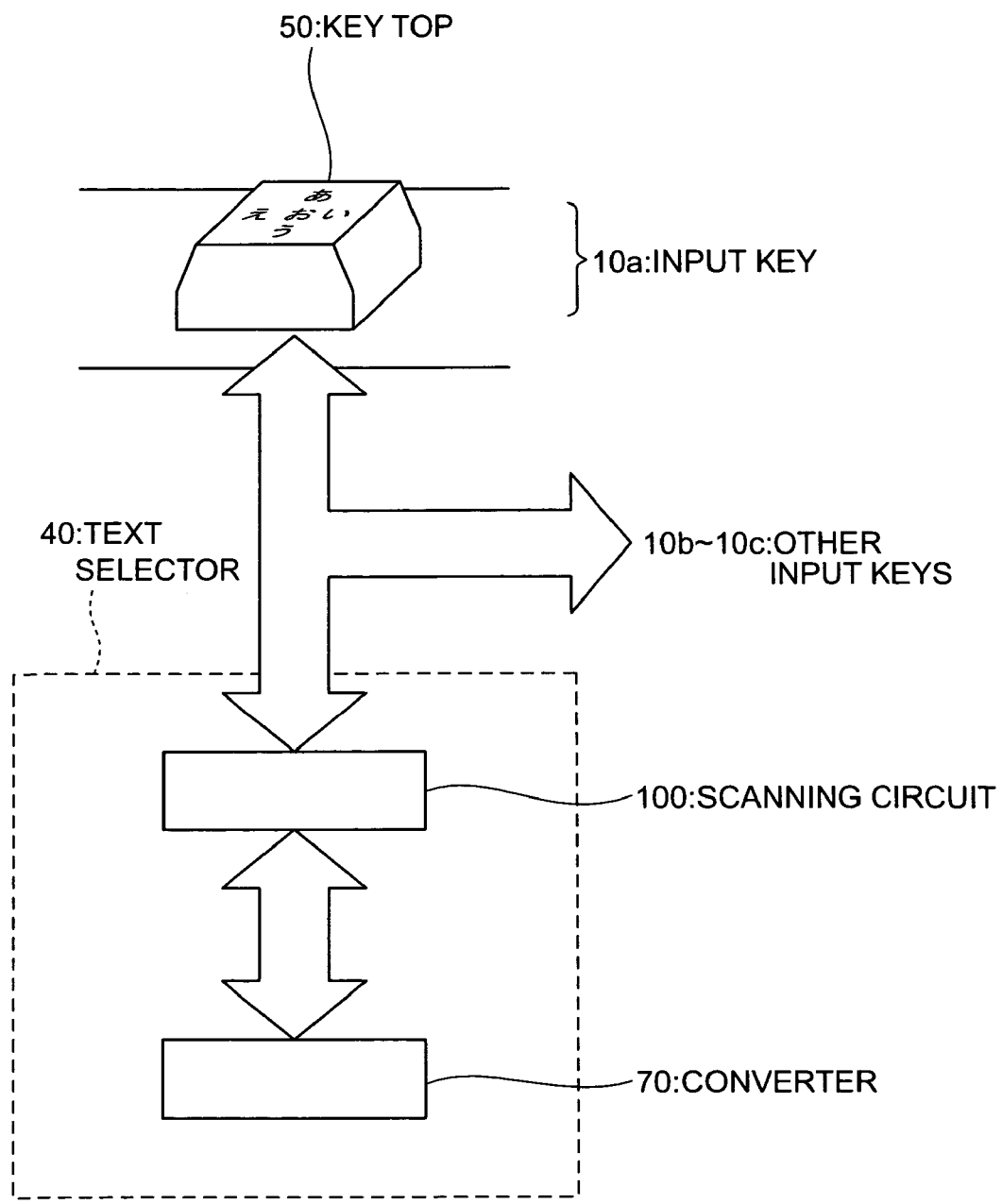
FIG. 4 is a functional block diagram of the keyboard input apparatus in the first embodiment shown in FIG. 2.

The input key 10*a* of the structure as described above is connected to a text selecting means (corresponding to the information selecting means according to the present invention) 40 in which a scanning circuit 100 and a converting circuit 70 are coupled to each other, as shown in FIG. 4. This input key 10*a* is connected to each of the other input keys 10*b*-10*l*. The scanning circuit 100 is provided corresponding to each of the other input keys 10*b*-10*l*.

Figure 5:
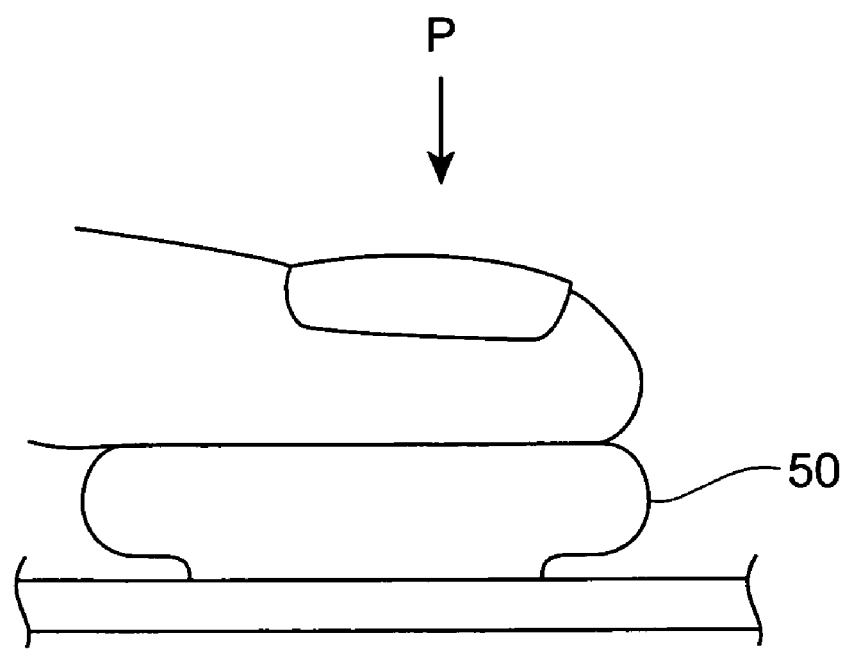
FIG. 5 is a side view showing a state in which a key top of an input key in the first embodiment shown in FIG. 3 is elastically deformed in the normal push direction.

The key top 50 of the input key 10*a* shown in FIG. 3 is made of a flexible material elastically deformable; for example, it is formed from a sheet material of synthetic rubber and in the hatlike sectional shape. For this reason, when the key top 50 is pushed by a fingertip in the normal push direction P perpendicular to the plane of the keyboard input apparatus 200 (cf. FIG. 2), it is elastically deformed in the push direction P, as shown in FIG. 5. When the key top is further pushed from this state, for example, in the "up" direction by two strokes (two actions), the key top is compositely elastically deformed in the push direction P and in the "up" direction, as shown in FIG. 6.

Figure 6:
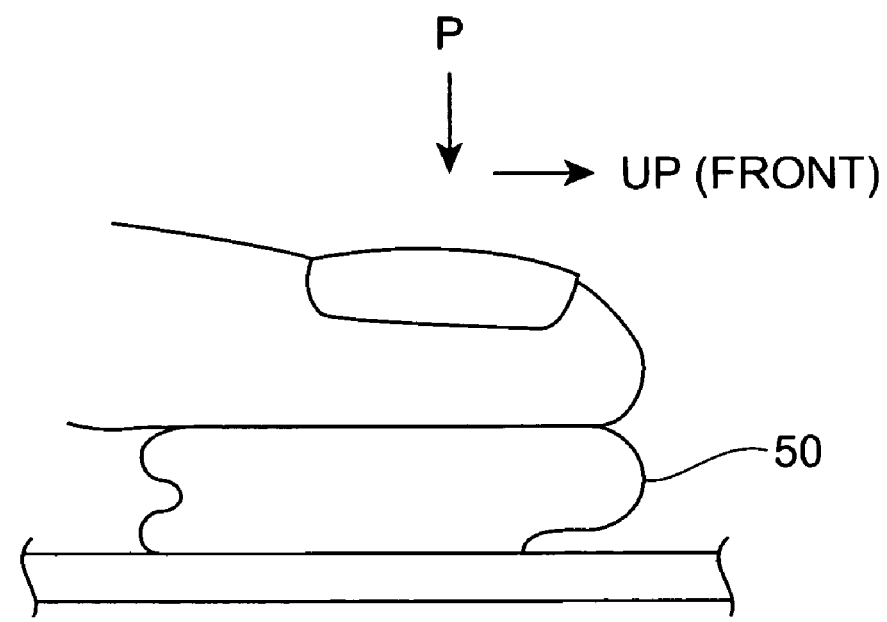
FIG. 6 is a side view showing a state in which a key top of an input key in the first embodiment shown in FIG. 3 is compositely elastically deformed in the normal push direction and in the "up" direction.

The key top 50 is also elastically deformed into the state shown in FIG. 6 by first pushing it in the "up" direction by a fingertip and thereafter pushing it in the push direction P by two strokes (two actions), or is also elastically deformed into the state shown in FIG. 6 by continuously performing this push operation by one stroke (one action).

Figure 7:
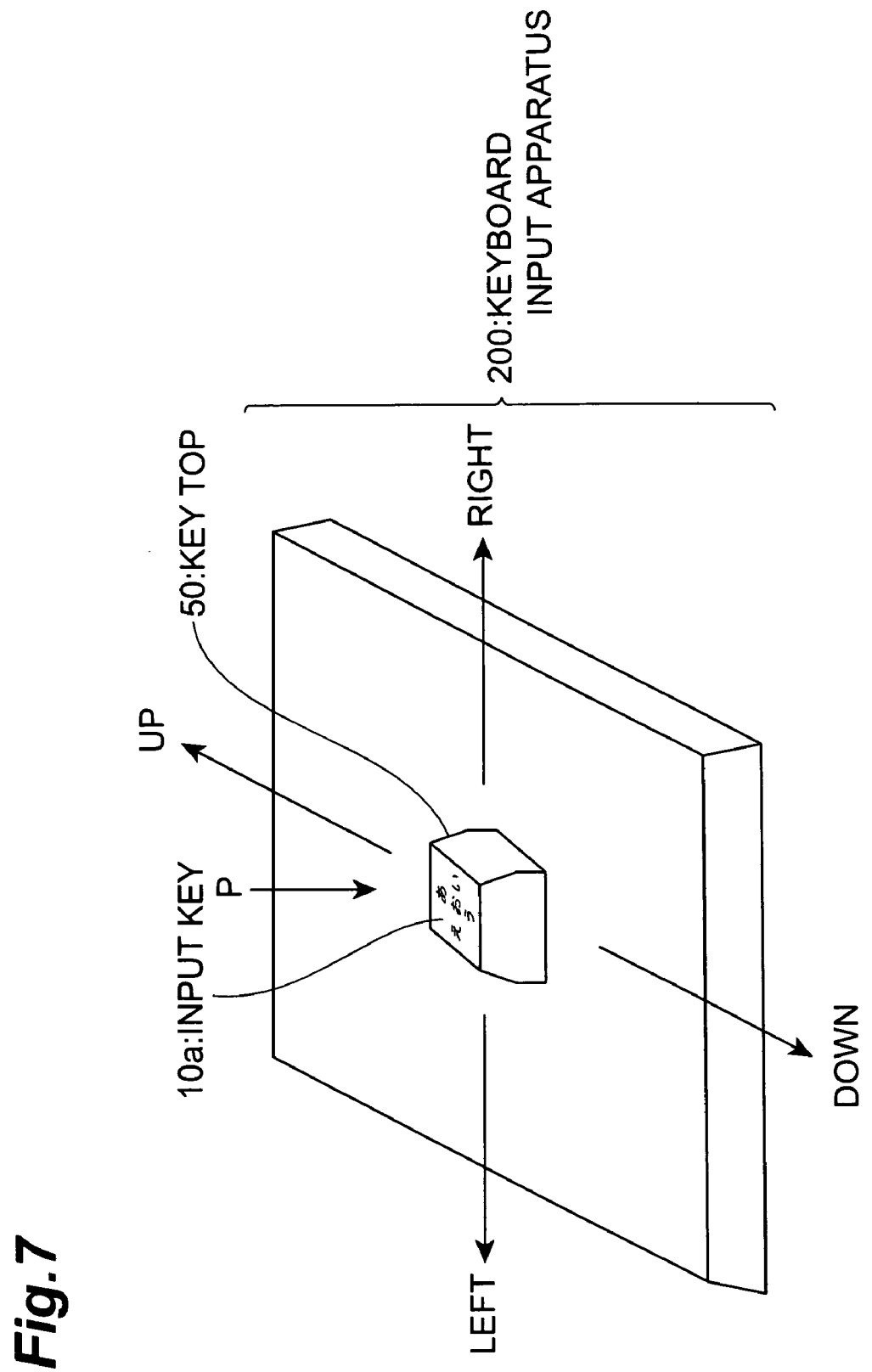
FIG. 7 is a perspective view showing movable directions of a key top in the first embodiment shown in FIG. 3.

In this manner, the key top 50 is arranged so as to be compositely movable in the normal push direction P perpendicular to the plane of the keyboard input apparatus 200 and in radial directions (at least in crosswise directions) intersecting with the push direction P. For example, as shown in FIG. 7, the key top 50 is arranged so as to be compositely movable in five directions: the normal push direction P and, an "up" direction, a "down" direction, a "left" direction, and a "right" direction intersecting with the push direction P.

The spacer 60 of the input key 10*a* shown in FIG. 3 is a support member for the key top 50 and lower electrode 30, and the flange 50*a* of the key top 50 is joined to the upper surface thereof. This spacer 60 is comprised of an insulating material such as polyester film, and the insulating property thereof electrically isolates the upper electrode 20 from the lower electrode 30 and electrically isolates the lower electrodes 30 from each other.

The upper electrode 20 of the input key 10*a* (cf. FIG. 3) is comprised of an electric conductor such as a conductive metal. The upper electrode 20 is smaller than the lower electrode 30 and is opposed to the central part of the lower electrode 30. For this reason, when the key top 50 is pushed in the push direction P by a fingertip as shown in FIG. 5, the upper electrode 20 comes to contact the central part of the lower electrode 30. When the key top 50 is compositely pushed in the push direction P and in the "forward" direction by a fingertip as shown in FIG. 6, the upper electrode 20 comes to contact the front part of the lower electrode 30.

Figure 8:
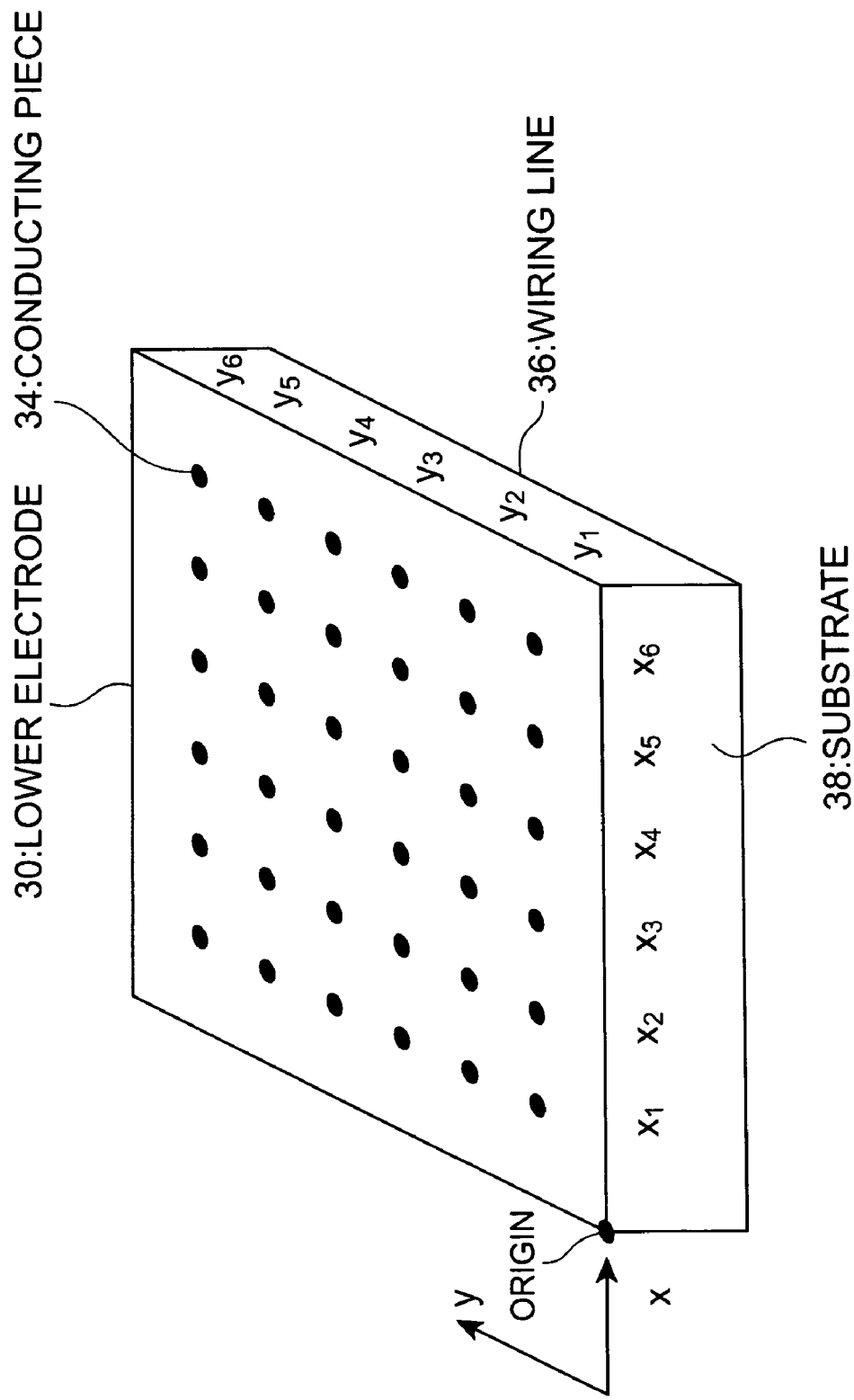
FIG. 8 is a perspective view schematically showing an enlargement of a lower electrode in the first embodiment shown in FIG. 3.

The lower electrode 30 of the input key 10*a* (cf. FIG. 3) has a structure in which a group of conducting pieces 34 of metal are arrayed in a matrix pattern on an upper surface of base 38, as shown in FIG. 8. Namely, under such definitions that the xy plane is defined on the base 38 so that the origin thereof is located at the lower left corner of the base 38 shown in FIG. 8 and that x1, x2, x3, x4, x5, x6 and y1, y2, y3, y4, y5, y6 are defined at equal intervals to each other, each conducting piece 34 is placed on x, y coordinates as a combination thereof. In other words, each conducting piece 34 is placed on an intersecting point out of those between six straight lines with x coordinates of x1, x2, x3, x4, x5, and x6 perpendicular to the x-axis and six straight lines with y coordinates of y1, y2, y3, y4, y5, and y6 perpendicular to the y-axis.

FIG. 8 shows the example in which the conducting pieces 34 are arrayed in the 6×6 matrix pattern, for easier description, but the array of conducting pieces 34 can be arbitrarily modified in any matrix pattern such as 10×10, 12×12, and so on, without having to be limited to the 6×6 matrix pattern shown in FIG. 8.

Figure 9:
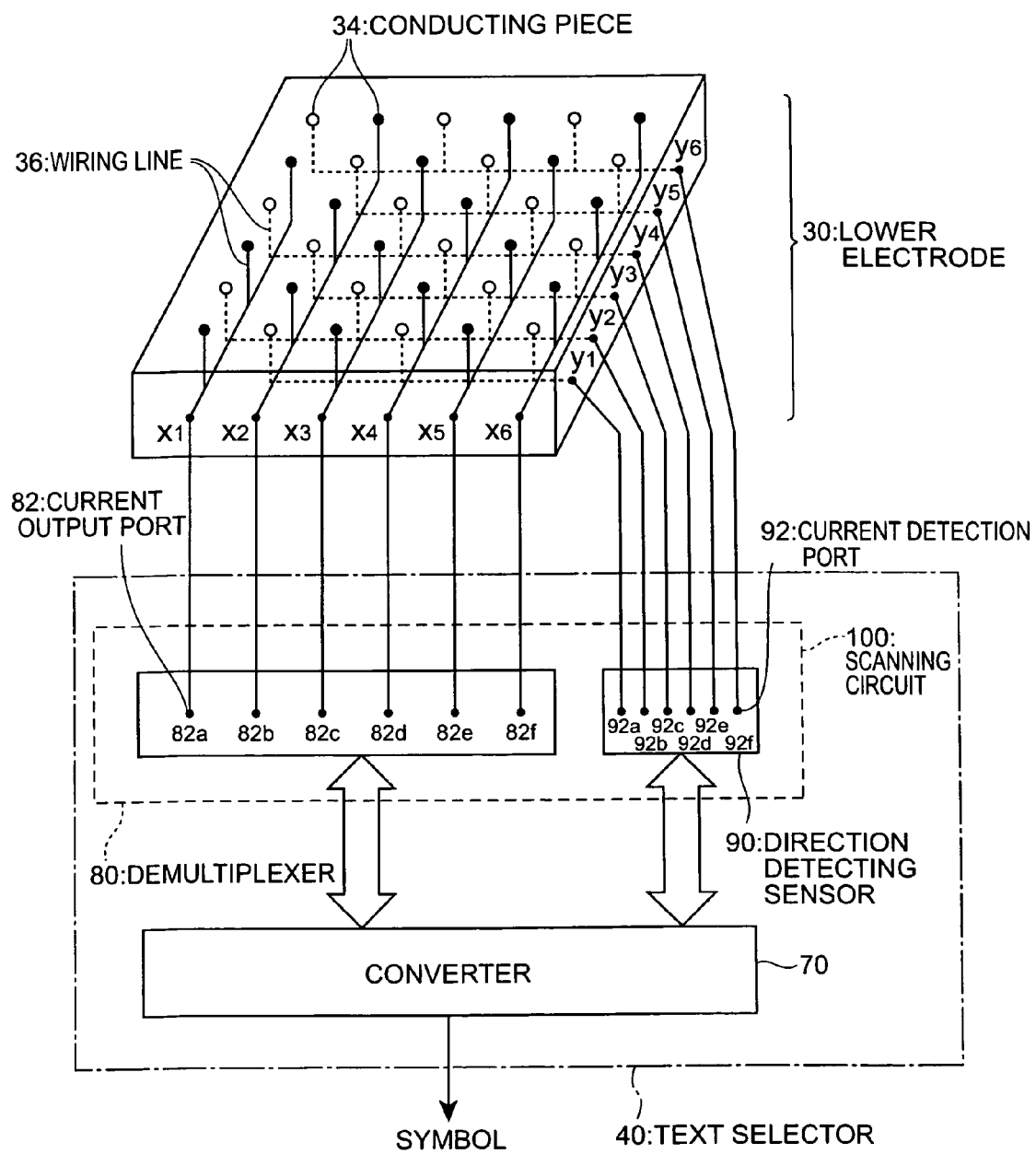
FIG. 9 is an illustration schematically showing a configuration of text selecting means in the first embodiment shown in FIG. 4.

The base 38 of the lower electrode 30 is comprised of an insulating material such as phenol resin, silicon, or glass, and each conducting piece 34 is connected through a wiring line 36 provided in the base 38, to the scanning circuit 100 of the text selecting means 40 (cf. FIG. 9). When this group of conducting pieces 34 come into contact with the upper electrode 20 (cf. FIG. 3), two or more conducting pieces 34 conduct to each other to go into an on state. When the contact with the upper electrode 20 is released, the conducting pieces go into an off state.

The wiring lines 36 are provided along the aforementioned six straight lines perpendicular to the x-axis and six straight lines perpendicular to the y-axis. In order to distinguish these wiring lines 36 from each other, the wiring line provided along the straight line x=x1 will be referred to hereinafter as x1 line 36, the wiring line provided along the straight line x=x2 as x2 line 36, the wiring line provided along the straight line x=x3 as x3 line 36, the wiring line provided along the straight line x=x4 as x4 line 36, the wiring line provided along the straight line x=x5 as x5 line 36, and the wiring line provided along the straight line x=x6 as x6 line 36. Similarly, the wiring line provided along the straight line y=y1 will be referred to hereinafter as y1 line 36, the wiring line provided along the straight line y=y2 as y2 line 36, the wiring line provided along the straight line y=y3 as y3 line 36, the wiring line provided along the straight line y=y4 as y4 line 36, the wiring line provided along the straight line y=y5 as y5 line 36, and the wiring line provided along the straight line y=y6 as y6 line 36.

Figure 10:
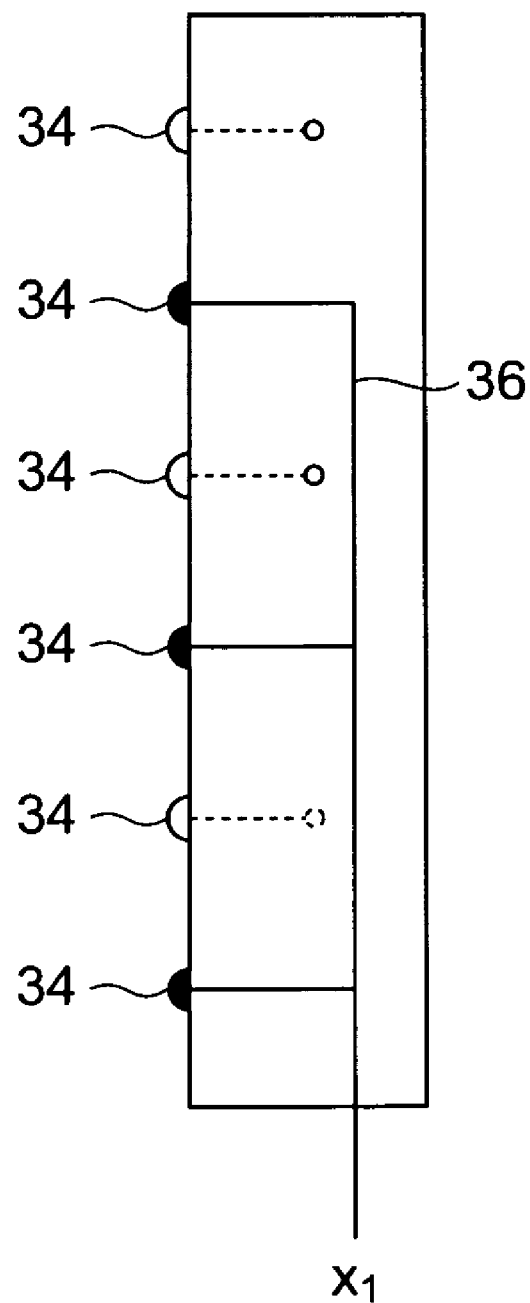
FIG. 10 is a schematic illustration showing a connection state of an x1 wiring line of the lower electrode in the first embodiment shown in FIG. 9.

As shown in FIG. 9, the alternate conducting pieces 34 arrayed along the x1-x6 lines are connected to the x1 line 36 to x6 line 36. Specifically, on the xy plane of the lower electrode 30, the conducting pieces 34 located at positions (x1,yj) (j=1, 3, and 5) are connected to the x1 line 36 (cf. FIG. 10), the conducting pieces 34 located at positions (x3,yj) (j=1, 3, and 5) are connected to the x3 line 36, and the conducting pieces 34 located at positions (x5,yj) (j=1, 3, and 5) are connected to the x5 line 36. Similarly, the conducting pieces 34 located at positions (x2,yj) (j=2, 4, and 6) are connected to the x2 line 36, the conducting pieces 34 located at positions (x4,yj) (j=2, 4, and 6) are connected to the x4 line 36, and the conducting pieces 34 located at positions (x6,yj) (j=2, 4, and 6) are connected to the x6 line 36.

Figure 11:
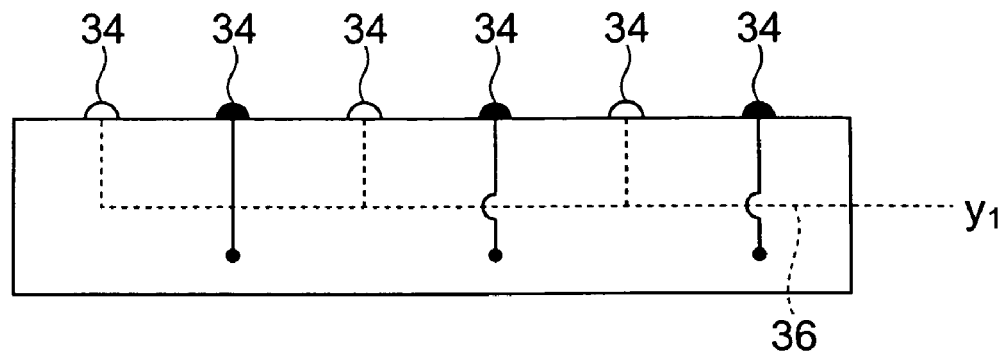
FIG. 11 is a schematic illustration showing a connection state of a y1 wiring line of the lower electrode in the first embodiment shown in FIG. 9.

The alternate conducting pieces 34 arrayed along the y1-y6 lines 36 are connected to the y1 line 36 to y6 line 36. Specifically, on the xy plane of the lower electrode 30, the conducting pieces 34 located at positions (x1,y1) (i=2, 4, and 6) are connected to the y1 line 36 (cf. FIG. 11), the conducting pieces 34 located at positions (x1,y3) (i=2, 4, and 6) are connected to the y3 line 36, and the conducting pieces 34 located at positions (x1,y5) (i=2, 4, and 6) are connected to the y5 line 36. Similarly, the conducting pieces 34 located at (x1,y2) (i=1, 3, and 5) are connected to the y2 line 36, the conducting pieces 34 located at positions (x1,y4) (i=1, 3, and 5) are connected to the y4 line 36, and the conducting pieces 34 located at positions (x1,y6) (i=1, 3, and 5) are connected to the y6 line 36.

The text selecting means 40 shown in FIG. 4 selects one symbol, for example, out of the symbols "あ" to "お" assigned to the input key 10a, based on the on or off states in the input key 10a. For this purpose, the text selecting means 40 is provided with the scanning circuit 100 for monitoring the on/off states in the input key 10a, and the converting circuit 70 for selecting a symbol (text information) to be inputted, with reference to an after-described conversion table, based on the information monitored by the scanning circuit 100. Since the structure of the scanning circuits 100 corresponding to the other input keys 10b-10l are similar to that of the scanning circuit 100 corresponding to the input key 10a, the detailed description thereof is omitted herein.

As shown in FIG. 9, the scanning circuit 100 of the text selecting means 40 is provided with a demultiplexer 80 and a direction detecting sensor 90.

The demultiplexer 80 has six current output ports 82 (82a-82f), and the aforementioned six lines 36 (x1 line 36 to x6 line 36) of the lower electrode 30 are connected to the respective current output ports 82 (82a-82f). The direction detecting sensor 90 has six current detection ports 92 (92a-92f), and the aforementioned six lines 36 (y1 line 36 to y6 line 36) of the lower electrode 30 are connected to the respective current detection ports 92 (92a-92f).

Figure 12:
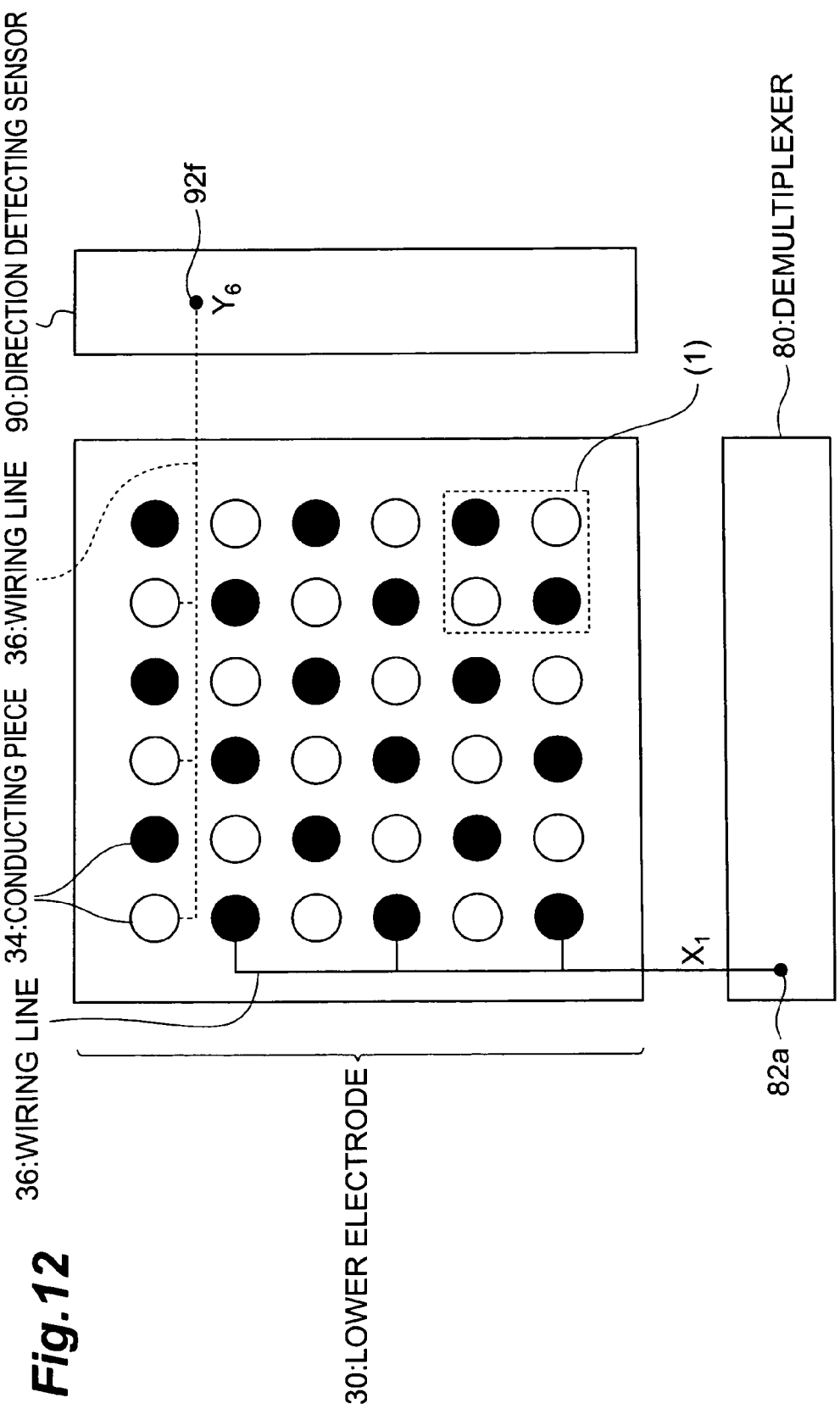
FIG. 12 is a plan view schematically showing an array state of conducting pieces of the lower electrode in the first embodiment shown in FIG. 9.

FIG. 12 shows a connection state of the demultiplexer 80 and direction detecting sensor 90 with each conducting piece 34 of the lower electrode 30, in which the current output port 82a of the demultiplexer 80 is connected through the x1 line 36 to three alternate, conducting pieces 34 indicated by black dots and in which the current detection port 92f of the direction detecting sensor 90 is connected through the y6 line 36 to three alternate conducting pieces 34 indicated by white dots. In this manner, each conducting piece 34 of the lower electrode 30 is connected as follows: the conducting pieces 34 of black dots arrayed in a mutually checkered pattern are connected to the demultiplexer 80 while the conducting pieces 34 of white dots to the direction detecting sensor 90.

The demultiplexer 80 shown in FIG. 9 outputs an electric current in order, to the six lines 36 (x1 line 36 to x6 line 36) connected to the six current output ports 82 (82a-82f), based on instructions from the converting circuit 70, so as to output the electric current to half of the conducting pieces 34 (black dots) of the lower electrode 30.

On the other hand, the direction detecting sensor 90 is configured so that when the upper electrode 20 comes to contact the lower electrode 30 by a push operation of the input key 10a to bring two or more conducting pieces 34 of black and white dots adjacent to each other (cf. FIG. 12) into a conducting state through the upper electrode 20, it detects through which one of the y1 line 36 to y6 line 36 an electric current flows because of the conduction. Then this direction detecting sensor 90 converts the detected current into a yj position signal so as to permit the converting circuit 70 to specify the positions of the conducting pieces 34 in the conducting state, and outputs the signal to the converting circuit 70. Namely, the direction detecting sensor 90 outputs a y1 position signal to a y6 position signal according to the y1 line 36 to y6 line 36 through which the current is detected, to the converting circuit 70.

The aforementioned upper electrode 20 of the input key 10a (cf. FIG. 3) is preferably of an approximately square shape of such size indicated by a chain line in FIG. 12 as to simultaneously contact four conducting pieces 34 of black and white dots arrayed in the mutually checkered pattern in FIG. 12. If the size of the upper electrode 20 is smaller than it, the conducting pieces 34 of black and white dots can fail to conduct through the upper electrode 20. If the size of the upper electrode 20 is larger than it on the other hand, the number of conducting pieces 34 of black and white dots in the conducting state will increase, so as to complicate the specifying operation to specify through which one of the y1 line 36 to y6 line 36 the current flows.

The converting circuit 70 shown in FIG. 9 is usually constructed on a substrate of the keyboard input apparatus 200, but may be constructed on another substrate. When one of the input keys 10a-10l is pushed, the converting circuit 70 specifies the position of conducting piece 34 in the conducting state in the pushed input key 10a-10l, based on instructions on current output to the demultiplexer 80 corresponding to the pushed input key 10a-10l and based on the y1 position signal to y6 position signal fed from the position detecting sensor 90. For example, when the demultiplexer 80 corresponding to the input key 10a is instructed to output the current to the x1 line 36 and when the converting circuit 70 receives the y1 position signal from the direction detecting sensor 90, it specifies that the position of the conducting piece 34 in the conducting state in the input key 10a is (x1,y1).

This converting circuit 70 determines a moving direction of the key top 50 (upper electrode 20) with reference to a direction determination table T1 shown in FIG. 13, based on the position information (xl,yj) of the conducting piece 34 whose conduction state was specified. This direction determination table T1 is, for example, a table recorded in a ROM (Read Only Memory) provided in the converting circuit 70, and in this direction determination table T1, "moving directions" of the key top 50 (upper electrode 20) are recorded corresponding to the positions (x1,yj) (i=1-6, j=1-6) of the conducting pieces 34 to be brought into the conducting state upon contact with the upper electrode 20 (cf. FIG. 3).

Specifically, in the direction determination table T1, "center" is recorded as a moving direction corresponding to the positions (x3,y3), (x3,y4), (x4,y3), and (x4,y4) of the conducting pieces 34 brought into the conducting state in the central part of the lower electrode 30. In addition, "right" is recorded as a moving direction corresponding to the positions (x5,y3), (x5,y4), (x6,y2), (x6,y3), (x6,y4), and (x6,y5) of the conducting pieces 34 brought into the conducting state in the right part of the lower electrode 30. Furthermore, "down" is recorded as a moving direction corresponding to the positions (x2,y1), (x3,y1), (x3,y2), (x4,y1), (x4,y2), and (x5,y1) of the conducting pieces 34 brought into the conducting state in the lower part of the lower electrode 30. Moreover, "left" is recorded as a moving direction corresponding to the positions (x1,y2), (x1,y3), (x1,y4), (x1,y5), (x2,y3), and (x2,y4) of the conducting pieces 34 brought into the conducting state in the left part of the lower electrode 30. Besides, "up" is recorded as a moving direction corresponding to the positions (x2,y6), (x3,y5), (x3,y6), (x4,y5), (x4,y6), and (x5,y6) of the conducting pieces 34 brought into the conducting state in the upper part of the lower electrode 30.

"NULL" specifying no moving direction is recorded in boundary portions between the foregoing moving directions. This "NULL" is recorded corresponding to the positions (x1,y1), (x1,y6), (x2,y2), (x2,y5), (x5,y2), (x5,y5), (x6,y1), and (x6,y6) of the conducting pieces 34 brought into the conducting state.

After the converting circuit 70 determines the moving direction of the key top 50 (upper electrode 20) with reference to the direction determination table T1, it writes the determination result into a tally table T2 shown in FIG. 14 to update the contents thereof. This tally table T2 is, for example, one constructed in a RAM (Random Access Memory) provided in the converting circuit 70. In this tally table T2, the name of the input key 10a the moving direction of the key top 50 (upper electrode 20) of which was determined, is recorded, and the number of detection associated with the determined direction is updated and recorded for each of the determined moving directions "center", "up", "right", "down", and "left".

The converting circuit 70 selects a symbol to be inputted, with reference to a symbol conversion table T3 as a conversion table shown in FIG. 15, based on the moving direction of the key top 50 (upper electrode 20) determined. This symbol conversion table T3 is, for example, one recorded corresponding to each input key 10a-10l in a RAM (Random Access Memory) provided in an appropriate portion of the keyboard input apparatus 200. For example, in the symbol conversion table T3 corresponding to the input key 10a, five symbols of "あ", "い", "う", "え", and "お" are registered corresponding to the respective moving directions "up", "right", "down", "left", and "center" of the key top 50 (upper electrode 20) determined in the converting circuit 70.

Figure 16:
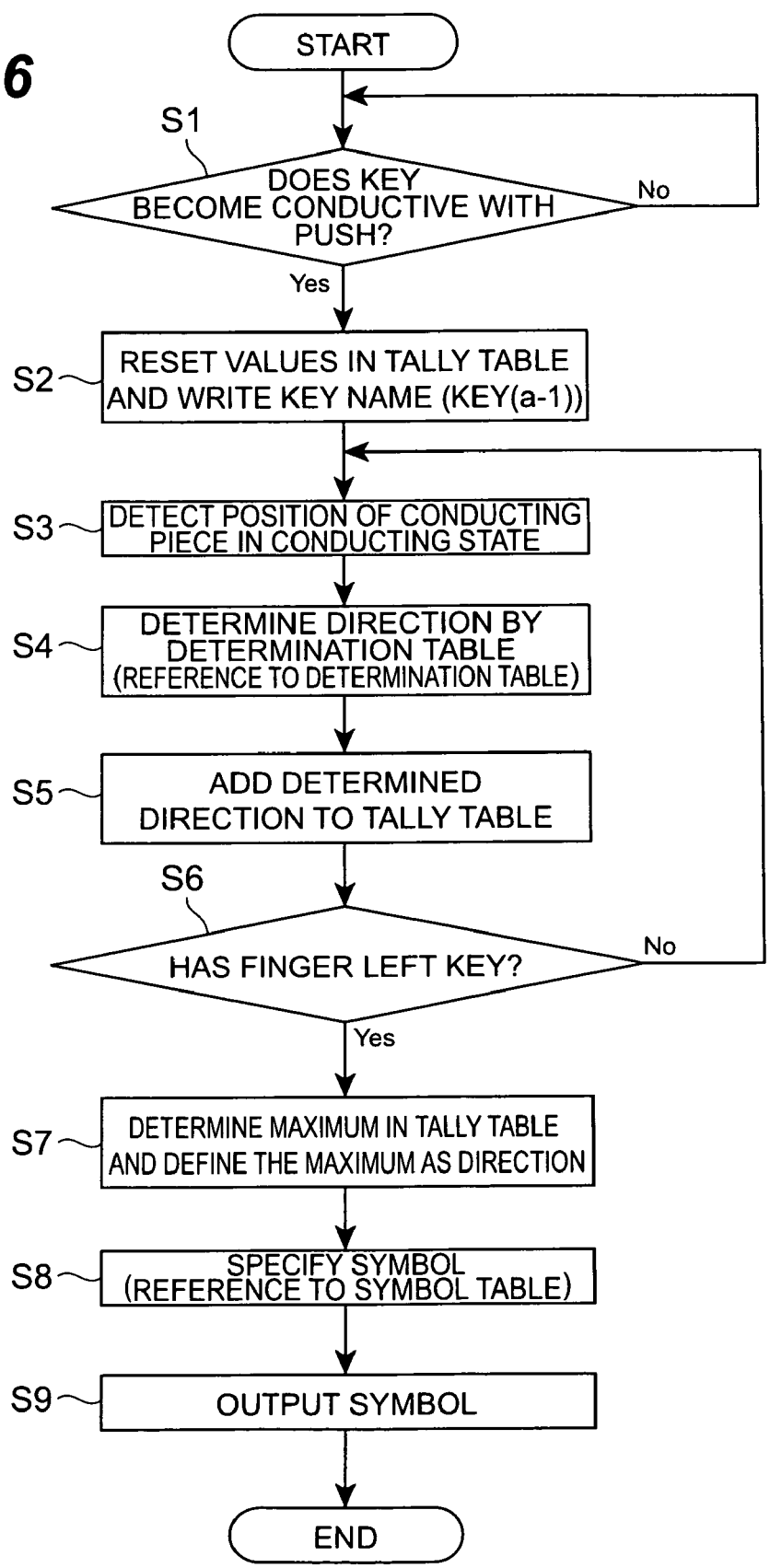
FIG. 16 is a flowchart showing the processing procedure in the first embodiment.

In the first embodiment, the text selecting means 40 selectively inputs one of the symbols "あ" to "ん" assigned to the input keys 10a-10l, along the processing procedure of the flowchart shown in FIG. 16. At step S1, the converting circuit 70 first determines which one of the input keys 10a-10l was pushed. This determination becomes YES when one of the y1 position signal to y6 position signal is fed from the direction detecting sensor 90 to the converting circuit 70, and it is repeated until the determination result turns to YES.

When one of the input keys 10a-10l is pushed to turn the determination result at step S1 to YES, subsequent step S2 is carried out to reset the whole contents of the tally table T2 and thereafter to write the name of the pushed input key 10a-10l into the tally table T2. For example, supposing the input key 10a is pushed, step S2 results in writing the name of the input key 10a into the tally table T2.

Suppose the key top 50 of the input key 10a is first pushed in the normal push direction P and thereafter pushed in the "right" direction in order to select "い" out of the five symbols of "あ" to "お". Then the upper electrode 20, together with the key top 50, comes to first contact the central part of the lower electrode 30 and then contact the right part of the lower electrode 30. For example, the upper electrode 20 first comes to contact the conducting piece 34 at the position (x4, y4) and the conducting piece 34 at the position (x4, y3) to conduct them to each other and thereafter comes to contact the conducting piece 34 at the position (x6,y4) and the conducting piece 34 at the position (x6,y3) to conduct them to each other.

Then the converting circuit 70, which is sequentially outputting the electric current through the demultiplexer 80 to the x1 line 36 to x6 line 36, receives the y3 position signal and y4 position signal from the direction detecting sensor 90 upon output of the current to the x4 line 36, thereby first detecting the contact between the conducting piece 34 at the position (x4,y4) and the conducting piece 34 at the position (x4,y3) (S3).

At subsequent step S4, the converting circuit 70 determines that the moving direction of the key top 50 (upper electrode 20) is "center", with reference to the direction determination table T1 shown in FIG. 13. At next step S5, during a period of receiving the y3 position signal and y4 position signal from the direction detecting sensor 90, the converting circuit 70 sequentially adds an increment of 1 to the "number of detection" corresponding to the moving direction "center" in the tally table T2 as a determination result thereof (cf. FIG. 17). Specifically, a processor or the like in the converting circuit 70 sequentially adds "1" to the reset number of detection "0". When "NULL" is detected as a moving direction, the converting circuit 70 does not execute the adding process to the "number of detection".

At step S6 subsequent to step S5, the converting circuit 70 determines whether the operation of the input key 10a pushed was released. For example, when a finger leaves the input key 10a to input none of the y1 position signal to y6 position signal from the direction detecting sensor 90 corresponding to the input key 10a, to the converting circuit 70, the converting circuit 70 determines that the push operation of the input key 10a was released, and makes a determination of YES. While one of the y1 position signal to y6 position signal is fed, the converting circuit 70 determines that the push operation of the input key 10a is continuing, and makes a determination of NO.

At step S6 herein, in the case where the key top 50 of the input key 10a is pushed in the normal push direction P and thereafter pushed in the "right" direction in order to input the symbol of "い" as described above, the y3 position signal and y4 position signal are fed to the converting circuit 70, whereby the converting circuit 70 determines that the push operation of the input key 10*a* is continuing, and makes a determination of NO. Then the processes of steps S3 to S6 are repeated in this case.

At step S3 after step S6, the upper electrode 20 comes to contact, for example, the conducting piece 34 at the position (x6,y4) and the conducting piece 34 at the position (x6,y3) to conduct them to each other, and thus the converting circuit 70, which is sequentially outputting the electric current through the demultiplexer 80 to the x1 line 36 to x6 line 36, receives the y3 position signal and y4 position signal from the direction detecting sensor 90 upon output of the current to the x6 line, thereby detecting the contact between the conducting piece 34 at the position (x6,y4) and the conducting piece 34 at the position (x6,y3).

At subsequent step S4, the converting circuit 70 determines that the moving direction of the key top 50 (upper electrode 20) is "right", with reference to the direction determination table T1 shown in FIG. 13 (S4). At next step S5, during a period of receiving the y3 position signal and y4 position signal from the direction detecting sensor 90, the converting circuit 70 sequentially adds an increment of 1 to the "number of detection" corresponding to the moving direction "right" in the tally table T2 as a determination result (cf. FIG. 17).

At step S6 subsequent to step S5, the converting circuit 70 determines whether the operation of the input key 10*a* pushed was released. Supposing that a finger leaves the input key 10*a* to input none of the y1 position signal to y6 position signal from the direction detecting sensor 90 corresponding to the input key 10*a* into the converting circuit 70, the converting circuit 70 determines that the push operation of the input key 10*a* was released, and it makes a determination of YES and thereafter moves to step S7.

At step S7, the converting circuit 70 compares the values after the addition to the "number of detection" in the tally table T2 (cf. FIG. 17) and determines a "moving direction" indicating a maximum "number of detection", as the moving direction of the key top 50 (upper electrode 20). For example, supposing in the tally table T2 shown in FIG. 17, the number of detection in the moving direction "center" is "70" and the number of detection in the moving direction "right" is "80", the converting circuit 70 determines "right" as the moving direction of the key top 50 (upper electrode 20).

At subsequent step S8, the converting circuit 70 selects an input symbol assigned to the input key 10*a*, for example, with reference to the symbol conversion table T3 shown in FIG. 15, in accordance with the moving direction determined at step S7. For example, the converting circuit 70 selects the symbol of "い" corresponding to the moving direction of "right" determined at step S7. Then the converting circuit 70 displays the selected symbol of "い" on the liquid crystal display 280 of the cell phone 300 shown in FIG. 1 (S9).

With the input keys and input apparatus of the first embodiment, as described above, for example, when the key top 50 of the input key 10*a* is compositely moved in the normal push direction P and in the right direction, the symbol of "い" is selectively inputted out of the symbols of "あ" to "お" in the "あ line group". Similarly, when the key top 50 is compositely moved in the normal push direction P and in the up direction, the symbol of "あ" can be selectively inputted. When the key top 50 is compositely moved in the push direction P and in the down direction, the symbol of "う" can be selectively inputted. When the key top 50 is compositely moved in the push direction P and in the left direction, the symbol of "え" can be selectively inputted. When the key top 50 is moved in the normal push direction P, the symbol of "お" can be selectively inputted.

Namely, by the input keys and input apparatus of the first embodiment, it becomes feasible to selectively input a plurality of symbols such as those in the "あ line group", the "か line group", or the "さ line group" assigned to each input key 10*a*-10*l*, by the simple input operation of moving the key top 50 of each input key 10*a*-10*l* in the normal push direction P or compositely moving the key top 50 in the up, down, left, or right direction in addition to the push direction P.

Incidentally, the above embodiment showed the input example of the Japanese hiragana writing symbols with FIG. 1, and in practice Japanese input requires input of several types of symbols including the katakana writing symbols, numerals, and alphabet, in addition to the hiragana writing symbols. In connection therewith, the following will describe an example of input of several types of symbols, using an extra key (hereinafter referred to as a "symbol type designation key") provided for designating a type of a symbol to be inputted.

Figure 49:
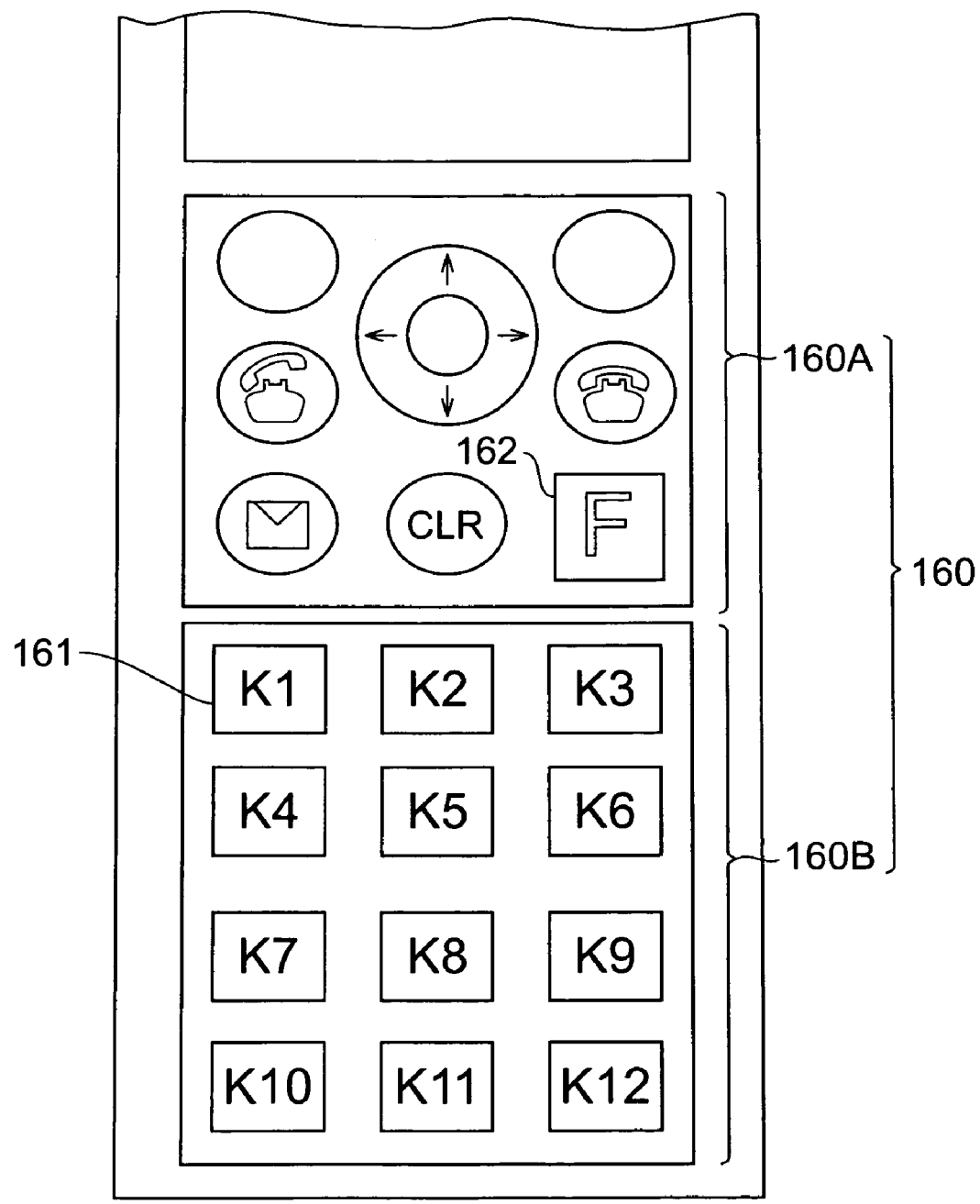
FIG. 49 is a configuration diagram of an input part of a cell phone in an example of inputting plural types of symbols.

For example, as shown in FIG. 49, an input portion 160 of a cell phone is composed of a special key arrangement part 160A and a symbol input key arrangement part 160B, wherein the symbol input key arrangement part 160B includes twelve (three horizontal×four vertical) keys 161 and wherein the special key arrangement part 160A includes a symbol type designation key (hereinafter abbreviated as an "F key") 162.

Figure 50:
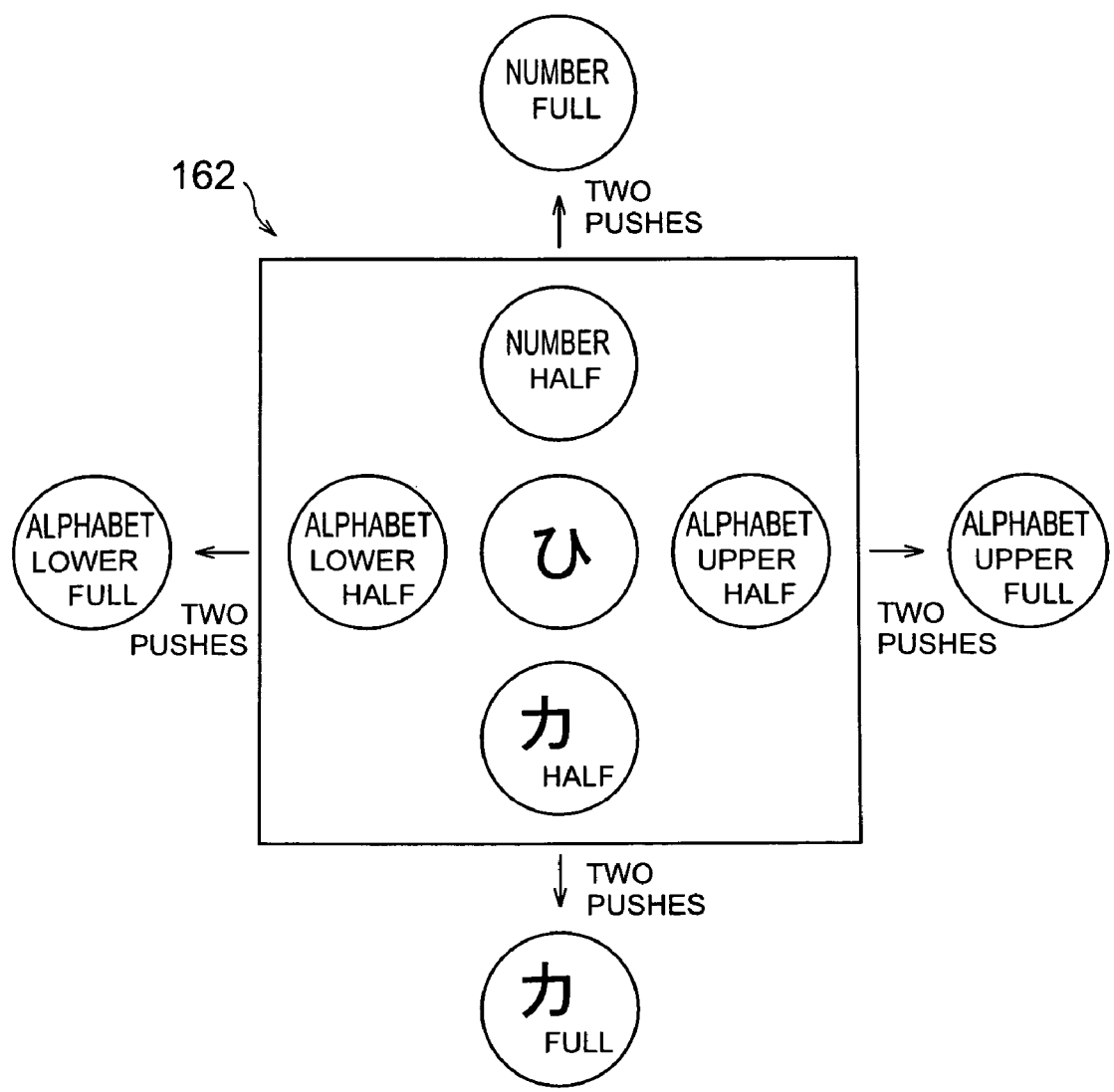
FIG. 50 is an illustration for explaining designation of symbol types assigned to the F key.

As shown in FIG. 50, the F key 162 is assigned symbol type designations for respective moving directions as follows. The F key 162 is so arranged that symbol types tending to be frequently inputted can be designated by one operation (a movement of a finger), for example, center (still)-hiragana writing symbols, upward-half-width (one byte) numbers, leftward-half-width English lower-case symbols, downward-half-width katakana writing symbols, and rightward-half-width English upper-case symbols. The F key 162 is so configured that the symbol types other than the above can be designated by two operations.

Namely, as shown in the space outside the frame of the F key 162 in FIG. 50, the symbol type of full-width (two bytes) numbers can be designated by two continuous upward movements of a finger, and the symbol type of full-width English lower-case symbols by two continuous leftward movements of a finger. The symbol type of full-width katakana writing symbols can be designated by two continuous downward movements of a finger, and the symbol type of full-width English upper-case symbols by two continuous rightward movements of a finger. In this manner two continuous movements of a finger in a specific direction enable designation of a symbol type different from that designated by only one movement of a finger in that specific direction, thus providing expandability about designation of symbol types.

The symbol assignment to the twelve keys 161 in the symbol input key arrangement part 160B is, for example in the case of the hiragana writing symbols, that as shown in FIG. 51. Since the hiragana writing symbols can be classified under the symbol groups each consisting of five symbols like "five symbols in the あline group", "five symbols in the かline group" . . . , as described previously, one symbol group (five symbols) can be assigned to one key 161. As shown in the table format of FIG. 51, the key K1 is assigned the "five symbols (あ, い, う, え, お) in the あline group", and the key K2 the "five symbols (か, き, く, け, こ) in the かline group". In this manner, one symbol group (five symbols) can be assigned to one key 161.

As shown in the assignment to the keys K10, K11 in the table of FIG. 51, frequently input marks (cho-on (long sound), kuten (Japanese period), touten (Japanese comma), etc.) other than the hiragana writing symbols can also be assigned.

Furthermore, the special symbols among the hiragana writing symbols include an example of display of symbols in size smaller than usual (e.g., "ゃ", "っ", etc.), an example of display of voiced consonants (e.g., "が", "ざ", etc.), and an example of display of p-sounds (e.g., "ぱ", "ぴ", etc.). In addition, the hiragana writing symbols are often converted into katakana small symbols or katakana large symbols. Therefore, as shown in the assignment to the key K12 in the table of FIG. 51, it is also possible to assign the above-described functions of "conversion to small symbol", "conversion to voiced consonant", "conversion to p-sound", "conversion to katakana small symbol", and "conversion to katakana large symbol".

The above described the key assignment about the input of the Japanese hiragana writing symbols, but the present invention, which facilitates the input operation by assigning a plurality of symbols, marks, or functions to one key as shown in FIG. 51 and decreasing the number of key input operations, can also be applied to input of symbols in the other languages. Examples of application of the present invention to input of English, German, French, Chinese, and Korean symbols will be described below.

Figure 53:
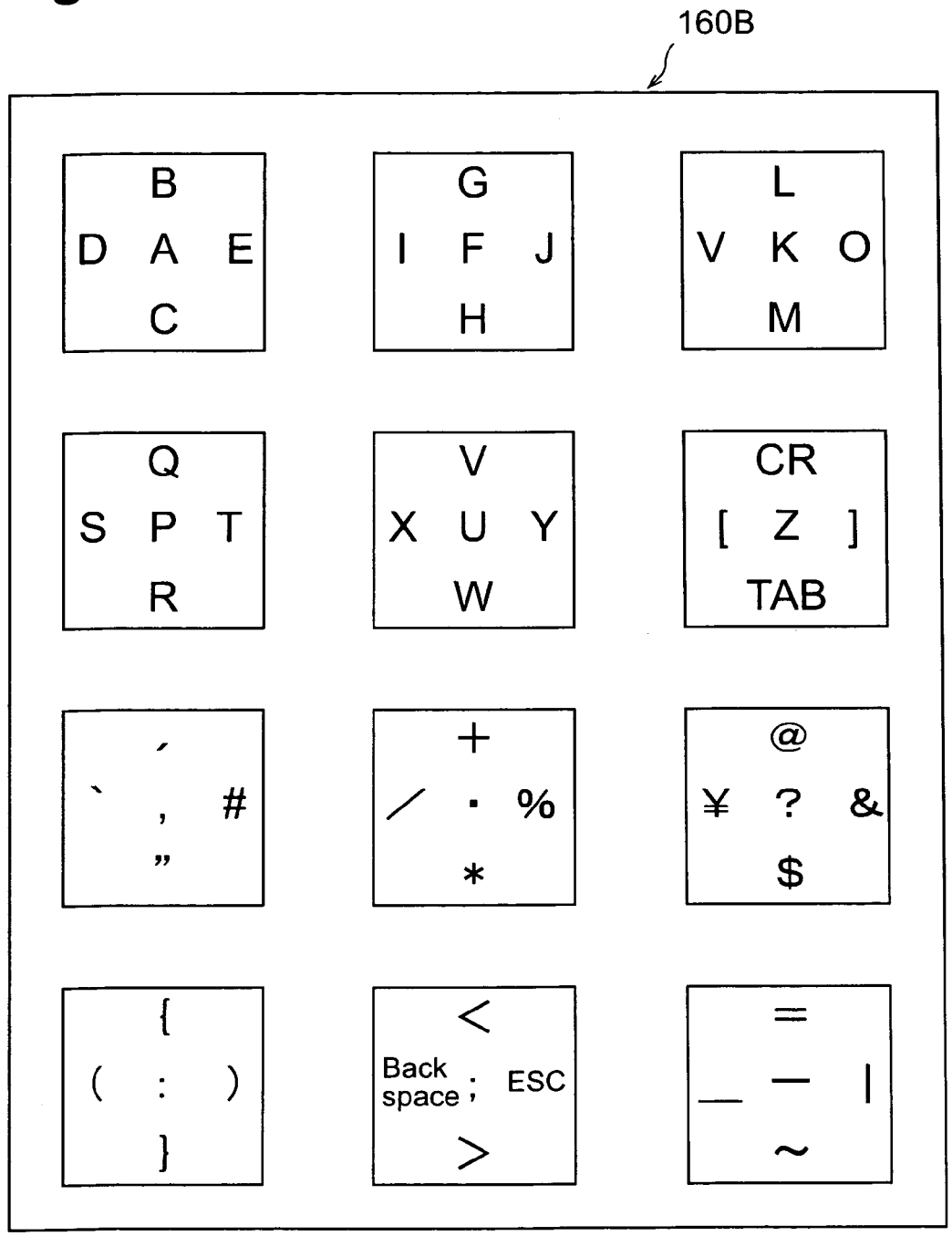
FIG. 53 is an illustration showing a state of assignment of alphabet and marks to each key on the basis of the assignment table of FIG. 52.

First, an example of application of the present invention to input of English symbols will be described. The English symbols (alphabet) include twenty six symbols in total, and are not grouped into symbol groups each consisting of five symbols, different from the Japanese hiragana writing symbols. Thus a conceivable method is to assign five symbols to each key in order from the top of the alphabet (A, B, C, . . . ), as shown in FIG. 52. In that case, the keys K1-K6 are enough to assign all the twenty six symbols, and many keys are still left. Therefore, many marks (e.g., return (CR), tab (TAB), . . . ) can be assigned to the remaining keys. The assignment table of FIG. 52 shows the assignment of the alphabet and marks to the keys (K1-K12), and FIG. 53 shows an example of actual assignment to each of the keys (K1-K12) in the symbol input key arrangement part 160B (cf. FIG. 49), based on the assignment table.

This enables one to input the symbol types equivalent to those through the full keyboard by one operation (a movement of a finger). Namely, the function equivalent to that of the full keyboard can be substantialized by the smaller number of input keys, and the input of symbols can be implemented by the reduced number of input operations, thus dramatically improving the efficiency of input operation.

A switchover among four symbol types of half-width English lower-case symbols, full-width English lower-case symbols, half-width English upper-case symbols, and full-width English upper-case symbols can be implemented by manipulating the F key 162 in FIG. 49. FIG. 50 shows the F key 162 in Japanese, and, since the English does not include the hiragana and katakana writing symbols, all the four symbol types can be assigned to the four directions of the F key 162 in FIG. 49, whereby one can designate a desired English symbol type by one operation on the F key 162.

The assignment of the alphabet and marks to each of the keys (K1-K12) in FIG. 52 can also be applied to input of English symbols in Japanese.

Next, an example of application of the present invention to input of the German symbols will be described. For input of the German symbols, it is necessary to input peculiar symbols such as symbols with the Umlaut mark (e.g., Ä, Ö, Ü, etc.) and β (Eszett), in addition to the input of the same alphabet as in English.

Thus the peculiar symbols as described above can replace the mark-assigned portions in the assignment table of FIG. 52, whereby the input of the symbol types equivalent to those through the full keyboard can be implemented by one operation (a movement of a finger). Namely, the function equivalent to that of the full keyboard can be substantialized by the smaller number of input keys, and the input of symbols can be implemented by the reduced number of input operations, thus dramatically improving the efficiency of input operation.

Next, an example of application of the present invention to input of the French symbols will be described. In order to input the French symbols, it is necessary to input the peculiar symbols as described below, in addition to the input of the same alphabet as in English. Namely, the peculiar symbols are é (accent aigu), à, è, ù (accent grave), â, î, û, ê, ô (accent circonflexe), ï, ü, ë (tréma), ç (cédille), œ (o e composé), and so on.

Thus the peculiar symbols as described above can replace the mark-assigned portions in the assignment table of FIG. 52, whereby the input of the symbol types equivalent to those through the full keyboard can be implemented by one operation (a movement of a finger), as in the case of the English input. Namely, the function equivalent to that of the full keyboard can be substantialized by the smaller number of input keys, and the symbol input can be implemented by the reduced number of input operations, thus dramatically improving the efficiency of input operation.

Next, an example of application of the present invention to input of the Chinese symbols will be described. A common Chinese symbol input method is the pin-yin input system of inputting an alphabet sequence (pin-yin) equivalent to the reading (pronunciation) of a symbol as an input object. This pin-yin input system is classified under two input methods of complete pin input and bi-pin input.

The complete pin input uses the English keyboard as it is, and pin-yin is inputted in each symbol unit according to the alphabetical notation on the keyboard. For example, where Chinese "今天晴" corresponding to "今日は晴れです(sunny today)" is inputted, an alphabet sequence "JIN" corresponding to the reading (pronunciation) of "今", an alphabet sequence "TIAN" corresponding to the reading (pronunciation) of "天", and an alphabet sequence "QING" corresponding to the reading (pronunciation) of "晴" are inputted in order according to the alphabet notation on the English keyboard. Therefore, the key assignment as shown in FIG. 52 and FIG. 53 can be adopted for the complete pin input, as in the case of the aforementioned example of application of the present invention to the English symbol input, and it becomes feasible to input the symbol types equivalent to those through the full keyboard by one operation (a movement of a finger), thus dramatically improving the efficiency of symbol input operation.

On the other hand, the bi-pin input is a way of inputting each symbol by separate use of Chinese 声母(head consonant) and 韻母(subsequent vowel component). Here the "声母" means a consonant at the head of a syllable, and "韻母" means a portion except for the head consonant in the syllable, the "韻母" always containing a vowel. In the bi-pin input, symbols are inputted by switching in an order of 声母 (consonant) → 韻母 (vowel component) →声母 (consonant) →韻母 (vowel component). Namely, this input method involves a device of reducing the number of typing operations on the keyboard by the separate use of 声母and 韻母, and, once one learns the keyboard arrangement of the bi-pin input, he or she can input symbols by the smaller number of input operations than by the aforementioned complete pin input, so as to realize efficient symbol input.

The bi-pin input of this type requires two key assignments, 声母(head consonant) key assignment for input of 声母and 韻母(subsequent vowel component) key assignment for input of 韻母. The present invention can be applied to these 声母key assignment and 韻母key assignment. For example, FIG. 54(a) shows an example of the 声母key assignment. The key K1 is assigned five 声母(consonants) (b, c, ch, f, g), and which consonant was inputted can be determined by a moving direction of a finger on the key K1. The keys K2-K5 can also be assigned consonants in similar fashion. FIG. 54(b) shows an example of the 韻母key assignment. The key K1 is assigned five 韻母(vowel components) (a, ai, an, ang, ao), and which vowel component was inputted can be determined by a moving direction of a finger on the key K1. The keys K2-K7 can also be assigned vowel components in similar fashion.

In the bi-pin input, symbols are inputted by switching in the order of consonant → vowel component → consonant → vowel component as described above, and the key assignment is arranged to become the consonant key assignment of FIG. 54(a) upon input of a consonant and to become the vowel component key assignment of FIG. 54(b) upon input of a vowel component.

In the bi-pin input, as described above, the consonant and vowel component key assignments as shown in FIGS. 54(a) and 54(b) enable one to input the symbol types equivalent to those through the full keyboard by one operation (a movement of a finger). Namely, the function equivalent to that of the full keyboard can be substantialized by the smaller number of input keys, and the symbol input can be implemented by the reduced number of input operations, thereby dramatically improving the efficiency of input operation.

In the Chinese input, the marks (e.g., !, ?, etc.) other than the symbols are also often inputted. It is thus desirable to assign the various types of marks to the remaining portions in the key assignments of FIGS. 54(a) and 54(b), just as in the case of the assignment example of the English symbols in FIG. 52, thereby achieving efficient input as to input of marks as well.

Lastly, an example of application of the present invention to input of the Korean symbols will be described. Each Korean symbol (hangul symbol) is composed of a combination of a consonant with a vowel. Therefore, for symbol input, it is necessary to input a consonant-indicating part and a vowel-indicating part for each symbol. There are nineteen consonants and twenty one vowels, and forty portions indicating the total of these forty sounds are assigned to keys. An example of this assignment is presented in FIG. 55. In FIG. 55, portions surrounded by thick line 163 represent the nineteen portions indicating the consonants, and the other twenty one portions correspond to the portions indicating the vowels.

Since the keys can be assigned the forty portions indicating the respective sounds, the forty sounds in total including the nineteen consonants and twenty one vowels, as described above, it becomes feasible to input the symbol types equivalent to those through the full keyboard by one operation (a movement of a finger). Namely, the function equivalent to that of the full keyboard can be substantialized by the smaller number of input keys, and the symbol input can be implemented by the reduced number of input operations, thereby dramatically improving the efficiency of input operation.

In the Korean input, the marks (e.g., !, ?, etc.) other than the symbols are also often inputted.

It is thus desirable to assign the various types of marks to the remaining keys (keys K9-K12) in the key assignment of FIG. 55, just as in the case of the assignment example of the English symbols in FIG. 52, thereby achieving efficient input as to the input of marks as well.

As described above, the present invention is applicable to input of symbols in various languages, and achieves the excellent effects of substantializing the function equivalent to that of the full keyboard by the smaller number of input keys and enabling the symbol input by the reduced number of input operations, thereby dramatically improving the efficiency of input operation.

Second Embodiment

The input keys and input apparatus according to the second embodiment are characterized in that the contents of the direction determination table T1 (cf.

FIG. 13) described in the first embodiment are changed into those as in a direction determination table T4 shown in FIG. 18 and in that in conjunction therewith the contents of the tally table T2 (cf. FIG. 14) are changed into those as in a tally table T5 shown in FIG. 19, and the other portions are almost similar to those in the first embodiment. In the description of the second embodiment, therefore, the components almost similar to those in the first embodiment will be denoted by the same reference symbols as in the first embodiment, without detailed description thereof.

In the direction determination table T4 in the second embodiment, as shown in FIG. 18, "moving direction" and its "direction intensity" of key top 50 (upper electrode 20) are recorded corresponding to the position (xl,yj) (i=1-6, j=1-6) of each conducting piece 34 brought into the conducting state upon contact with the upper electrode 20 (not shown). Here the "direction intensity" has much the same meaning as the "number of detection" in the tally table T2 shown in FIG. 14, and is a so-called weight factor for expressing the "moving direction" more definitely.

In the direction determination table T4 shown in FIG. 18, "center:2" is recorded as "moving direction:direction intensity" corresponding to the positions (x3,y3), (x3,y4), (x4,y3), and (x4,y4) of the conducting pieces 34 brought into the conducting state in the central part of the lower electrode 30.

In addition, for the conducting pieces 34 brought into the conducting state near the periphery of the central part of the lower electrode 30, "left:1" is recorded as "moving direction:direction intensity" corresponding to the left positions (x2,y3) and (x2,y4), "right:1" as "moving direction:direction intensity" corresponding to the right positions (x5,y3) and (x5,y4), "up:1" as "moving direction:direction intensity" corresponding to the up positions (x3,y5) and (x4,y5), and "down:1" as "moving direction:direction intensity" corresponding to the down positions (x3,y2) and (x4,y2).

Furthermore, for the conducting pieces 34 brought into the conducting state near the periphery of the central part of the lower electrode 30, "left:1" and "up:1" are recorded as "moving direction:direction intensity" corresponding to the upper left position (x2,y5), "left:1" and "down:1" as "moving direction:direction intensity" corresponding to the lower left position (x2,y2), "right:1" and "up:1" as "moving direction:direction intensity" corresponding to the upper right position (x5,y5), and "right:1" and "down:1" as "moving direction:direction intensity" corresponding to the lower right position (x5,y2).

For the conducting pieces 34 brought into the conducting state in the peripheral part of the lower electrode 30, "left:2" is recorded as "moving direction:direction intensity" corresponding to the left positions (x1,y3) and (x1,y4), "right:2" as "moving direction:direction intensity" corresponding to the right positions (x6,y3) and (x6,y4), "up:2" as "moving direction:direction intensity" corresponding to the up positions (x3,y6) and (x4,y6), and "down:2" as "moving direction:direction intensity" corresponding to the down positions (x3,y1) and (x4,y1).

Furthermore, for the conducting pieces 34 brought into the conducting state in the peripheral part of the lower electrode 30, "left:2" and "up:2" are recorded as "moving direction:direction intensity" corresponding to the upper left position (x1,y6), "left:2" and "up:1" as "moving direction:direction intensity" corresponding to the upper left position (x1,y5), and "left:1" and "up:2" as "moving direction:direction intensity" corresponding to the upper left position (x2,y6).

For the conducting pieces 34 brought into the conducting state in the peripheral part of the lower electrode 30, "left:2" and "down:2" are recorded as "moving direction:direction intensity" corresponding to the lower left position (x1,y1), "left:2" and "down:1" as "moving direction:direction intensity" corresponding to the upper left position (x1,y2), and "left:1" and "down:2" as "moving direction:direction intensity" corresponding to the upper left position (x2,y1).

Furthermore, for the conducting pieces 34 brought into the conducting state in the peripheral part of the lower electrode 30, "right:2" and "up:2" are recorded as "moving direction:direction intensity" corresponding to the upper right position (x6,y6), "right:2" and "up:1" as "moving direction:direction intensity" corresponding to the upper right position (x6,y5), and "right:1" and "up:2" as "moving direction:direction intensity" corresponding to the upper left position (x5,y6).

For the conducting pieces 34 brought into the conducting state in the peripheral part of the lower electrode 30, "right:2" and "down:2" are recorded as "moving direction:direction intensity" corresponding to the upper right position (x6,y1), "right:2" and "down:1" as "moving direction:direction intensity" corresponding to the upper left position (x6,y2), and "right:1" and "down:2" as "moving direction:direction intensity" corresponding to the upper left position (x5,y1).

In the second embodiment, as in the first embodiment, the text selecting means 40 also selectively inputs one of the symbols of "あ" to "ん" assigned to the input keys 10*a*-10*l*, along the processing procedure of the flowchart shown in FIG. 16.

The second embodiment is different in the processes of steps S4-S5, and S7 in the flowchart shown in FIG. 16 from the first embodiment.

In the second embodiment, where the key top 50 is first pushed in the normal push direction P and thereafter pushed in the "right" direction in order to select the symbol of "い" assigned to the input key 10*a*, the converting circuit 70 first determines at step S4 that the "moving direction:direction intensity" of the key top 50 (upper electrode 20) is "center:2", with reference to the direction determination table T4 shown in FIG. 18. At next step S5, during a period of receiving the y3 position signal and y4 position signal from the direction detecting sensor 90, the converting circuit 70 sequentially adds an increment of "2" to the "direction intensity" corresponding to the moving direction "center" in the tally table T5 as a determination result.

At step S4 after step S6, the converting circuit 70 determines that the "moving direction:direction intensity" of the key top 50 (upper electrode 20) is "right:2", with reference to the direction determination table T4 shown in FIG. 18. At next step S5, during a period of receiving the y3 position signal and y4 position signal from the direction detecting sensor 90, the converting circuit 70 sequentially adds an increment of "2" to the "direction intensity" corresponding to the moving direction "right" in the tally table T5 as a determination result.

At step S7, the converting circuit 70 compares values resulting from the addition to the "direction intensity" in the tally table T5 (cf. FIG. 20) to determine a "moving direction" indicating a maximum "direction intensity", as the moving direction of the key top 50 (upper electrode 20). For example, supposing in the tally table T5 shown in FIG. 20, the direction intensity of the moving direction "center" is "60" and the direction intensity of the moving direction "right" is "90", the converting circuit 70 determines "right" as the moving direction of the key top 50 (upper electrode 20).

In the first embodiment the difference between the "numbers of detection" in the comparison by the converting circuit 70 with reference to the tally table T2 (cf. FIG. 17) in the process of step S7 is (80-70=10), whereas in the second embodiment the difference between the "direction intensities" in the comparison by the converting circuit 70 with reference to the tally table T5 (cf. FIG. 20) in the process of step S7 is (90−60=30), which is larger than in the case of the first embodiment. For this reason, the second embodiment can determine more definitely that the moving direction of the key top 50 (upper electrode 20) is "right".

Third Embodiment

The input keys and input apparatus according to the third embodiment are configured so as to permit the user to arbitrarily rewrite a symbol registered in the symbol conversion table T3 (cf. FIG. 15) described in the first embodiment, and the other portions are much the same as those in the first embodiment. In the description of the third embodiment, therefore, the components almost similar to those in the first embodiment will be denoted by the same reference symbols as in the first embodiment, without detailed description thereof.

In the third embodiment, in order to make a transition into a setting mode for the user to arbitrarily rewrite a symbol registered in the symbol conversion table T3 (cf. FIG. 15), the input key 10*j* shown in FIG. 2 is provided with a function of a setting button, and a word of "setting" is indicated above the symbol of "わ" in the central region on the surface of the key top of the input key 10*j*.

In the symbol conversion table T6 corresponding to the input key 10*j* shown in FIG. 21, a symbol string of "transition into setting mode" is recorded corresponding to the moving direction "up" of the key top 50 (upper electrode 20) so that when the key top 50 of the input key 10*j* is compositely moved in the normal push direction P and in the "up" direction, for example, the symbol string of "transition into setting mode" is selected instead of the selection of the symbol of "わ" and displayed on the liquid crystal display 280 shown in FIG. 1. The symbol of "わ" is recorded in each of "center", "right", "left", and "down" except for the moving direction "up" in the symbol conversion table T6.

Figure 22:
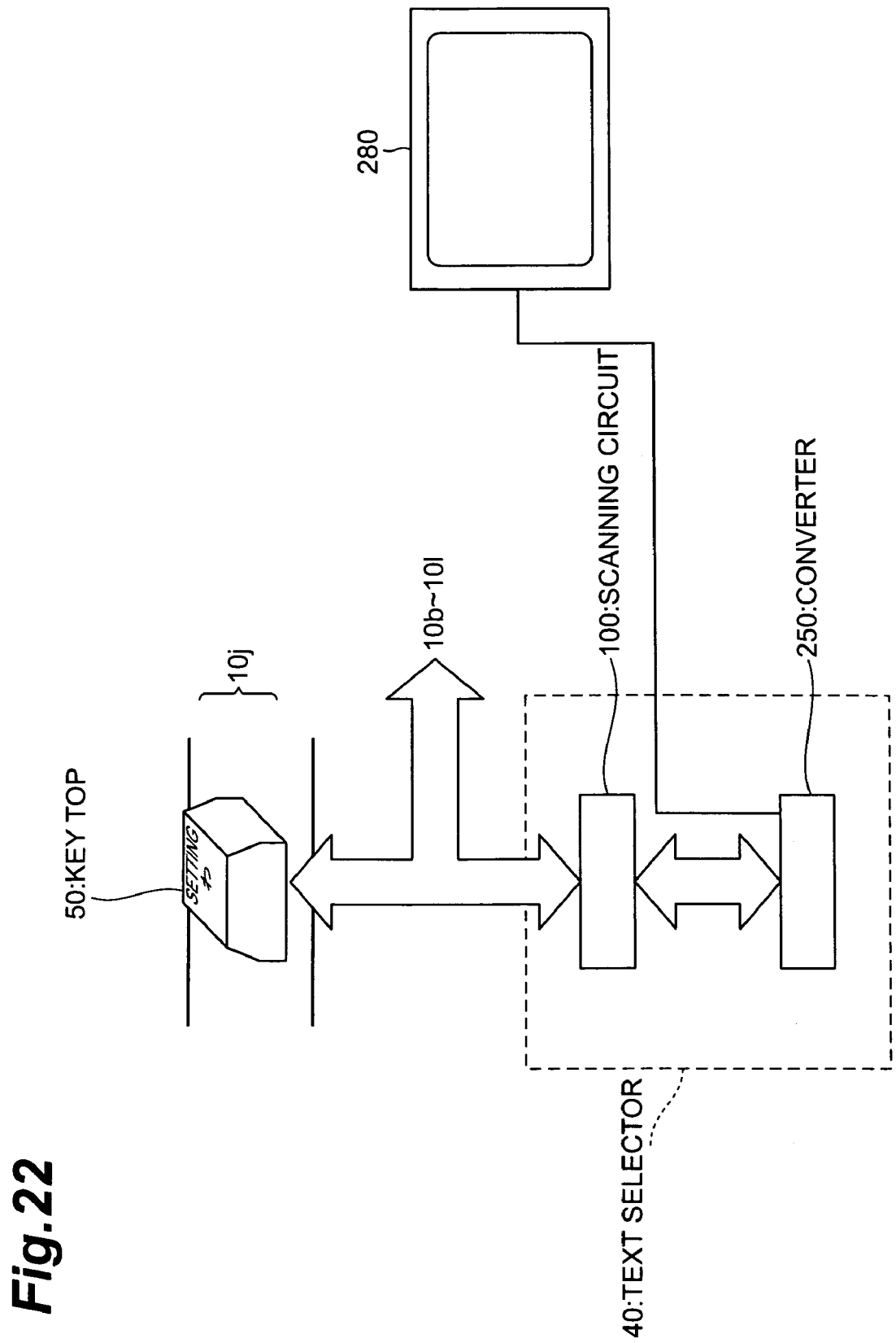
FIG. 22 is a functional block diagram of the keyboard input apparatus in the third embodiment corresponding to FIG. 4.
Figure 23:
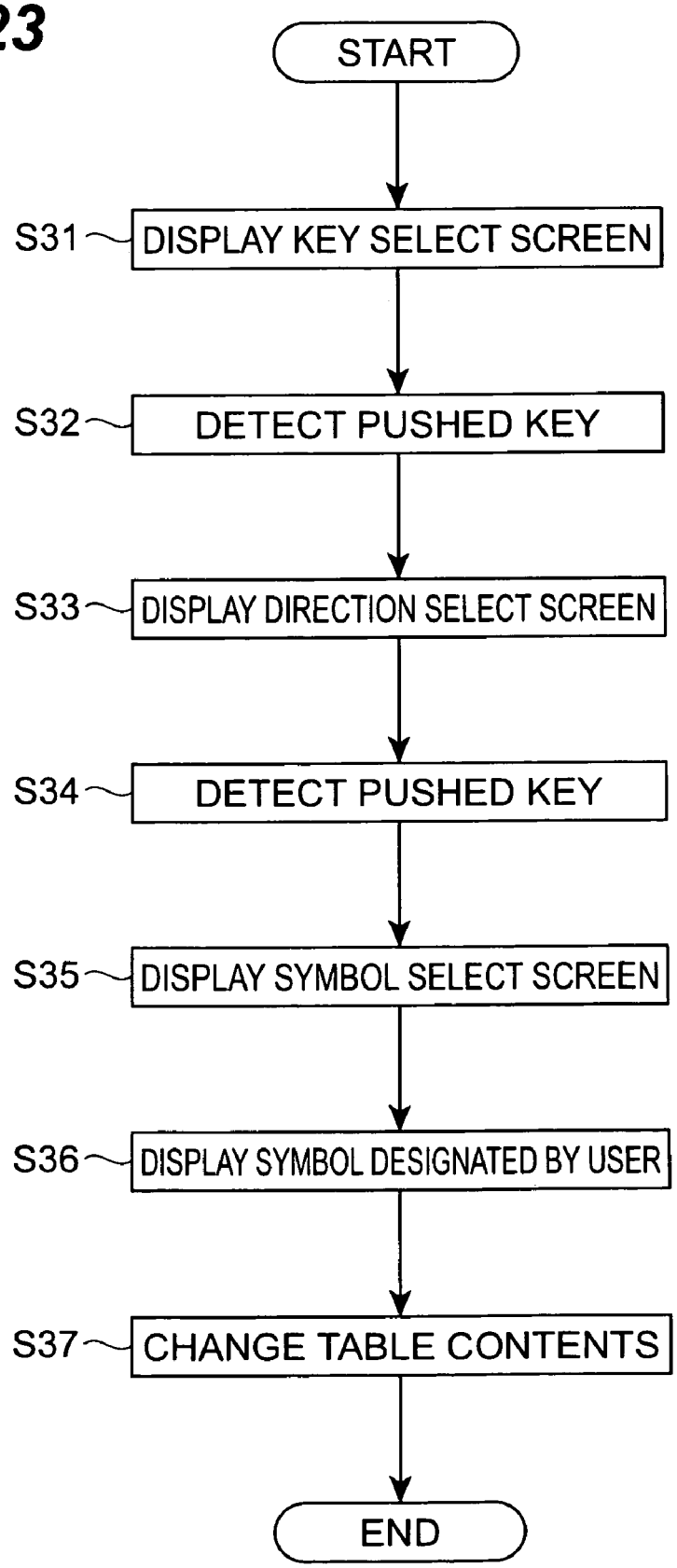
FIG. 23 is a flowchart showing the processing procedure in the third embodiment.

As shown in FIG. 22, the converting circuit 250 of the text selecting means 40 to which the input key 10*j* is connected, is connected to the liquid crystal display 280, in order to smoothly execute the process of the setting mode in which the user is allowed to arbitrarily rewrite a symbol registered in the symbol conversion table T3 (cf. FIG. 15). Then this converting circuit 250 determines that the moving direction of the key top 50 (upper electrode 20) of the input key 10*j* is "up", thereafter selects the symbol string of "transition into setting mode" with reference to the symbol conversion table T6 (cf. FIG. 21), and then carries out the process of the setting mode along the processing procedure of the flowchart shown in FIG. 23.

Figure 24:
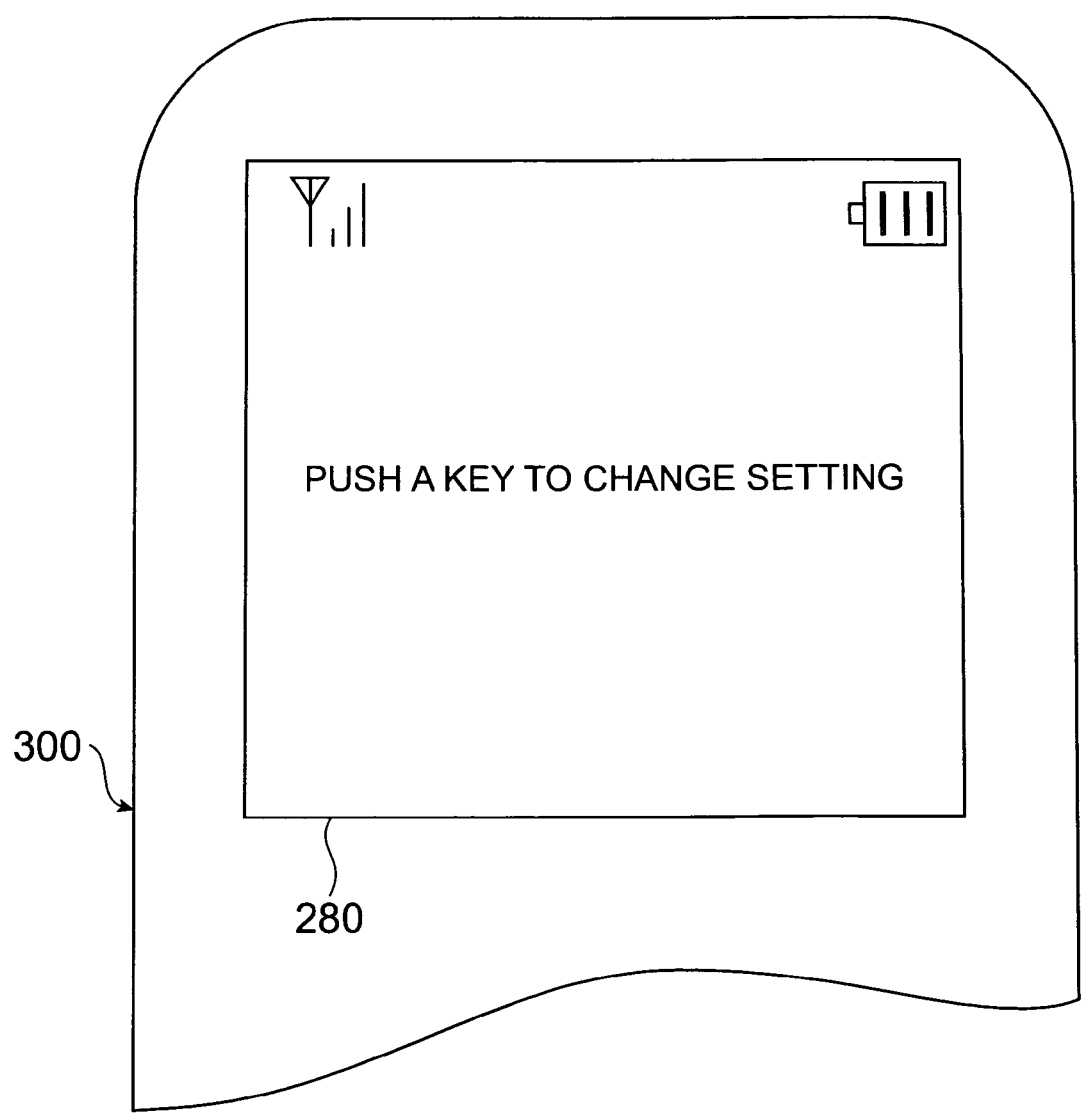
FIG. 24 is a schematic diagram of a key select screen displayed on a liquid crystal display in the third embodiment.

At first step S31, in order to urge the user to select an input key as a rewritten object in the symbol conversion table T3 out of the input keys 10*a*-10*l*, a message, for example, "Push an input key to change setting" is displayed on the liquid crystal display 280, as shown in FIG. 24. This display will be called a key select screen.

Suppose in accordance with the message of the key select screen the user pushes, for example, the input key 10*k* as an input key to change the setting out of the input keys 10*a*-10*l*. At subsequent step S32 the converting circuit 250 then detects the push on the input key 10*k*.

Figure 25:
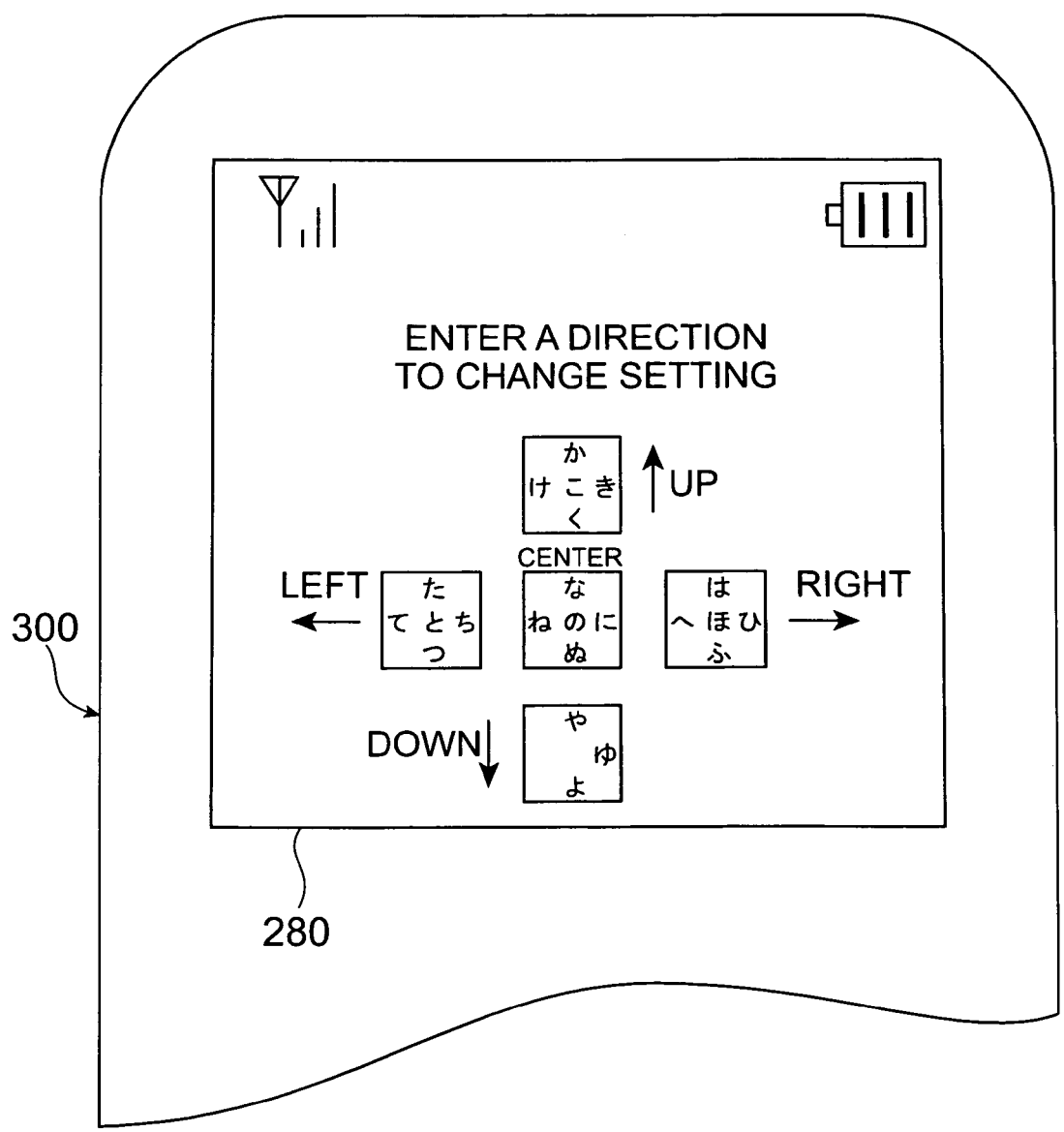
FIG. 25 is a schematic diagram of a direction select screen displayed on the liquid crystal display in the third embodiment.

At next step S33, in order to urge the user to input a moving direction corresponding to the symbol as a rewritten object in the symbol conversion table T3, i.e., a moving direction of the key top 50 to which the symbol as a rewritten object is assigned, a message, for example, "Enter a direction to change setting" is displayed on the liquid crystal display 280, as shown in FIG. 25. This display will be called a direction select screen.

In the case where the cell phone 300 is provided with a cross key to indicate the four directions of up, down, left, and right, it is preferable to make the user push the cross key to enter a direction to change the setting. However, if the cell phone 300 is not provided with such a cross key, the input keys 10*d*, 10*f*, 10*b*, and 10*h* located in crossed arrangement around the input key 10*e* are assumed to be a virtual cross key, and the user is made to push one of the input keys.

For this purpose, at step S33, as shown in FIG. 25, indications of the key tops 50 of the input keys 10*d*, 10*f*, 10*b*, and 10*h* located in the crossed arrangement around the input key 10*e*, the symbols of up, down, left, and right, and arrows are displayed along with the message of "Enter a direction to change setting" on the liquid crystal display 280.

Suppose in accordance with the display of the direction select screen the user pushes, for example, the input key 10*b* indicating the up direction, as an input key corresponding to the direction to change the setting, out of the input keys 10*d*, 10*f*, 10*b*, and 10*h*. At subsequent step S34 the converting circuit 250 then detects the push on the input key 10*b* indicating the up direction.

At next step S35, in order to urge the user to enter a new symbol to be set at the moving position of the up direction of the input key 10*k* to which the symbol to change the setting is assigned, the converting circuit 250 displays a message of "Enter a symbol to be newly set" on the liquid crystal display 280. This display will be called a symbol input screen.

Suppose in accordance with the display of the symbol input screen the user enters a symbol assigned to one input key out of the input keys 10*a*-10*l*, as a "symbol to be newly set" by a moving operation of the key top 50 of the input key. At subsequent step S36 the converting circuit 250 then displays the "symbol to be newly set" entered by the user, on the liquid crystal display 280.

At next step S37, the symbol of "き" registered corresponding to the moving direction "up" in the symbol conversion table T3 corresponding to the input key 10*k*, for example, as the "symbol to change setting" is rewritten to the "symbol to be newly set". For example, supposing the user entered "@" as the "symbol to be newly set", the symbol of "き" registered corresponding to the moving direction "up" in the symbol conversion table T3 corresponding to the input key 10*k* is rewritten to "@".

In consequence, if the key top 50 of the input key 10*k* thereafter is compositely moved in the normal push direction P and in the "up" direction, "@" will be selectively inputted. The "symbol to be newly set" may be a combination of marks such as "(^^);".

By the third embodiment, the "symbol to change setting" can be readily rewritten to the "symbol to be newly set" according to user's preference, which improves user's operability in input of text information such as symbols.

Fourth Embodiment

The input keys and input apparatus according to the fourth embodiment are configured to automatically rewrite the symbols registered in the symbol conversion table T3 (cf. FIG. 15) described in the first embodiment, according to input frequencies, and the other portions are much the same as in the first embodiment and the third embodiment. In the description of the fourth embodiment, therefore, the components almost similar to those in the first embodiment and the third embodiment will be denoted by the same reference symbols, without detailed description thereof.

In the fourth embodiment, the symbols registered in the symbol conversion table T3 (cf. FIG. 15) are automatically rewritten to make input of a symbol with a high input frequency easier. First, in order to modify the assignment of a moving direction of the key top 50 for input of a symbol with a high input frequency out of a plurality of symbols assigned to the same input key, to a moving direction easier to be pushed, the symbols registered in the symbol conversion table T3 (cf. FIG. 15) corresponding to the input key are rewritten. Second, in order to assign a symbol with a high input frequency out of a plurality of symbols assigned to different input keys, to an input key easier to be pushed, the symbols registered in the symbol conversion tables T3 (cf. FIG. 15) corresponding to the associated input keys are rewritten.

Figure 26:
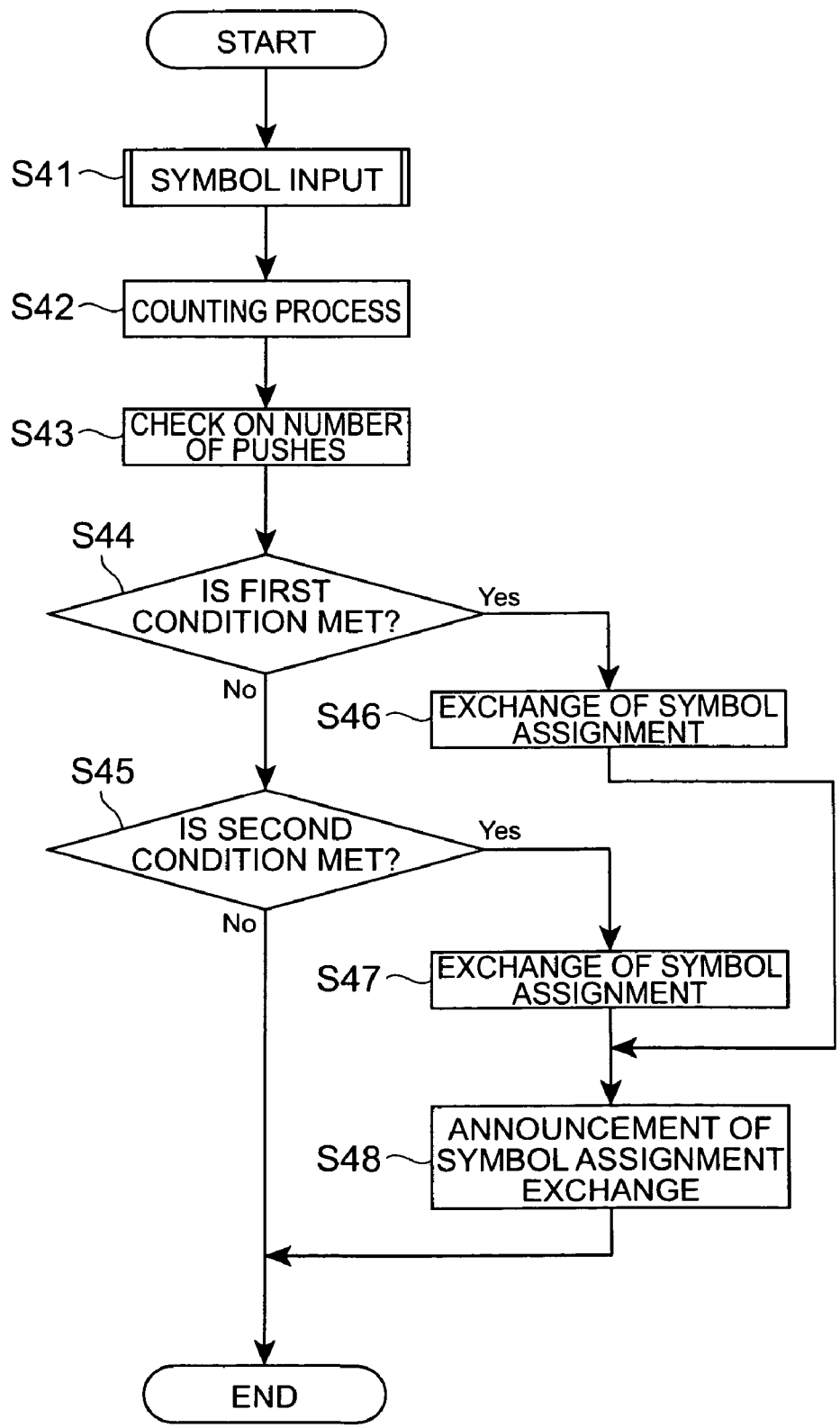
FIG. 26 is a flowchart showing the processing procedure in the fourth embodiment.

In the fourth embodiment a process of automatically rewriting the symbols registered in the symbol conversion table T3 (cf. FIG. 15) in order to achieve easier input of a symbol with a high input frequency is executed along the processing procedure of the flowchart shown in FIG. 26. At first step S41, when the user of the cell phone 300 pushes the key top 50 of the input key 10a-10l in an arbitrary moving direction, the converting circuit 250 selects and inputs an appropriate symbol according to the moving direction.

At subsequent step S42, by tallying moving directions of the key top 50 of each input key 10a-10l within a predetermined period in the tally table T7 shown in FIG. 27, the converting circuit 250 tallies input frequencies of symbols inputted during the predetermined period. The converting circuit 250 tallies the input frequencies of the input symbols in the tally table T7 during the predetermined period of one hour to several days, for example.

The tally table T7 shown in FIG. 27 is one constructed in a RAM (Random Access Memory) provided in the converting circuit 250, and input counts are tallied for the respective input symbols corresponding to the moving directions of the key top 50 of each input key 10a-10l. In the case of the input key 10l, the symbol of "ん" is assigned to all the moving directions of the key top 50; therefore, in the tally table T7 the number of operations to input "ん" by moving the central part of the key top 50 in the normal push direction P is extremely large, for example, 250.

At step S43 subsequent to step S42, the converting circuit 250 checks the input counts tallied in the tally table T7. Then, based on this check result, it is determined at next step S44 whether the first condition described below is met.

The first condition is as follows: determined for one identical input key out of the input keys 10a-10l are a moving direction of the key top 50 to which a symbol with a largest input count is assigned, and a moving direction of the key top 50 to which a symbol with a smallest input count is assigned, and the input counts in these two moving directions are two or more times different; and the moving direction of the key top 50 to which the symbol with the largest input count is assigned is not a "direction easier to be pushed" than the moving direction of the key top 50 to which the symbol with the smallest input count is assigned, i.e., is a "direction harder to be pushed".

In order to determine whether a moving direction is one easier or harder for a push operation on the key top 50, the following criteria are preliminarily set for vertically long cell phone 300. Namely, the preset criteria are as follows: the moving direction "center" is the easiest to be operated, the moving direction "up" is next easier, the moving directions "right" and "left" are next easier, and the moving direction "down" the hardest to be operated. These criteria are just for the vertically long cell phone 300, and for the other electronic devices of different forms, it is preferable to define other criteria corresponding to the electronic devices.

If the determination result at the aforementioned step S44 is "No", it is determined at step S45 whether the second condition described below is met. When the determination result at step S44 is "Yes", the flow goes to step S46 to execute exchange of symbol assignment.

When moving to step S46 with the determination result of "Yes" at step S44, for example, in the case of the tally table T7 shown in FIG. 27, the symbol conversion table T3 is rewritten to exchange the moving direction "down" to which the symbol "う" with the largest input count of 150 is assigned, and the moving direction "up" to which the symbol "あ" with the smallest input count of 70 is assigned, for each other (cf. FIG. 28). The tally table T7 itself is also similarly rewritten (cf. FIG. 29).

By this rewriting of the symbol conversion table T3, the symbol "あ" with the largest input count is re-assigned to the moving direction "up" easier to be operated, thus achieving promotion of efficiency of symbol input.

On the other hand, when moving to step S45 with the determination result of "No" at step S44, it is determined whether the second condition below is met. When the determination result at step S45 is "No", the sequential processing is terminated. When the determination result at step S45 is "Yes", the flow goes to step S47 to execute exchange of symbol assignment between different input keys.

The second condition is as follows: determined in the entire tally table T7 shown in FIG. 27 are an input key 10a-10l to which a symbol with a largest input count is assigned, and a moving direction of the key top 50 thereof, and an input key 10a-10l to which a symbol with a smallest input count is assigned, and a moving direction of the key top 50 thereof, and the input counts in these two "input keys and moving directions" are three or more times different; and the input key to which the symbol with the largest input count is assigned is not an "input key easier to be pushed" than the input key to which the symbol with the smallest input count is assigned, i.e., is an "input key harder to be pushed".

In order to determine whether an input key is one easier to be pushed or harder to be pushed, the following criteria are preliminarily defined for the vertically long cell phone 300. Namely, the preset criteria are as follows: among the twelve input keys 10a-10l arrayed in the matrix of four horizontal lines and three vertical columns in FIG. 2, the input keys 10a-10c on the first line are the easiest to be operated, the input keys 10d-10f on the second line next easier, the input keys 10g-10i on the third line next easier, and the input keys 10j-10l on the fourth line the hardest to be operated. These criteria are just for the vertical long cell phone 300, and for the other electronic devices of different forms, it is preferable to define other criteria corresponding to the electronic devices.

When moving to step S47 with the determination result of "Yes" at step S45, for example, in the case of the tally table T7 shown in FIG. 29, the symbol conversion table T3 is rewritten to exchange the moving direction "center" of the input key 10l to which the symbol "ん" with the largest input count of 250 is assigned, and the moving direction "down" of the input key 10a to which the symbol "あ" with the smallest input count of 70 is assigned, for each other (cf. FIG. 30). The tally table T7 itself is also similarly rewritten (cf. FIG. 31).

This rewriting of the symbol conversion table T3 is executed by a processor or the like in the converting circuit 250, and by this rewriting of the symbol conversion table T3, the symbol "ん" with the largest input count is automatically re-assigned to the moving direction "down" of the input key 10a easiest to be operated, which automatically achieves promotion of efficiency of symbol input and which automatically obtains the cell phone 300 easier in symbol input.

At step S48 subsequent to step S47, announcement is executed as to the exchange of symbol assignment executed at step S46 and at step S47. This is a process of informing the user of the exchange of symbol assignment and, specifically, is executed in such a way that the converting circuit 250 displays the input keys 10a-10l and the moving directions of the key tops 50 thereof subjected to the exchange of symbol assignment on the liquid crystal display 280.

This process of step S48 permits the user to acknowledge which symbols are newly assigned to the input keys 10*a*-10*l* and the moving directions of the key tops 50 thereof. Then the user can adapt for the exchange of symbol assignment by putting a sticker or the like indicating a new symbol exchanged corresponding to the moving direction, on the surface of the key top 50 of the input key to which the new symbol was assigned. In a case where the key top 50 is comprised of a transparent member, a sheet indicating the newly assigned symbol can be placed under the key top 50. Another potential configuration is such that a liquid crystal display means is provided in the surface of the key top 50 and the new symbol exchanged is displayed on the liquid crystal display means.

Fifth Embodiment

The input keys and input apparatus according to the fifth embodiment are configured to permit the user to enter the "hiragana writing symbols" and specific marks with high input frequencies by the input operation similar to that in the first embodiment, to permit the user to enter a specific mark with a low input frequency by a plurality of push operations on an input key as before, and to automatically change assignment of a specific mark with a high input frequency. The other portions are much the same as in the first embodiment and the fourth embodiment and in the description of the fifth embodiment, the components almost similar to those in the first embodiment and the fourth embodiment will be denoted by the same reference symbols, without detailed description thereof.

In the fifth embodiment, a specific mark with a relatively high input frequency and a specific mark with a low input frequency are assigned, for example, to the input key 10*k* out of the input keys 10*k* and 10*l* shown in FIG. 2. For this reason, the input key 10*k* is configured to permit the user to select and input a specific mark with a relatively high input frequency by operating the key top 50 in a predetermined moving direction in the same manner as in the first embodiment, and to permit the user to select and input a specific mark with a low input frequency according to the number of push operations on the key top 50 as before.

As shown in FIG. 32, the symbol of "￥" is registered corresponding to the moving direction "center" of the key top 50 in the symbol conversion table T8 corresponding to the input key 10*k*. In addition, the mark of "#" is registered corresponding to the moving direction "up" of the key top 50, the mark of "&" corresponding to the moving direction "right" of the key top 50, and the mark of "@" corresponding to the moving direction "down" of the key top 50.

Figure 33:
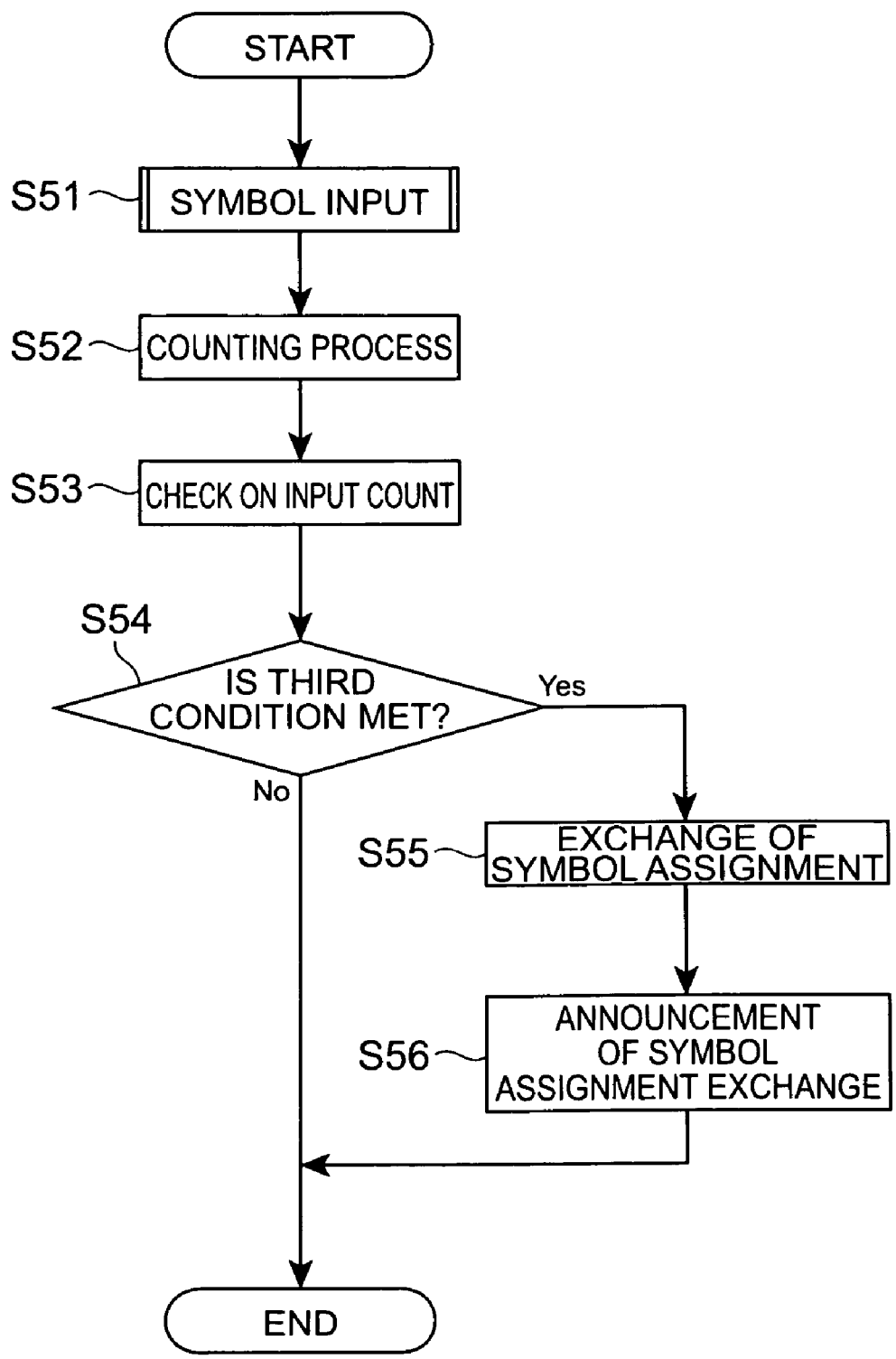
FIG. 33 is a flowchart showing the processing procedure in the fifth embodiment.

In the fifth embodiment, a process of automatically rewriting the marks registered in the symbol conversion table T8 (cf. FIG. 32) for easier input of a mark with a high input frequency out of the marks assigned to the input key 10*k* is executed along the processing procedure of the flowchart shown in FIG. 33. At first step S51, when the user of the cell phone 300 pushes the key top 50 of the input key 10*k* in an arbitrary moving direction, the converting circuit 250 selects and inputs an appropriate mark according to the moving direction.

At subsequent step S52, the converting circuit 250 tallies input frequencies of marks inputted during a predetermined period by tallying moving directions and push counts on the key top 50 of each input key 10*k* within the predetermined period, in a mark tally table T9 shown in FIG. 34. The converting circuit 250 tallies the input frequencies of the input marks in the tally table T9, for example, in the predetermined period of one hour to several days.

The mark tally table T9 shown in FIG. 34 is one constructed in a RAM (Random Access Memory) provided in the converting circuit 250, in which input counts are tallied for the respective input marks corresponding to the moving directions and the numbers of pushes on the key top 50 of the input key 10*k*. In this mark tally table T9, the mark of "#" is set corresponding to an input method with the moving direction of the key top 50 being "up", the mark of "&" corresponding to an input method with the moving direction of the key top 50 being "right", and the mark of "@" corresponding to an input method with the moving direction of the key top 50 being "down". In addition, the mark of "£" is set corresponding to an input method with the number of pushes on the key top 50 being "5", and the mark of "⁂" corresponding to an input method with the number of pushes on the key top 50 being "6".

At step S53 subsequent to step S52, the converting circuit 250 checks the input counts of the respective marks tallied in the mark tally table T9. Based on this check result, it is determined at next step S54 whether the third condition below is met. When the determination result at this step S54 is "No", the sequential processing is terminated. When the determination result at step S54 is "Yes", the flow goes to step S55 to execute exchange of symbol assignment in the input key 10*k*.

The third condition is as follows: a mark with a smallest input count (referred to as X mark) is determined out of the marks inputted according to the moving directions of the key top 50 of the input key 10*k*, a mark with a largest input count (referred to as Y mark) is determined out of the marks inputted according to the numbers of pushes on the key top 50 of the input key 10*k*, and the input count of the Y mark is two or more times greater than the input count of the X mark.

According to the mark tally table T9 shown in FIG. 34, the input count of "&" as the X mark is 12, and the input count of " " as the Y mark is 130; the input count of " " as the Y mark is two or more times greater than the input count of "&" as the X mark.

Therefore, the third condition is met between the marks "&" and "£", so that the determination result at step S54 is "Yes".

When moving to step S55, the mark tally table T9 is rewritten to exchange the input method for "&" as the X mark and the input method for "£" as the Y mark for each other (cf. FIG. 35). The symbol conversion table T8 is also rewritten to replace the mark "&" having been registered corresponding to the moving direction "right" of the key top 50, with the mark "£" (cf. FIG. 36).

As a result, the input method for the mark "&" is changed to the input method with the number of pushes on the key top 50 being "5", and the input method for the mark "£" is changed to the input method with the moving direction of the key top 50 being "right". When the key top 50 of the input key 10*k* is then moved to the "right", the mark " " is selectively inputted instead of the mark "&". When the key top 50 of the input key 10*k* is pushed "five" times, the mark "&" is selectively inputted instead of the mark "£".

Such rewriting processes of the symbol conversion table T8 and mark tally table T9 are executed by a processor or the like in the converting circuit 250, and by this rewriting of the mark tally table T9, the input method, for example, for the mark "£" being a specific mark with a high input frequency is changed, for example, to the input method with the moving direction of the key top 50 of the input key 10k being "right", which automatically achieves promotion of efficiency of mark input and which automatically obtains the cell phone 300 easier in mark input.

At step S56 subsequent to step S55, announcement is executed as to the exchange of symbol assignment executed at step S55. This is a process of informing the user of the exchange of symbol assignment and, specifically, it is executed in such a way that the converting circuit 250 displays the "moving direction" and the "number of pushes" on the key top 50 of the input key 10k subjected to the exchange of symbol assignment, on the liquid crystal display 280.

This process of step S56 permits the user to acknowledge which marks are newly assigned to the "moving direction" and the "number of pushes" on the key top 50 of the input key 10k. Then the user can adapt for the exchange of symbol assignment by putting a sticker or the like indicating the new mark exchanged corresponding to the "moving direction", on the surface of key top 50 of the input key to which the new mark is assigned. Where the key top 50 is comprised of a transparent member, a sheet indicating the newly assigned mark can also be put under the key top 50. It is also possible to adopt a configuration wherein a liquid crystal display means is provided in the surface of the key top 50 and the new mark exchanged is displayed on this liquid crystal display means.

It is noted that the assignment of the specific marks such as "#", "&","@", "£", and "Å" described in the fifth embodiment is just an example and can be modified. For example, the assignment may be such that the specific marks with relatively high input frequencies "#", "&", and "@" are assigned to the input key 10k and the specific marks with low input frequencies "£" and "Å" are assigned to the input key 10l. In this case, it is preferable to configure only the input key 10l so that the user can select an input symbol according to the number of push operations on the key top 50 as before.

Sixth Embodiment

The input keys and input apparatus according to the sixth embodiment are characterized in that the process of step S5 in the flowchart shown in FIG. 16 described in the first embodiment is modified and in that the converting circuit 70 is provided with a buffer for storing one hundred up-to-date "moving direction data" as data of moving directions of the key top 50, and the other portions are much the same as in the first embodiment. In the description of the sixth embodiment, therefore, the components almost similar to those in the first embodiment will be denoted by the same reference symbols as in the first embodiment, without detailed description thereof.

In the sixth embodiment, the converting circuit 70 shown in FIG. 9 is provided with a buffer B in a configuration shown in FIG. 37. This buffer B stores data of moving directions of each key top 50 of the input keys 10a-10l subjected to the input operation by the user, and has one hundred storage boxes to store hundred up-to-date "moving direction data". These hundred storage boxes are numbered from 1 to 100.

The buffer B constitutes a so-called ring buffer. This buffer B is provided with a pointer as a means for sequentially storing "moving direction data" in the hundred storage boxes numbered from 1 to 100. "100" is stored as an initial value in this pointer, and a maximum is set to "100". Stored in this pointer is a number of a storage box in the buffer B into which "moving direction data" was stored in a previous operation.

With reference to this pointer, the processor in the converting circuit 70 can successively store "moving direction data" in a next box to the storage box of buffer B in which the previous "moving direction data" was stored.

In the sixth embodiment, the text selecting means 40 also selectively inputs one of the symbols of "あ" to "ん" assigned to the input keys 10a-10l, along the processing procedure of the flowchart shown in FIG. 16, in the same manner as in the first embodiment. The sixth embodiment is different in the processes of step S5 and step S7 in the flowchart shown in FIG. 16, from the first embodiment.

Figure 38:
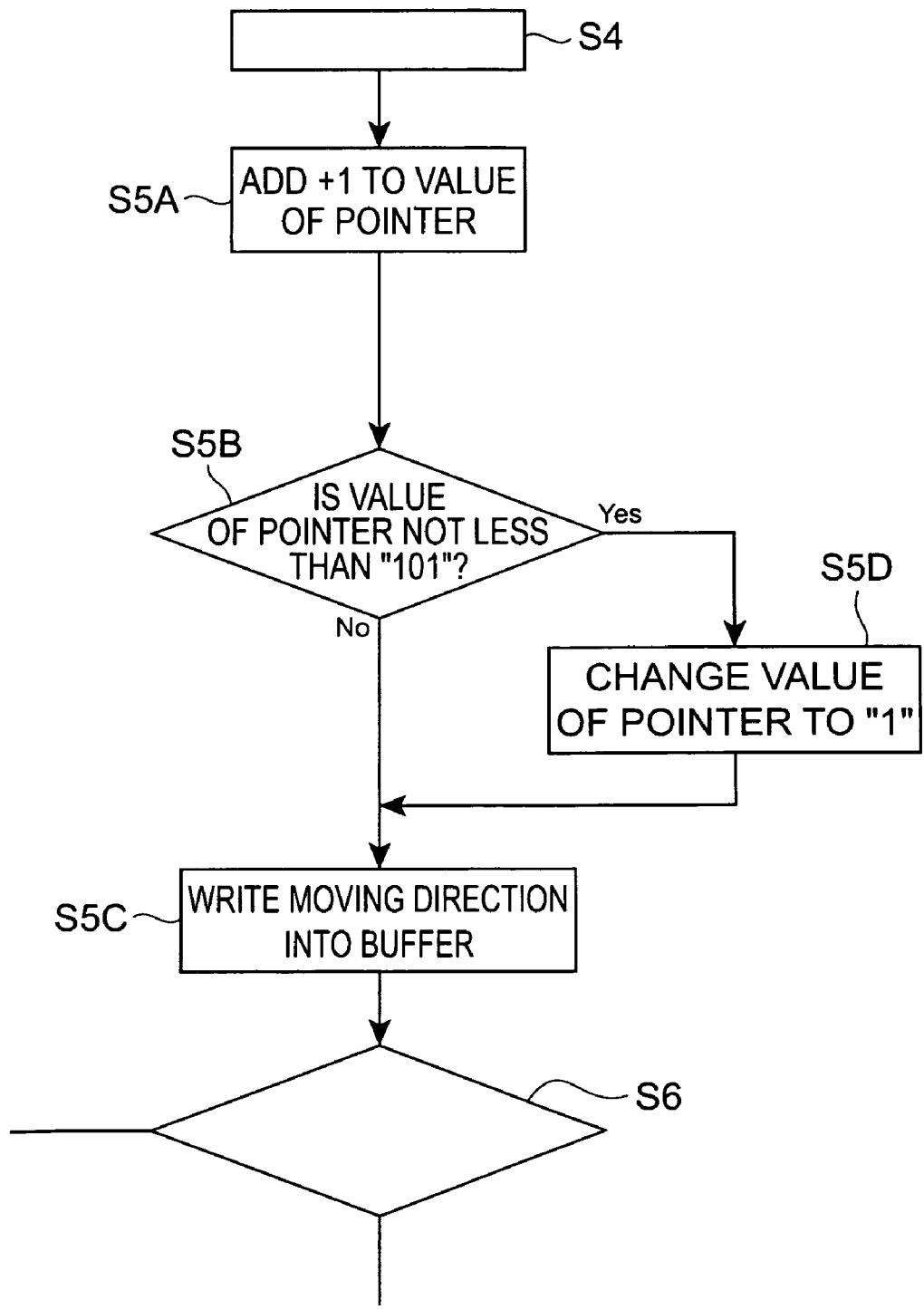
FIG. 38 is a flowchart showing a part of the processing procedure in the sixth embodiment.

In the sixth embodiment the processing along the flowchart shown in FIG. 38 is executed instead of the process of step S5 in the flowchart shown in FIG. 16. First, step S5A subsequent to step S4 in the flowchart shown in FIG. 16 is a step wherein the converting circuit 70 adds an increment of +1 to the value of the pointer. For example, where at step S4 the converting circuit 70 first detects "center" as a moving direction of the key top 50, the converting circuit 70 adds +1 to the initial value "100" of the pointer to obtain the value "101" of the pointer. Through this process of step S5A, the processor in the converting circuit 70 is able to successively store the "moving direction data" in the next box to the storage box of the buffer B in which the previous "moving direction data" was stored.

At step S5B subsequent to step S5A, the converting circuit 70 determines whether the value of the pointer is not less than "101". When the determination result is YES with the value of the pointer being not less than "101", the flow goes to the process of step S5D to change the value of the pointer to "1", and thereafter the flow goes to step S5C. On the other hand, when the determination result is NO with the value of the pointer being less than "101", the flow directly goes to the process of step S5C.

At step S5C, the moving direction of the key top 50 specified at step S4 is written into the storage box of the buffer B corresponding to the value of the pointer after the addition process at step S5A. For example, in a case where the moving direction of the key top 50 specified is "center" and where the value of the pointer after the addition process of +1 is "2", "center" is written as a moving direction into the second storage box of the buffer B.

This sequential processing is repeated until the determination result at step S6 in FIG. 16 becomes YES. Through this sequential processing one hundred up-to-date "moving direction data" can be stored as data of moving directions of the key top 50. At step S7 shown in FIG. 16, the converting circuit 70 then tallies the numbers of "moving directions" of the key top 50 stored in the buffer B, and the tally result is stored as the number of detection in the tally table T2 shown in FIG. 14.

In the sixth embodiment as described above, the moving directions of the key top 50 are determined based on only the "moving direction data" obtained from the hundred up-to-date detection results, so that the converting circuit 70 can more accurately select a symbol or mark entered by the user.

Seventh Embodiment

Figure 39:
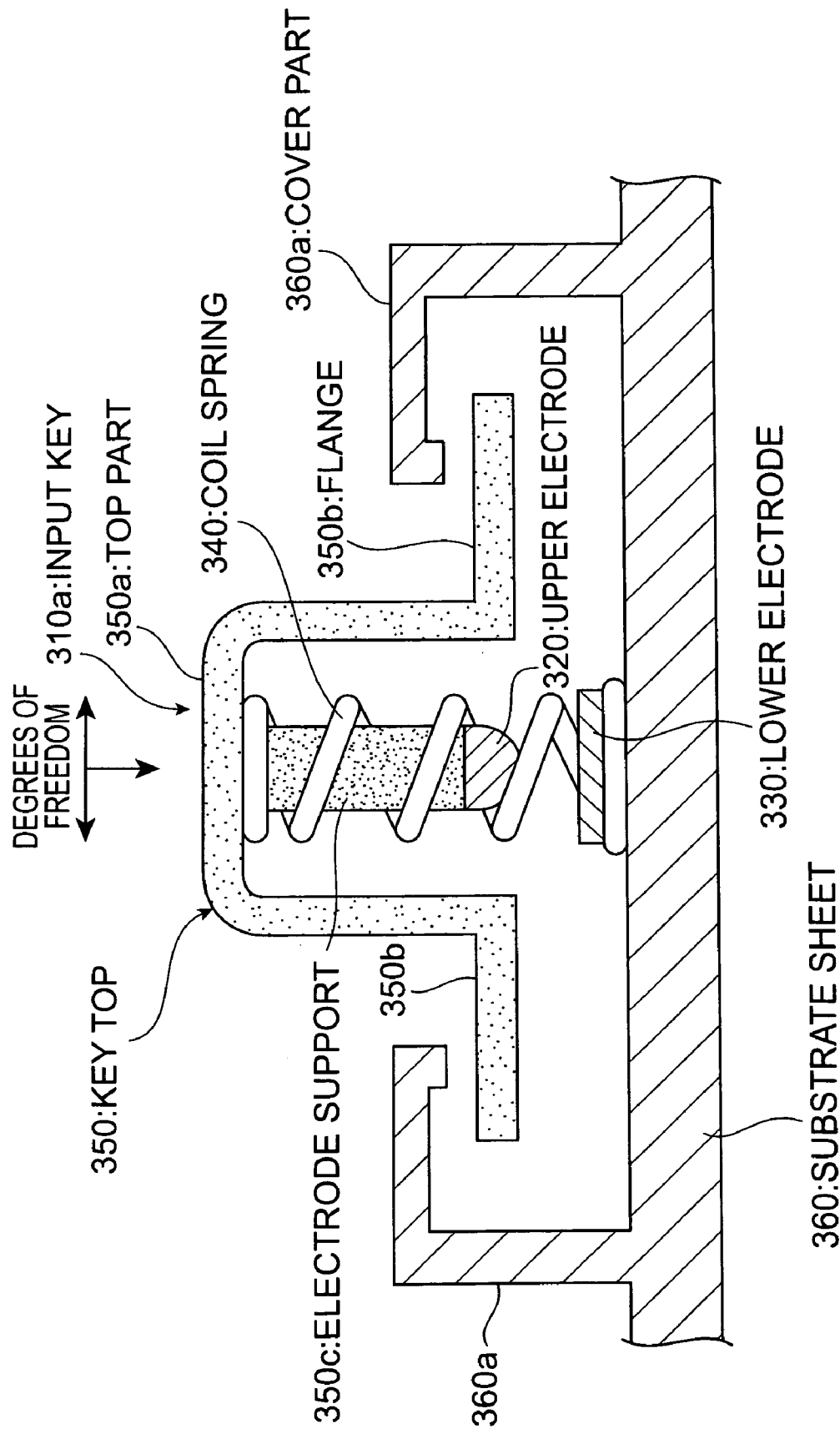
FIG. 39 is a sectional view of an input key in the seventh embodiment.

The input keys and input apparatus according to the seventh embodiment are those obtained by changing the structure of the input keys 10a-10l (cf. FIG. 3) described in the first embodiment, to the structure shown in FIG. 39, and the other portions are much the same as in the first embodiment.

In the seventh embodiment, an input key corresponding to the input key 10a shown in FIG. 3 has the sectional structure as shown in FIG. 39. This input key 310a is comprised of a key top 350 made of a material with rigidity, e.g., a rigid plastic material or the like and in a hatlike sectional shape, a substrate sheet 360 with a cover portion 360a projecting upward so as to surround a flange 350b of the key top 350, and a coil spring 340 resiliently supporting the key top 350 on the substrate sheet 360.

An electrode support 350c projecting toward the substrate sheet 360 is integrally formed in the central region on the back side of top part 350a of the key top 350, and an upper electrode 320 as a first contact is fixed to the lower end of the electrode support 350c. On the other hand, a lower electrode 330 as a second contact is fixed opposite the upper electrode 320 on the upper surface of the substrate sheet 360.

Here the coil spring 340 is arranged to surround the electrode support 350c, the upper electrode 320, and the lower electrode 330. One end of the coil spring 340 is in contact with the back surface of the top part 350a of the key top 350, and the other end thereof is in contact with the upper surface of the substrate sheet 360.

Figure 40:
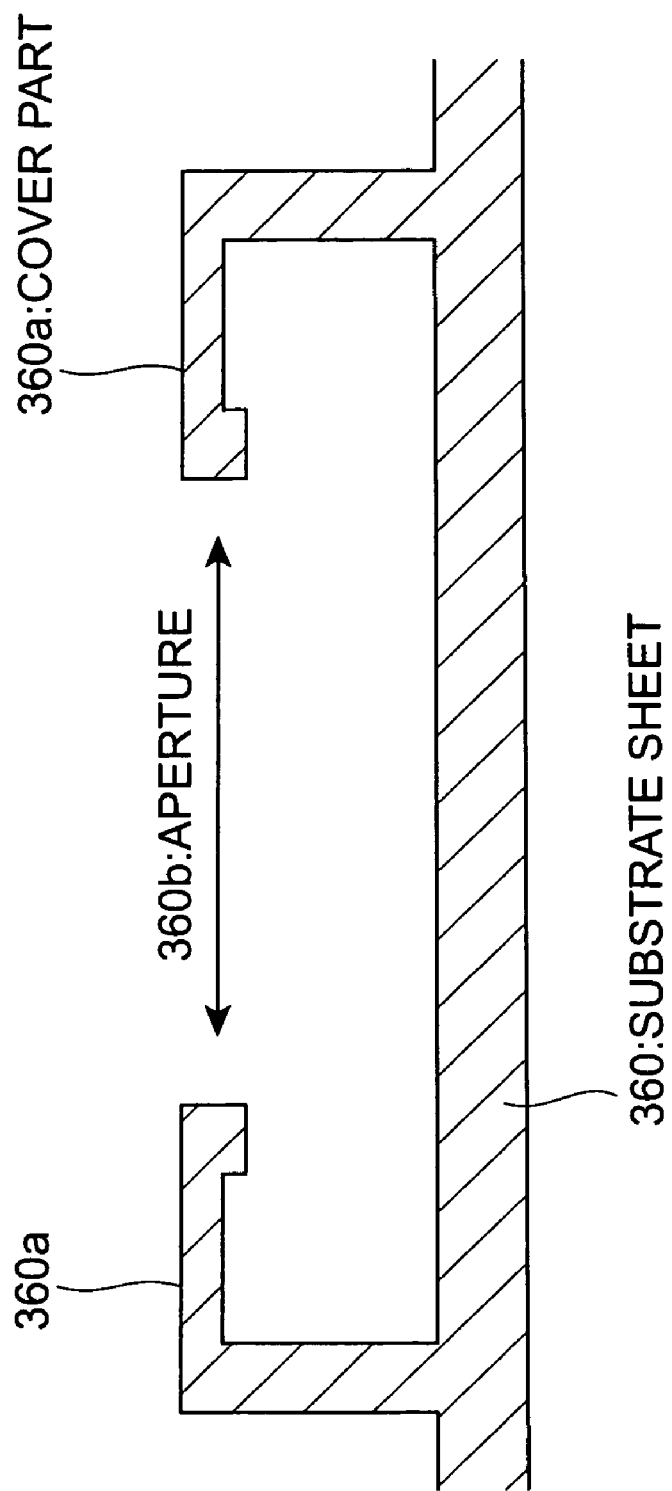
FIG. 40 is a sectional view of a cover part in the input key of the seventh embodiment shown in FIG. 39.

The cover part 360a of the substrate sheet 360 is provided with an aperture 360b of such an opening size that the flange 350b of the key top 350 can be mounted into the interior space by obliquely passing the flange through the aperture, as shown in FIG. 40, and a clearance is created so as to make the key top 350 movable in the radial directions including the crosswise directions of front, back, left, and right directions between the flange 350b of the key top 350 and the main body part except for the flange 350b (cf. FIG. 39).

Since the flange 350b of the key top 350 is arranged to engage with the cover part 360a of the substrate sheet 360, the key top 350 resiliently supported through the coil spring 340 on the substrate sheet 360 in the state as described above is prevented from slipping off upward, and can be pushed against resilience of the coil spring 340. Since the predetermined clearance is provided relative to the cover part 360a, the key top 350 is movable in the radial directions including the crosswise directions of front, back, left, and right directions.

Figure 41:
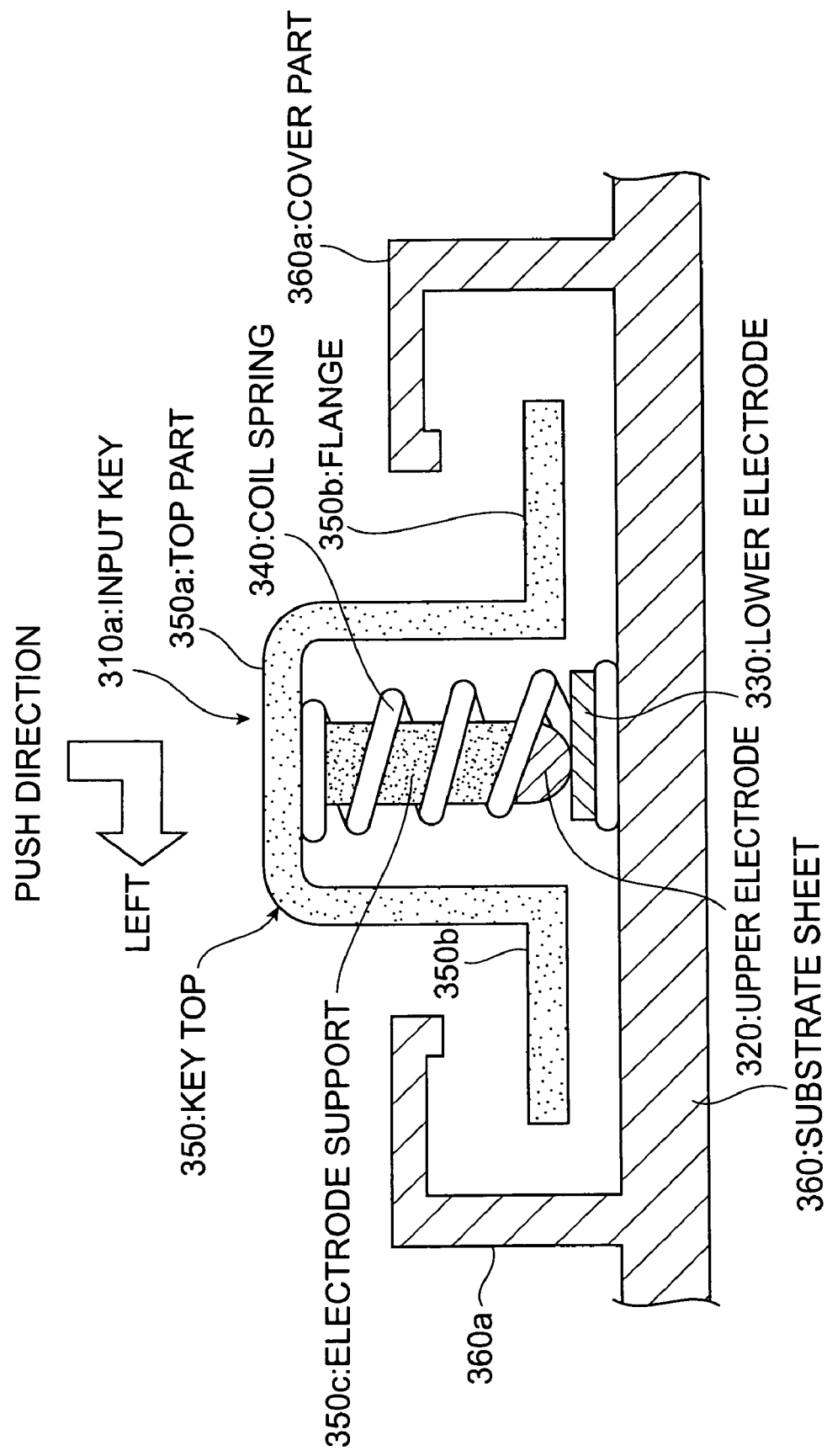
FIG. 41 is a sectional view showing the action of the input key in the seventh embodiment.

In the input key 310a of the seventh embodiment constructed in this way, as shown in FIG. 41, when the top part 350a of the key top 350 is pushed toward the substrate sheet 360, the coil spring 340 is compressed so that the upper electrode 320 comes to contact the lower electrode 330. If on that occasion the top part 350a of the key top 350 is pushed, for example, to the left in FIG. 41, the coil spring 340 tilts to the left so that the upper electrode 320 moves to the left relative to the lower electrode 330. Namely, the input key 310a of the seventh embodiment is arranged to be compositely movable in the normal push direction P perpendicular to the plane of the keyboard input apparatus 200 and in the radial directions (at least in the crosswise directions) intersecting with the push direction P, as the input key 10a of the first embodiment was.

Here the input key 310a of the seventh embodiment has high durability to hold up in long-term use because the key top 350 is made of a material with rigidity such as a rigid plastic material and the key top 350 is resiliently supported by the coil spring 340 unlikely to undergo permanent deformation.

Eighth Embodiment

Figure 42:
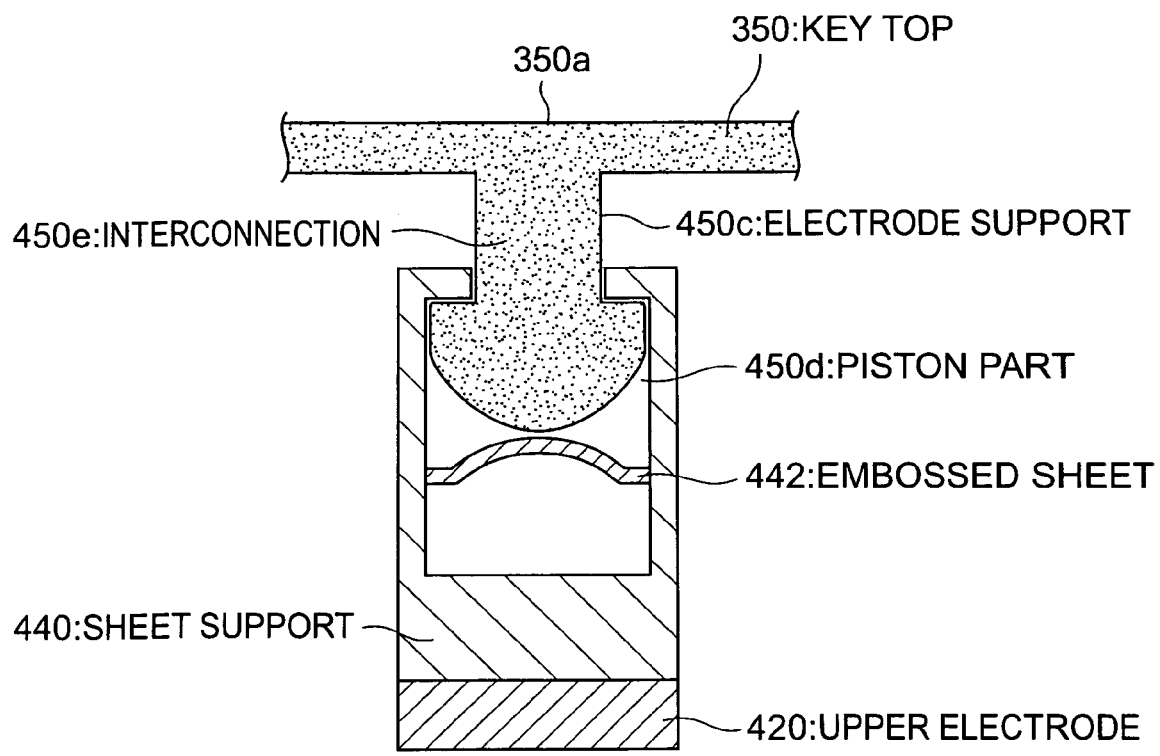
FIG. 42 is a sectional view showing the main structure of an input key in the eighth embodiment.
Figure 43:
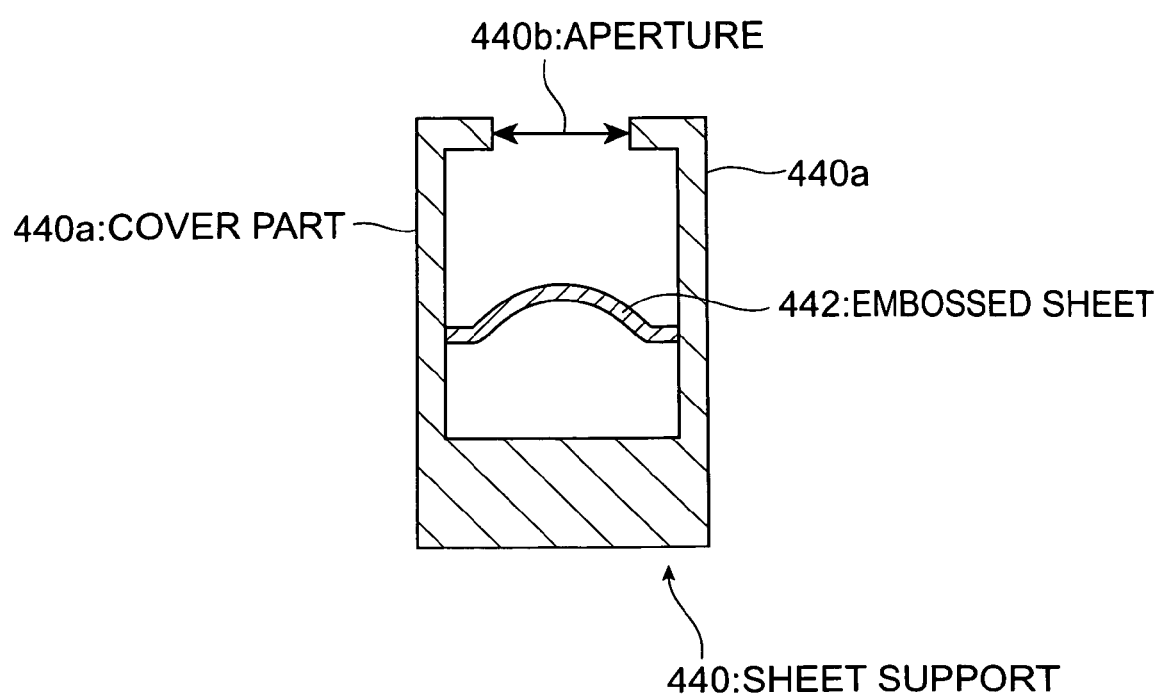
FIG. 43 is a sectional view of a sheet support member and an embossed sheet in the main structure of the input key of the eighth embodiment shown in FIG. 42.

The input keys and input apparatus according to the eighth embodiment are those obtained by changing the structure of the electrode support 350c of the input key 310a (cf. FIG. 39) described in the seventh embodiment, to the structure shown in FIG. 42, and the other portions are much the same as in the seventh embodiment as shown in FIG. 43. In the description of the eighth embodiment, therefore, the components similar to those in the seventh embodiment will be denoted by the same reference symbols, without detailed description thereof.

In the eight embodiment, as shown in FIG. 42, a short electrode support 450c projecting toward the substrate sheet 360 is integrally formed in the central part on the back side of the top part 350a of the key top 350. This electrode support 450c is constructed in structure in which a piston part 450d of a larger diameter is formed at a distal end of an interconnection 450e of a smaller diameter, and this piston part 450d has a lower end projecting in semispherical shape. This piston part 450d is interlocked so as to be slidably fit in a sheet support member 440 of cylinder shape, and an upper electrode 420 as a first contact is fixed to the lower end of this sheet support member 440.

The sheet support member 440 has a cover portion 440a slidably covering the piston part 450d, as shown in FIG. 43, and an aperture 440b, through which the interconnection 450e of the electrode support 450c is passed, is formed at the end of the cover portion 440a. Inside this cover portion 440a, an embossed sheet 442 of disk shape is mounted opposite the piston part 450d of the electrode support 450c.

The embossed sheet 442 in a steady state has a central part of a sectional shape arcuately bulging toward the piston part 450d. This embossed sheet 442 is made of an elastic synthetic resin and, when the piston part 450 pushes the arcuately bulging central part, the central part buckles in the push direction to bulge in the arcuate shape on the other side, and on that occasion a click feel is given as a repulsion to the piston part 450d. When this embossed sheet 442 is released from the push force of the piston part 450d, the central part returns into the steady state in which the central part arcuately bulges toward the piston part 450d.

Figure 44:
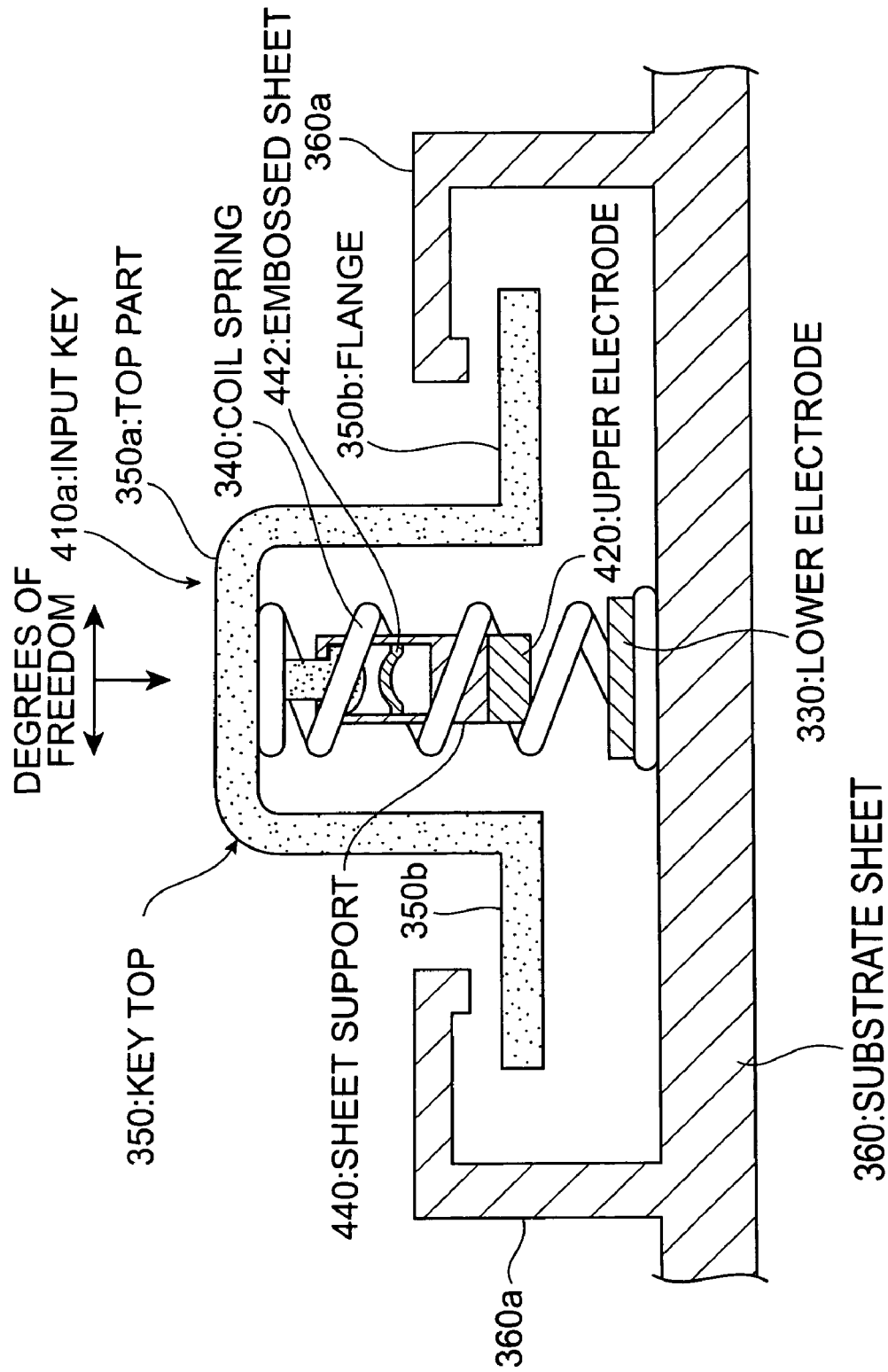
FIG. 44 is a sectional view of the input key in the eighth embodiment.

In the input key 410a of the eighth embodiment constructed in this configuration, when the key top 350 shown in FIG. 44 is pushed toward the substrate sheet 360, the coil spring 340 is compressed so that the sheet support member 440, together with the electrode support portion 450c, moves toward the substrate sheet 360, whereupon the upper electrode 420 fixed to the lower end of the sheet support member 440 first comes to contact the lower electrode 330.

Then the semispherical projecting lower end of the piston part 450d of the electrode support 450c comes into contact with the central portion of the embossed sheet 442 in the sheet support member 440 (cf.

Figure 45:
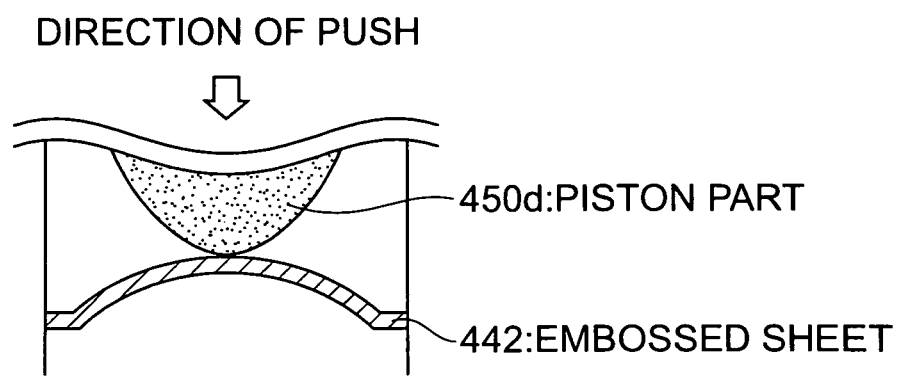
FIG. 45 is a fragmentary sectional view showing the first-stage action of the main structure of the input key in the eighth embodiment shown in FIG. 42.
Figure 46:
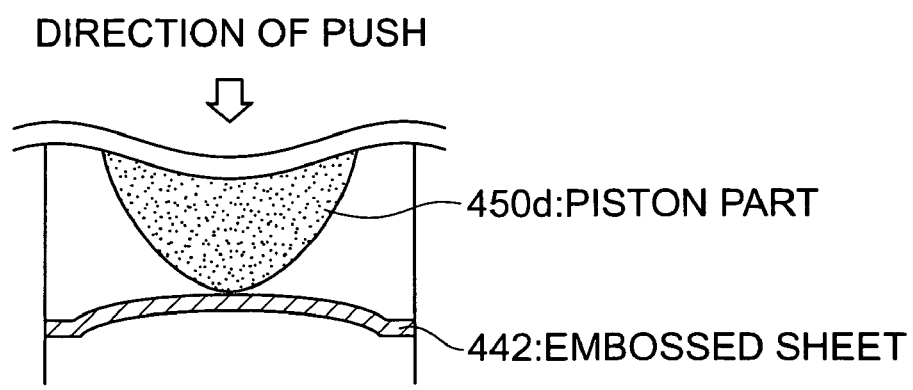
FIG. 46 is a fragmentary sectional view showing the second-stage action of the main structure of the input key in the eighth embodiment shown in FIG. 42.
Figure 47:
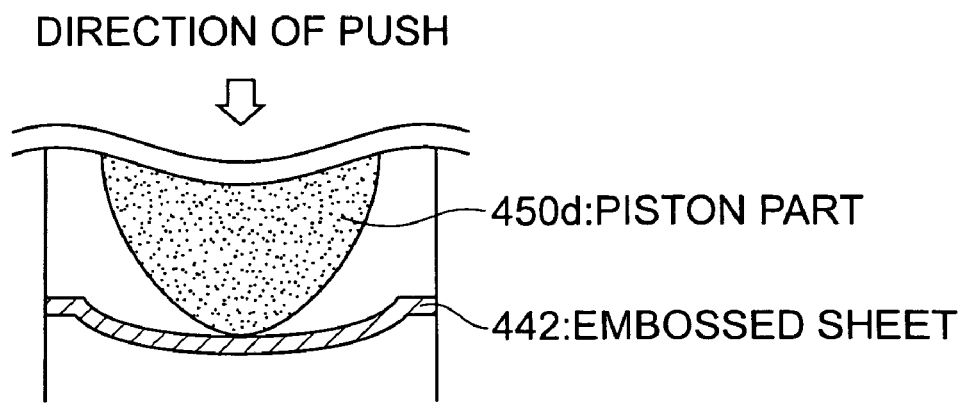
FIG. 47 is a fragmentary sectional view showing the third-stage action of the main structure of the input key in the eighth embodiment shown in FIG. 42.

FIG. 45), and pushes the central part of this embossed sheet 442 (cf. FIG. 46). As a result, the arcuately bulging central portion of the embossed sheet 442 buckles in the push direction to bulge in the arcuate shape on the other side (cf. FIG. 47) and on that occasion a click feel is given as a repulsion to the piston part 450d.

In the input key 410a of the eighth embodiment, as described above, the upper electrode 420 comes to contact the lower electrode 330 with a push operation on the key top 350 and thereafter the embossed sheet 442 buckles to the other side to give a click feel to the piston part 450d; therefore, it is confirmed by the click feel that the upper electrode 420 is surely in contact with the lower electrode 330 while the key top 350 is pushed to a sufficient depth, which permits the user to perform symbol input with a sense of security.

Ninth Embodiment

Figure 48:
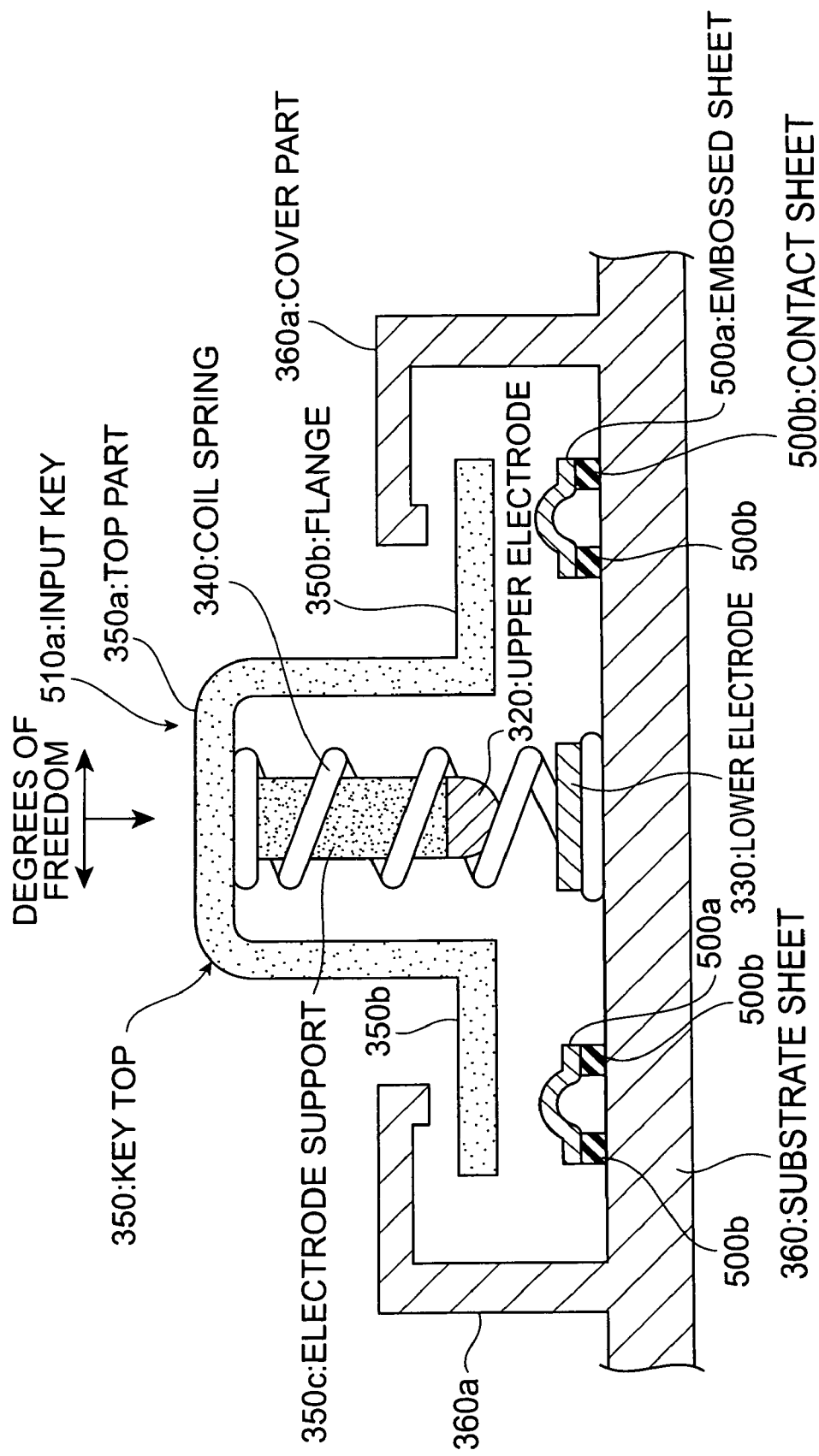
FIG. 48 is a sectional view of an input key in the ninth embodiment.

The input keys and input apparatus according to the ninth embodiment are those obtained by attaching embossed sheets 500*a* and contact sheets 500*b* shown in FIG. 48, onto the substrate sheet 360 of the input key 310*a* in the seventh embodiment, and the other portions are much the same as in the seventh embodiment shown in FIG. 39. In the description of the ninth embodiment, therefore, the components similar to those in the seventh embodiment will be denoted by the same reference symbols, without detailed description thereof.

In the ninth embodiment, as shown in FIG. 48, each embossed sheet 500*a* is attached through a contact sheet 500*b* to a portion facing the flange 350*b* of the key top 350, on the substrate sheet 360.

The embossed sheets 500*a* are made of an elastic synthetic resin and in disk shape, and the central part thereof in a steady state has an arcuately bulging sectional shape. When the embossed sheets 500*a* are pushed in the arcuately bulging central part by the flange 350*b* of the key top 350, the central part buckles in the push direction to bulge in the arcuate shape on the other side and on that occasion a click feel is given as a repulsion to the flange part 350*b* of the key top 350. When the embossed sheets 500*a* are released from the push force of the flange 350*b*, the central part returns into the steady state arcuately bulging upward.

The contact sheets 500*b* are members supporting the embossed sheets 500*a* on the substrate sheet 360 and are formed in a thick ring shape so that the central part of the embossed sheets 500*a* can buckle in the push direction to bulge in the arcuate shape on the other side. The embossed sheets 500*a* supported on the contact sheets 500*b* are provided at least at two or more positions, preferably at three or more positions, along the flange 350*b* of the key top 350.

In the input key 510*a* of the ninth embodiment constructed in this configuration, when the key top 350 shown in FIG. 48 is pushed toward the substrate sheet 360, the coil spring 340 is compressed so that the upper electrode 320, together with the electrode support 350*c*, moves toward the substrate sheet 360, whereupon the upper electrode 320 comes to contact the lower electrode 330.

Then the flange 350*b* of the key top 350 is brought into contact with the central part of the embossed sheets 500*a* to push the central part of the embossed sheets 500*a*. As a result, the arcuately bulging central part of the embossed sheets 500*a* buckles in the push direction inside the contact sheets 500*b* of ring shape to bulge in the arcuate shape on the other side and on that occasion, a click feel is given as a repulsion to the flange 350*b* of the key top 350.

In the input key 510*a* of the ninth embodiment, as described above, the upper electrode 320 comes to contact the lower electrode 330 with a push operation on the key top 350 and the flange 350*b* of the key top 350 is brought into contact with the central part of the embossed sheets 500*a* so that the embossed sheets 500*a* buckle to the other side to give a click feel to the flange 350*b* of the key top 350; therefore, it can be confirmed by the click feel that the upper electrode 320 surely comes to contact the lower electrode 330 while the key top 350 is pushed to a sufficient depth, whereby the user can perform symbol input with a sense of security.

The present invention is by no means intended to be limited to the first embodiment to the ninth embodiment described above. For example, it is also possible to adopt a method of detecting a push direction of the key top 50 with use of a digitizer (e.g., cf. Japanese Patent Application Laid-Open No. Heisei 9-319498) commonly used as a conventional computer input device, as the method of detecting the push direction of the key top of the input key.

This digitizer is generally comprised of an electronic pen having a function as a position indicator and having an indication coil inside, and a platelike tablet having a function as a position indicator and having a plurality of sensor coils inside juxtaposed in a detection direction.

In the digitizer of this type, an alternating-current signal is sequentially fed through the sensor coils of the platelike tablet to induce a first induced voltage in the indication coil of the electronic pen by electromagnetic induction. When the alternating-current signal is interrupted in this state, the first induced voltage of the indication coil again induces second induced voltages in the respective sensor coils of the platelike tablet by electromagnetic induction. The magnitude of the second induced voltage in each sensor coil induced at this time is inversely proportional to a distance between the indication coil of the electronic pen and the sensor coil of the platelike tablet. For this reason, the position of the electronic pen on the platelike tablet can be measured by measuring the second induced voltages of the respective sensor coils.

Figure 56:
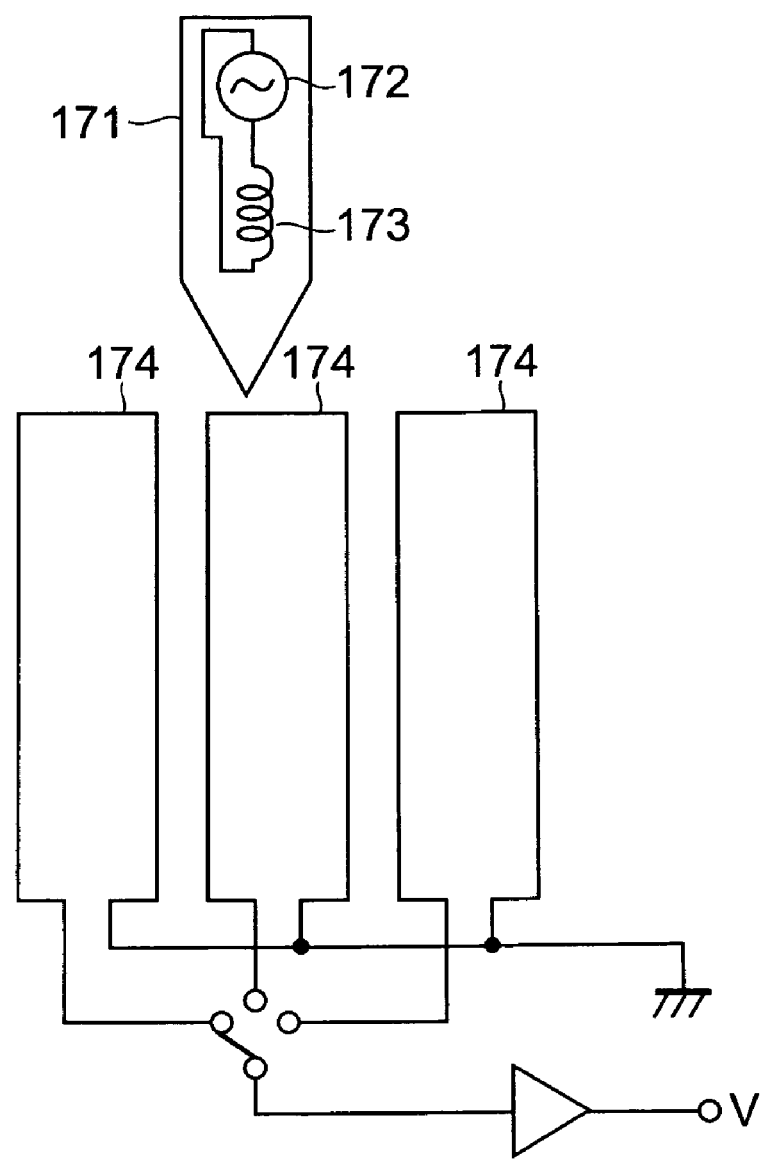
FIG. 56 is an illustration showing a configuration example of a digitizer for detecting a push direction of a key top.

The digitizer can be, for example, one as shown in FIG. 56 in a configuration wherein a pen 171 incorporates a high-frequency current source 172 and a transmission coil 173 and wherein a number of sensor coils 174 are arranged in the tablet surface. In this configuration, a high-frequency current is fed from the high-frequency current source 172 to the coil 173 built in the pen 171 to generate a magnetic field. This magnetic field is detected by the sensor coils 174, whereby electric currents are generated in the sensor coils 174. With focus on current values, a large current flows in the sensor coils 174 located at places near the pen 171 (i.e., places where the magnetic field is strong), while a small current flows in the sensor coils 174 located at places distant from the pen 171 (i.e., places where the magnetic field is weak). This allows us to determine where are the coordinates of the pen tip, based on the relation of magnitudes of current values. The detection of coordinates is carried out for each of X coordinates and Y coordinates and the X, Y coordinate values can be assumed to be coordinate values of the pen tip.

In the present invention, in order to detect a push direction of the key top by making use of the principle of the digitizer of this type, the upper electrode as a first contact of the input key is provided with the structure and function as an electronic pen, and the lower electrode as a second contact of the input key is provided with the structure and function as the platelike tablet. This configuration makes it feasible to detect the position of the upper electrode on the lower electrode and thus to specify the moving direction of the key top.

As specific examples of the detecting means according to the present invention (i.e., the means for detecting a push on the key top and for detecting a relative displacement of the key top from the predetermined reference position upon the push), in addition to the above-described means for detecting the relative displacement between two contacts, it is also possible to adopt detecting means using ultrasonic waves or light as described below (e.g., cf. Japanese Patent Applications Laid-Open No. Heisei 11-15592 and Laid-Open No. 2000-105671).

Figure 57:
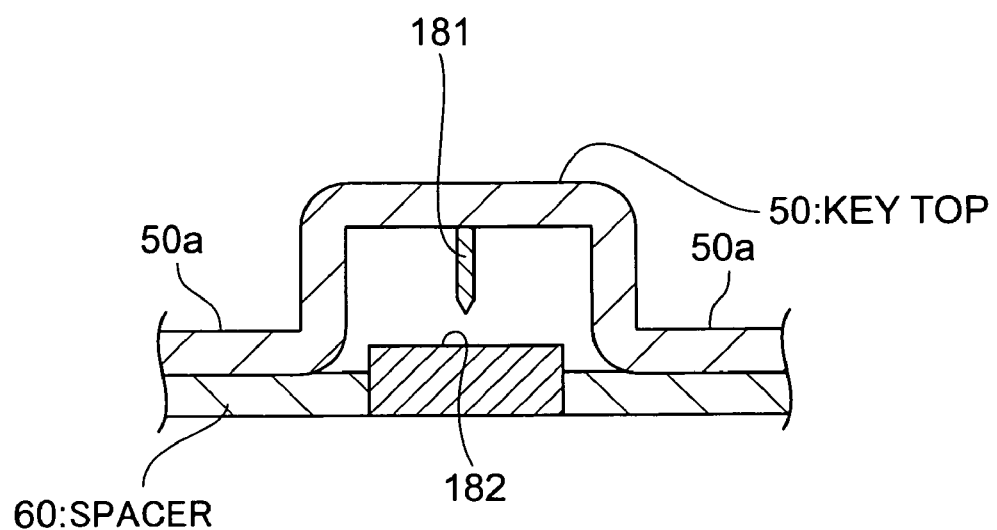
FIG. 57 is an illustration showing placement of a pen in an example in which a relative displacement of a key top is detected using ultrasonic sound or light.
Figure 58:
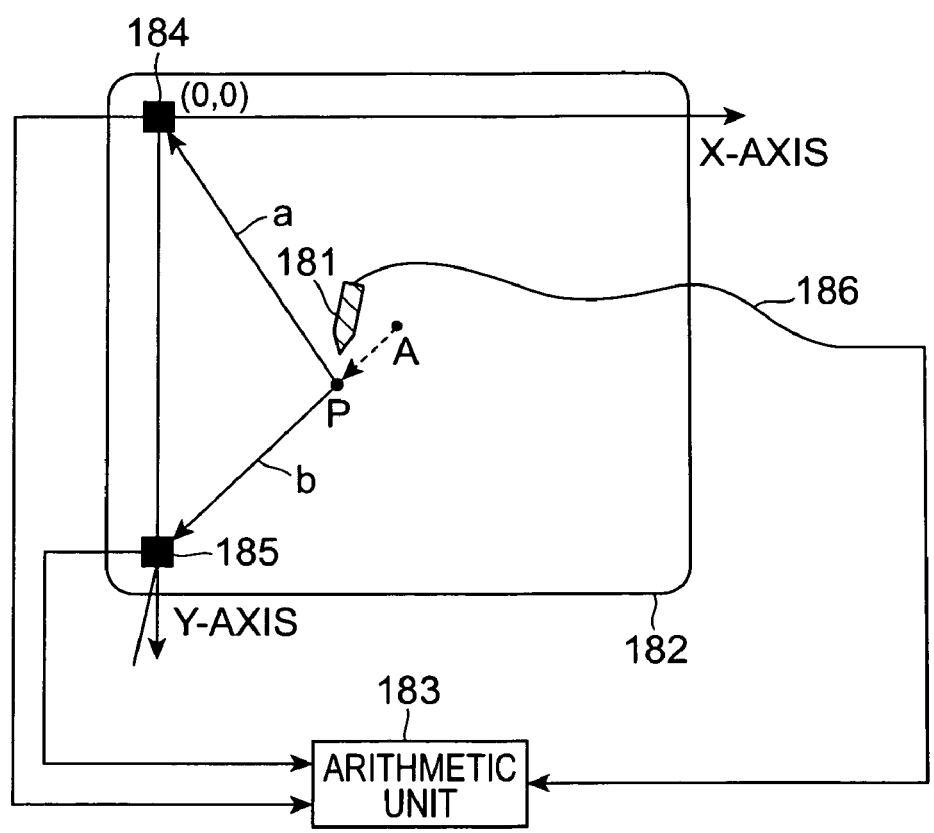
FIG. 58 is an illustration for explaining an example in which a relative displacement of a key top is detected using ultrasonic sound.

First, an example of the detecting means using ultrasonic waves will be described. For example, as shown in FIG. 57, a pen 181 having a function of producing vibration in the ultrasonic band at its tip is located at a predetermined position on the back surface of the key top 50 and directed right downward, and a surface 182 consisting of a glass sheet of almost square is placed opposite the pen 181. A predetermined origin (coordinates (0,0)), and the X-axis and Y-axis are set on the surface 182, whereby a position of an arbitrary point on the surface 182 can be represented by two-dimensional coordinates. The pen 181 is positioned so that when the key top 50 is pushed right downward, the pen 181 comes to contact a reference point A on the surface 182. The two-dimensional coordinates of this reference point A are known. For example, receivers 184, 185 to detect ultrasonic vibration are placed on the Y-axis.

When a push of the pen 181 causes the tip of the pen 181 to contact and press a point P on the surface 182, the tip of the pen 181 produces vibration in the ultrasonic band and this ultrasonic vibration is transmitted to the surface 182. The ultrasonic vibration transmitted to the surface 182 propagates to surroundings around the point P. Then the ultrasonic vibration having propagated through paths a, b arrives at the receivers 184, 185, respectively. When the receivers 184, 185 are constructed of piezoelectric elements, e.g., such as piezoelectric ceramics, the arriving ultrasonic vibration can be converted into a voltage. At the time of transmitting the ultrasonic vibration upon the contact with the surface 182, the pen 181 outputs a synchronization signal through a cable 186 to an arithmetic unit 183.

The arithmetic unit 183 performs operations according to Eqs (1) and (2) below, using the voltage signals from the receivers 184, 185 and the synchronization signal from the pen 181, to obtain the position of the point P (two-dimensional coordinates (x,y)). In Eqs (1) and (2) below, t0 represents a time of output of the synchronization signal from the pen 181, t1 a time of reception of the ultrasonic vibration at the receiver 184, and t2 a time of reception of the ultrasonic vibration at the receiver 185. Let V be the velocity of the ultrasonic waves propagating on the surface 182, (x,y) be the coordinates of the point P, (0,0) be the coordinates where the receiver 184 is installed, and (0,y) the coordinates where the receiver 185 is installed.

$$x^2+y^2=(V(t1-t0))^2 \quad (1)$$

$$x^2+(y-Y)^2=(V(t2-t0))^2 \quad (2)$$

Then the arithmetic unit 183 can determine a displacement from the reference point A as to the point P of contact and press, from the position (two-dimensional coordinates (x,y)) of the point P thus determined, and the coordinate values of the reference point A.

Figure 59:
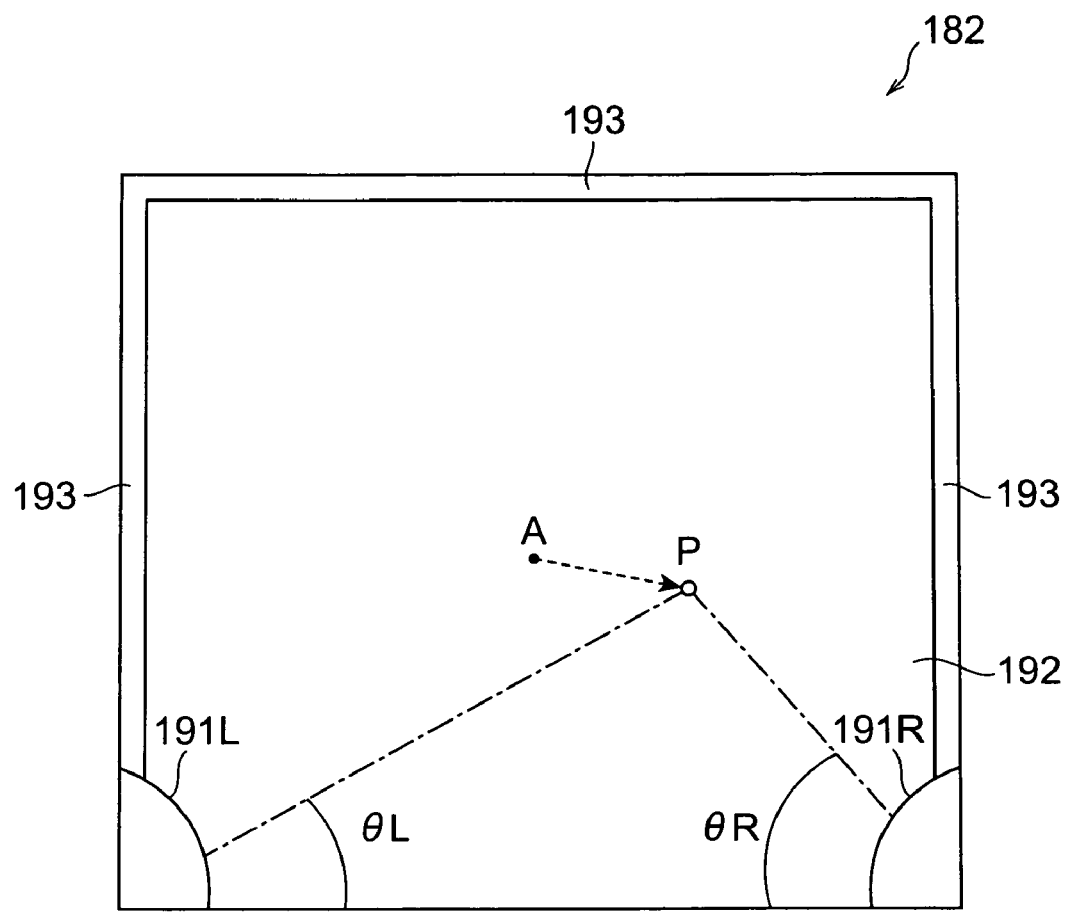
FIG. 59 is an illustration for explaining an example in which a relative displacement of a key top is detected using light.

Next, an example of the detecting means using light will be described. A pen 181 transmitting no light is located at a predetermined position on the back surface of the key top 50 as shown in FIG. 57. Light emitter-receivers 191L, 191R are placed at predetermined positions on a surface 182 facing the pen 181, as shown in FIG. 59, and a retroreflector 193 is arranged along three edges of the surface 182. The light emitter-receivers 191L, 191R emit light traveling in an input area 192 while spreading out in fan shape, and the emitted light is reflected by the retroreflector 193. This reflected light is received by the light emitter-receivers 191L, 191R, which detect an intensity distribution of received light. The pen 181 is positioned so that when the key top 50 is pushed right downward, the pen 181 comes to contact a reference point A on the surface 182. The two-dimensional coordinates of this reference point A are known.

When the key top 50 of FIG. 57 is pushed to bring the tip of the pen 181 to the proximity of the surface 182, the tip intercepts the light emitted from the emitter-receivers 191L, 191R. This intercept of light results in producing valleys (sharp drops of intensity) in the intensity distributions of the light detected by the emitter-receivers 191L and 191R, according to the position of the tip of the pen 181 (the position corresponding to the point P in FIG. 59 when projected onto the surface 182). Namely, the emitter-receiver 191L can determine an angle θL in FIG. 59 by detecting the valley in the intensity distribution of light. Similarly, the emitter-receiver 191R can determine an angle θR in FIG. 59 by detecting the valley in the intensity distribution of light. The position of the point P in FIG. 59 can be determined from these angles θL, θR. A displacement from the reference point A as to the point P can be determined from the position of the point P thus determined and the position of the reference point A.

It is needless to mention that the detecting means using the ultrasonic waves and light are not limited to those described above.

Another specific example of the detecting means according to the present invention is to perform the position detection using a scratchpad as described below. For example, a conceivable configuration example is such that a scratchpad is applied to the surface 182 facing the pen 181 in FIG. 57.

Figure 60:
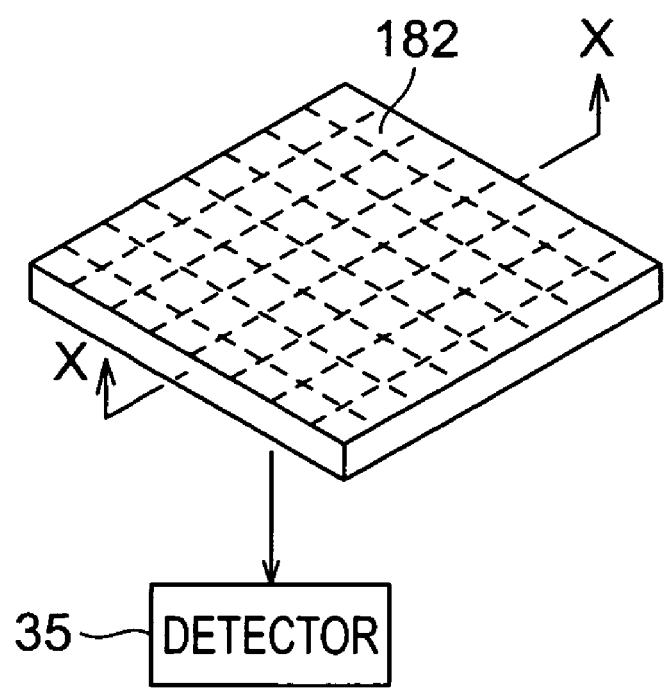
FIG. 60 is an illustration showing a configuration example of surface 182 to which a scratchpad is applied.
Figure 61:
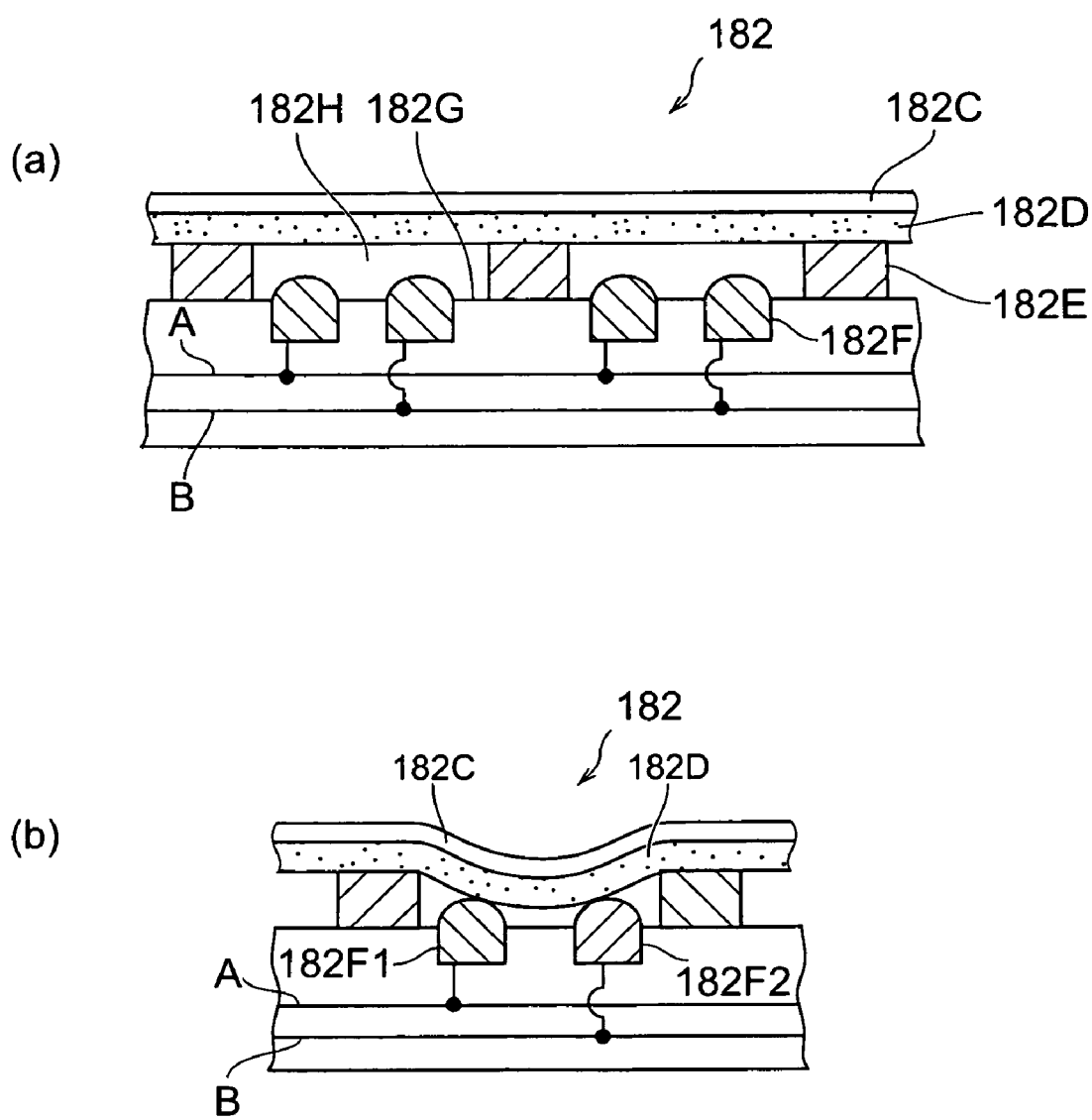
FIG. 61 shows a sectional view along line X-X in FIG. 60 in an unpushed state and a sectional view along line X-X in FIG. 60 in a pushed state.

FIG. 60 shows a configuration example of the surface 182 to which the scratchpad is applied, and FIG. 61A a sectional view along line X-X in FIG. 60. In the structure of the surface 182 shown in FIG. 60, as shown in FIG. 61A, columns 182E (indicated by dashed lines in FIG. 60) are provided along a direction along line X-X and along a direction perpendicular thereto on a substrate 182G, and a piezoelectric rubber sheet 182D of flat plate shape is provided over the entire surface 182 and on the columns 182E. The surface of the piezoelectric rubber sheet 182D is protected by an elastic protection material 182C. More specifically, a space 182H is created between the piezoelectric rubber sheet 182D and the substrate 182G. A plurality of electrodes 182F projecting on the substrate 182G are two-dimensionally arranged at predetermined positions on the substrate 182G, and a predetermined clearance is formed between the upper end of each electrode 182F and the piezoelectric rubber sheet 182D.

As also shown in FIG. 61B, an electrode 182F1 is electrically connected to an electric wiring line A, and an electrode 182F2 adjacent to the electrode 182F1 is electrically connected to an electric wiring line B. A constant potential difference is established between these electric wiring lines A, B by an unrepresented direct-current source or the like, and an electric current flows when the electric wiring lines A and B are short-circuited. The direct-current resistance with the adjacent electrodes 182F1, 182F2 being electrically connected, differs depending upon locations of the electrodes 182F1, 182F2. For this reason, the current value upon a short circuit of the electric wiring lines A and B differs according to the locations of the electrodes 182F1, 182F2. The electric wiring lines A and B are connected to a detector 35 shown in FIG. 60.

For example, where the key top is pushed immediately above the electrodes 182F1, 182F2 in the sensor part 182, the protection material 182C and piezoelectric rubber sheet 182D yield downward in the vicinity of the push position, as shown in FIG. 61B, so that the piezoelectric rubber sheet 182D comes to contact the electrode 182F1 and electrode 182F2. This causes the electrode 182F1 and electrode 182F2 to be electrically connected through the piezoelectric rubber sheet 182D, whereby the electric wiring lines A and B are short-circuited to allow an electric current to flow. When the electric current flows upon the short-circuit of the electric wiring lines A, B due to the above push, the detector 35 detects the push on the key top. The detector 35 detects the value of the current flowing upon the short circuit of the electric wiring lines A, B due to the push, to detect the position of the push and detect a displacement of the detected position from the predetermined reference position.

When the displacement is detected by use of the scratchpad in this way, there is no need for preparing a special mechanism in the projection on the key top side (e.g., the pen 181 in FIG. 57), and by simply preparing a projection for the push on the scratchpad on the opposite side, the push on the scratchpad by the projection, and the push position can be determined by the simple structure using the scratchpad, implementation of which is very easy.

The above described the example in which the push position (i.e., two-dimensional coordinates) was determined using the plurality of electrodes 182F two-dimensionally arranged at the predetermined positions on the substrate 182G, but the push position (i.e., two-dimensional coordinates) may also be determined in such a way that the mechanism of FIG. 61A is provided on each of the two axes on the substrate 182G, positions along the respective axes about the push position are determined thereby, and the push position (i.e., two-dimensional coordinates) are determined from the positions along the respective axes.

Figure 62:
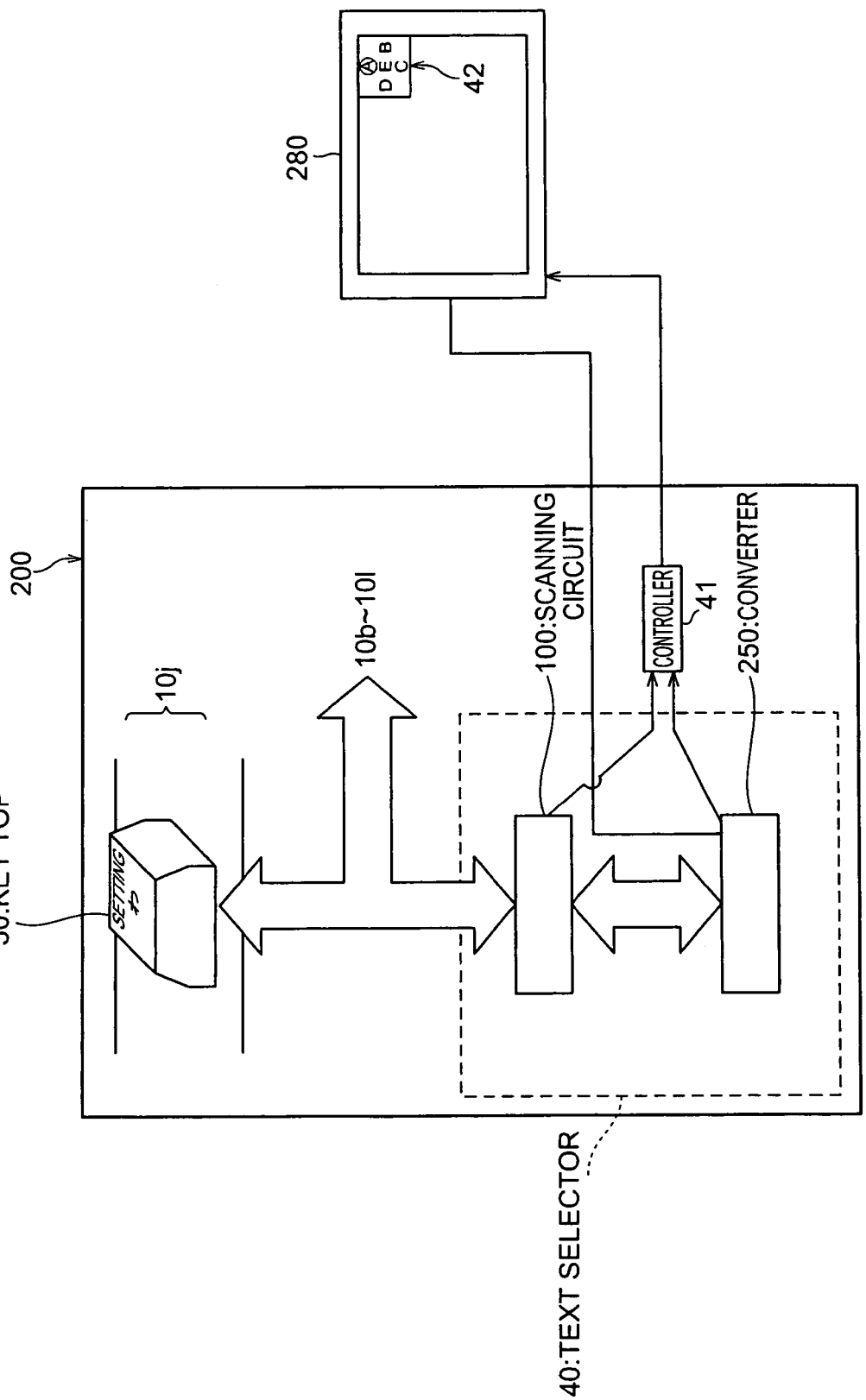
FIG. 62 is an illustration showing a configuration example provided with a feedback function of up-to-date information of a conversion table to the user.

Incidentally, each of the above embodiments is preferably configured to be able to feed the up-to-date information of the conversion tables about the input keys back to the user during the push operation on the input key by the user. A configuration with such feedback function of the up-to-date information of conversion tables to the user will be described below. FIG. 62 shows the configuration with the feedback function added to the configuration of FIG. 22. As shown in FIG. 62, the input apparatus 200 is further provided with a controller 41, and during a push operation on an input key (i.e., during a period from a start of the operation on the key top to confirmation of operation settlement by a switch) the controller 41 outputs to the display screen 280 information of the conversion table 52 about the input key at that time (information assigned to each direction) to highlight the input candidate information corresponding to the push operation at the present time on the display screen 280. For example, like an image 42 shown at the upper right corner of the display screen 280, it is feasible to feed back to the user such information that symbols A to E are assigned to the respective directions and that symbol "A" highlighted by a circle is presently selected.

The feedback is desirably carried out, for example, at a time of a change in assignment of plural input information elements to the input keys according to frequencies of use or the like, or at timing immediately after manipulation of the F key 162 in FIG. 49 (i.e., immediately after a mode changeover of symbol input) even without any change in assignment, and this achieves the three effects below. Namely, (1) in the case of a change in assignment of symbol information or the like to the input keys according to frequencies of use or the like, the user can check the up-to-date assignment information in the image 42 at the upper right corner of the display screen 280 during a push operation on the input key. (2) For example, in the case where the input mode is switched from the input mode of the Japanese hiragana writing symbols to the alphabet input mode, the user can check the up-to-date assignment information of the different input mode, which is not easily indicated by only the display on the key top, in the image 42. Furthermore, (3) the user can also check in the image 42 the information as an input candidate corresponding to a push operation at that moment (information selected at the present time). This feedback function of the up-to-date assignment information can dramatically improve easiness and certainty of the user operation.

The disclosure of Japanese Patent Application No. 2003-330514 filed Sep. 22, 2003 including specification, drawings and claims and the disclosure of Japanese Patent Application No. 2004-179534 filed Jun. 17, 2004 including specification, drawings and claims are incorporated herein by reference in its entirety.

What is claimed is:

1. An input key to which a plurality of information elements to be inputted are assigned, the input key comprising:
a key top to be pushed; and
detecting means for detecting a push on the key top, wherein the detecting means detects a relative displacement of the key top from a predetermined reference position, when detecting the push on the key top,
wherein the detecting means comprises a first contact to be pushed with the key top, and a second contact having a plurality of conducting pieces with which the first contact pushed comes into electric contact,
wherein the key top is provided so as to be compositely movable in a push direction thereof and in radial directions intersecting with the push direction, and
wherein the first contact is provided to come into contact with two or more conducting pieces placed at different positions of the second contact, in accordance with a plurality of moving directions with a push operation on the key top.

2. The input key according to claim 1, wherein the key top is comprised of a flexible material elastically deformable in the moving directions thereof and the first contact is supported on the key top.

3. The input key according to claim 1, comprising a support member supporting the first contact, and an elastic body supporting the support member, wherein a portion of the support member forms the key top.

4. An input key to which a plurality of information elements to be inputted are assigned, the input key comprising:
a key top to be pushed; and
detecting means for detecting a push on the key top, wherein the detecting means detects a relative displacement of the key top from a predetermined reference position, when detecting the push on the key top,
wherein the detecting means comprises a first contact to be pushed with the key top, and a second contact having a plurality of sensor coils to generate respective induced voltages in proximity of the first contact pushed,
wherein the key top is provided so as to be compositely movable in a push direction thereof and in radial directions intersecting with the push direction, and
wherein, in accordance with a plurality of moving directions with a push operation on the key top, the first contact comes close to the sensor coils placed at different positions of the second contact, whereby the sensor coils generate the respective induced voltages of different magnitudes.

5. The input key according to claim 4, wherein the key top is comprised of a flexible material elastically deformable in the moving directions thereof and the first contact is supported on the key top.

6. The input key according to claim 4, comprising a support member supporting the first contact, and an elastic body supporting the support member, wherein a portion of the support member forms the key top.

7. An input apparatus for inputting input information by a push operation of an input key, in which a plurality of input information elements are assigned to the same input key,
wherein the input key comprises:
a key top to be pushed; and
detecting means for detecting a push on the key top, wherein the detecting means detects a relative displacement of the key top from a predetermined reference position, when detecting the push on the key top,
wherein the detecting means comprises a first contact to be pushed with the key top of the input key, and a second contact having a plurality of conducting pieces with which the first contact pushed comes into electric contact,
the input apparatus further comprising information selecting means for selecting one of the input information elements assigned to the input key, based on conduction signals from two or more conducting pieces of the second contact in contact with the first contact,
wherein the key top is provided so as to be compositely movable in a push direction thereof and in radial directions intersecting with the push direction, and
wherein, in accordance with a plurality of moving directions with a push operation on the key top, the first contact comes into contact with two or more conducting pieces placed at different positions of the second contact, whereby one information element selected by the information selecting means is inputted.

8. The input apparatus according to claim 7, further comprising:
a conversion table to be referred to by the information selecting means, the conversion table storing the plurality of input information elements assigned to the input key, corresponding to the moving directions of the key top; and
conversion table rewriting means for arbitrarily rewriting the contents of the conversion table.

9. The input apparatus according to claim 7, further comprising:
a conversion table to be referred to by the information selecting means, the conversion table storing the plurality of input information elements assigned to the input key, corresponding to the moving directions of the key top;
input count tallying means for tallying input counts of respective information elements inputted by the input key; and
conversion table rewriting means for rewriting the contents of the conversion table in accordance with a tally result by the input count tallying means,
wherein the conversion table rewriting means is configured to rewrite the conversion table so that an information element with an input count greater than that of an information element assigned to a specific moving direction of a specific input key easy to be operated, is assigned to the specific moving direction of the specific input key.

10. The input apparatus according to claim 7, further comprising:
a conversion table to be referred to by the information selecting means, the conversion table storing the plurality of input information elements assigned to the input key, corresponding to the moving directions of the key top;
input count tallying means for tallying input counts of respective information elements inputted by the input key; and
conversion table registering means for registering the information elements in the conversion table in accordance with a tally result by the input count tallying means,
wherein the conversion table registering means is configured to re-register the information elements so that an unregistered information element with an input count greater than that of a registered information element registered in the conversion table is registered in place of the registered information.

11. An input apparatus for inputting input information by a push operation of an input key, in which a plurality of input information elements are assigned to the same input key,
wherein the input key comprises:
a key top to be pushed; and
detecting means for detecting a push on the key top, wherein the detecting means detects a relative displacement of the key top from a predetermined reference position, when detecting the push on the key top,
wherein the detecting means comprises a first contact to be pushed with the key top of the input key, and a second contact having a plurality of sensor coils to generate respective induced voltages in proximity of the first contact pushed,
the input apparatus further comprising information selecting means for selecting one of the input information elements assigned to the input key, based on magnitudes of the induced voltages generated by the sensor coils of the second contact in the proximity of the first contact,
wherein the key top is provided so as to be compositely movable in a push direction thereof and in radial directions intersecting with the push direction, and
wherein, in accordance with a plurality of moving directions with a push operation on the key top, the first contact comes close to the sensor coils placed at different positions of the second contact, whereby one information element selected by the information selecting means is inputted.

12. The input apparatus according to claim 11, further comprising:
a conversion table to be referred to by the information selecting means, the conversion table storing the plurality of input information elements assigned to the input key, corresponding to the moving directions of the key top; and
conversion table rewriting means for arbitrarily rewriting the contents of the conversion table.

13. The input apparatus according to claim 11, further comprising:
a conversion table to be referred to by the information selecting means, the conversion table storing the plurality of input information elements assigned to the input key, corresponding to the moving directions of the key top;

input count tallying means for tallying input counts of respective information elements inputted by the input key; and conversion table rewriting means for rewriting the contents of the conversion table in accordance with a tally result by the input count tallying means, wherein the conversion table rewriting means is configured to rewrite the conversion table so that an information element with an input count greater than that of an information element assigned to a specific moving direction of a specific input key easy to be operated, is assigned to the specific moving direction of the specific input key.

14. The input apparatus according to claim 11, further comprising:

a conversion table to be referred to by the information selecting means, the conversion table storing the plurality of input information elements assigned to the input key, corresponding to the moving directions of the key top;

input count tallying means for tallying input counts of respective information elements inputted by the input key; and conversion table registering means for registering the information elements in the conversion table in accordance with a tally result by the input count tallying means, wherein the conversion table registering means is configured to re-register the information elements so that an unregistered information element with an input count greater than that of a registered information element registered in the conversion table is registered in place of the registered information.

* * * * *